(12) United States Patent
Ikeda et al.

(10) Patent No.: US 8,426,034 B2
(45) Date of Patent: Apr. 23, 2013

(54) LIGHT-EMITTING ELEMENT, LIGHT-EMITTING DEVICE, AND ELECTRONIC APPLIANCE

(75) Inventors: Hisao Ikeda, Isehara (JP); Junichiro Sakata, Atsugi (JP); Satoshi Seo, Kawasaki (JP); Yuji Iwaki, Isehara (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 711 days.

(21) Appl. No.: 11/883,026

(22) PCT Filed: Feb. 1, 2006

(86) PCT No.: PCT/JP2006/302102
§ 371 (c)(1),
(2), (4) Date: Jul. 25, 2007

(87) PCT Pub. No.: WO2006/085538
PCT Pub. Date: Aug. 17, 2006

(65) Prior Publication Data
US 2008/0258610 A1  Oct. 23, 2008

(30) Foreign Application Priority Data
Feb. 8, 2005  (JP) .................................. 2005-031523

(51) Int. Cl.
*H01L 51/54* (2006.01)
(52) U.S. Cl.
USPC ............ 428/690; 428/917; 313/502; 313/504
(58) Field of Classification Search ........................ None
See application file for complete search history.

(56) References Cited

U.S. PATENT DOCUMENTS

| | | | |
|---|---|---|---|
| 5,989,737 A | 11/1999 | Xie et al. | |
| 6,423,429 B2 | 7/2002 | Kido et al. | |
| 6,486,601 B1 | 11/2002 | Sakai et al. | |
| 6,589,673 B1 | 7/2003 | Kido et al. | |
| 6,747,287 B1* | 6/2004 | Toguchi et al. | 257/40 |
| 7,462,883 B2 | 12/2008 | Kumaki et al. | |
| 7,521,855 B2* | 4/2009 | Sakata et al. | 313/504 |
| 7,569,988 B2* | 8/2009 | Ikeda et al. | 313/506 |
| 7,601,988 B2* | 10/2009 | Seo et al. | 257/88 |
| 8,080,934 B2 | 12/2011 | Kido et al. | |
| 2002/0037429 A1* | 3/2002 | Sato et al. | 428/690 |
| 2003/0189401 A1 | 10/2003 | Kido et al. | |
| 2005/0084712 A1 | 4/2005 | Kido et al. | |
| 2005/0084713 A1 | 4/2005 | Kido et al. | |
| 2005/0098207 A1* | 5/2005 | Matsumoto et al. | 136/263 |
| 2005/0106419 A1 | 5/2005 | Endoh et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0027830 A1 | 2/2006 | Kumaki et al. | |
| 2007/0040161 A1 | 2/2007 | Kumaki et al. | |
| 2007/0090376 A1 | 4/2007 | Kumaki et al. | |
| 2007/0114512 A1 | 5/2007 | Kumaki et al. | |
| 2007/0114527 A1 | 5/2007 | Kumaki et al. | |
| 2007/0131948 A1 | 6/2007 | Seo et al. | |
| 2008/0278064 A1 | 11/2008 | Kumaki et al. | |
| 2009/0079342 A1 | 3/2009 | Kumaki et al. | |
| 2012/0132895 A1 | 5/2012 | Kido et al. | |

FOREIGN PATENT DOCUMENTS

| | | |
|---|---|---|
| EP | 1351558 A | 10/2003 |
| EP | 1 524 706 | 4/2005 |
| EP | 1 531 501 | 5/2005 |
| EP | 1530245 A | 5/2005 |
| EP | 1 617 493 | 1/2006 |
| EP | 1624502 A | 2/2006 |
| EP | 1 351 558 | 7/2006 |
| EP | 1 722 602 | 11/2006 |
| EP | 1865566 A | 12/2007 |
| JP | 03-274695 | 12/1991 |
| JP | 09-063771 | 3/1997 |
| JP | 2824411 | 11/1998 |
| JP | 11-307259 | 11/1999 |
| JP | 11-307259 A | 11/1999 |
| JP | 11-307264 | 11/1999 |
| JP | 2000-315580 | 11/2000 |
| JP | 2003-272860 | 9/2003 |
| JP | 2005-026121 | 1/2005 |
| JP | 2005-032618 | 2/2005 |
| JP | 2005-123095 | 5/2005 |
| JP | 2005-166637 A | 6/2005 |
| JP | 2005-166641 | 6/2005 |
| JP | 2005-251587 A | 9/2005 |
| JP | 2005-251639 | 9/2005 |
| JP | 2006-024791 | 1/2006 |
| WO | WO 2005031798 A2 * | 4/2005 |

OTHER PUBLICATIONS

Tokito et al. J. Phys. D: Appl. Phys. 1996, 29, 2750-2753. Year of publication: 1996.*

(Continued)

*Primary Examiner* — Lynda Salvatore
*Assistant Examiner* — Andrew K Bohaty
(74) *Attorney, Agent, or Firm* — Eric J. Robinson; Robinson Intellectual Property Law Office, P.C.

(57) ABSTRACT

The cluster is formed in such a way that two molecules of arylamine compounds in each of which two arylamines each having one phenyl group and two aryl groups bonded with a nitrogen atom form a bisphenyl bond through the respective phenyl groups are arranged in parallel, thereby forming a dimolecular body and that the dimolecular body is coordinated to metal oxide. The light-emitting element has a layer including the cluster. A manufacturing method thereof includes the steps of vaporizing simultaneously metal oxide and an arylamine compound in which two arylamines each having one phenyl group and two aryl groups bonded with a nitrogen atom form a bisphenyl bond through the respective phenyl groups under vacuum and solidifying simultaneously the vaporized metal oxide and arylamine compound.

9 Claims, 82 Drawing Sheets

OTHER PUBLICATIONS

International Search Report (Application No. PCT/JP2004/014412) dated Mar. 22, 2005.
Written Opinion (Application No. PCT/JP2004/014412) dated Mar. 22, 2005.
International Search Report (Application No. PCT/JP2004/019466) dated Apr. 12, 2005.
Written Opinion (Application No. PCT/JP2004/019466) dated Apr. 12, 2005.
International Search Report (Application No. PCT/2006/302102) dated Aug. 15, 2006.
Written Opinion (Application No. PCT/2006/302102) dated Aug. 15, 2006.
European Search Report (Application No. 06713245.6; PCTEP08518) Dated Jul. 5, 2010.
Korean Office Action (Application No. 2007-7020571) Dated Sep. 17, 2012.
Chan.C et al., "Using transistor technique to study the effects of transition metal oxide dopants on organic charge transporters,", Organic Electronics, 2011, vol. 12, pp. 1454-1458.

* cited by examiner

Structure 1B

FIG. 19-(1)

```
                SUMMARY OF AM1      CALCULATION

MOPAC2002
Version 1.00
          EMPIRICAL FORMULA: C36 H28 N2

Thu Feb  3 10:29:29
2005
EF AM1
 NPB1.mop

GEOMETRY OPTIMISED USING EIGENVECTOR FOLLOWING (EF).
     SCF FIELD WAS ACHIEVED

HEAT OF FORMATION         =       199.612690 KCAL =       835.17950
KJ
          ELECTRONIC ENERGY         =    -49430.716502 EV
          CORE-CORE REPULSION       =     44026.248447 EV
          DIPOLE                    =           0.06821 DEBYE     SYMMETRY:
D2
          NO. OF FILLED LEVELS      =            91
          IONIZATION POTENTIAL      =         7.762558 EV
          HOMO LUMO ENERGIES (EV)   =        -7.763 -0.287
          MOLECULAR WEIGHT          =          488.631
          SCF CALCULATIONS          =          117
          COMPUTATION TIME =            40.97 SECONDS
```

FIG. 19-(2)

```
                 FINAL GEOMETRY OBTAINED
EF AM1
 NPB1.mop

| | | | | | | | | | | |
|---|---|---|---|---|---|---|---|---|---|---|
| H | 1.101493 | 1 | 120.035660 | 1 | -179.447397 | 1 | 1 | 2 | 3 | 0.1464 |
| H | 1.101492 | 1 | 120.082925 | 1 | 179.935894 | 1 | 3 | 2 | 1 | 0.1462 |
| H | 1.101328 | 1 | 119.258065 | 1 | -179.384945 | 1 | 4 | 3 | 2 | 0.1367 |
| H | 1.101308 | 1 | 119.267133 | 1 | -179.771658 | 1 | 6 | 1 | 2 | 0.1367 |
| H | 1.101306 | 1 | 119.626047 | 1 | -0.346160 | 1 | 8 | 7 | 5 | 0.1367 |
| H | 1.101514 | 1 | 119.451767 | 1 | 179.872336 | 1 | 9 | 8 | 7 | 0.1464 |
| H | 1.101474 | 1 | 120.083681 | 1 | -179.709358 | 1 | 11 | 10 | 9 | 0.1463 |
| H | 1.101273 | 1 | 119.626743 | 1 | -0.259617 | 1 | 12 | 7 | 5 | 0.1367 |
| H | 1.101185 | 1 | 120.095312 | 1 | -0.016757 | 1 | 19 | 16 | 13 | 0.1453 |
| H | 1.100585 | 1 | 119.310976 | 1 | -179.983141 | 1 | 20 | 19 | 16 | 0.1331 |
| H | 1.099050 | 1 | 120.260871 | 1 | 179.865408 | 1 | 21 | 20 | 19 | 0.1333 |
| H | 1.100579 | 1 | 119.941520 | 1 | -179.875771 | 1 | 22 | 21 | 20 | 0.1333 |
| H | 1.101198 | 1 | 120.095986 | 1 | 0.365719 | 1 | 23 | 16 | 13 | 0.1456 |
| H | 1.101223 | 1 | 120.120419 | 1 | -0.034037 | 1 | 24 | 15 | 13 | 0.1455 |
| H | 1.100573 | 1 | 119.303991 | 1 | -179.938774 | 1 | 25 | 24 | 15 | 0.1332 |
| H | 1.099084 | 1 | 120.261948 | 1 | 179.868047 | 1 | 26 | 25 | 24 | 0.1333 |
| H | 1.100562 | 1 | 119.947424 | 1 | -179.900332 | 1 | 27 | 26 | 25 | 0.1331 |
| H | 1.101176 | 1 | 120.087595 | 1 | 0.298783 | 1 | 28 | 15 | 13 | 0.1453 |
| H | 1.101211 | 1 | 120.072785 | 1 | 0.546514 | 1 | 29 | 18 | 14 | 0.1457 |
| H | 1.100590 | 1 | 119.332209 | 1 | -179.997749 | 1 | 30 | 29 | 18 | 0.1334 |
| H | 1.099070 | 1 | 120.241256 | 1 | 179.872235 | 1 | 31 | 30 | 29 | 0.1333 |
| H | 1.100565 | 1 | 119.962234 | 1 | -179.925893 | 1 | 32 | 31 | 30 | 0.1331 |
| H | 1.101196 | 1 | 120.110328 | 1 | -0.133027 | 1 | 33 | 18 | 14 | 0.1452 |
| H | 1.101265 | 1 | 120.139125 | 1 | -0.212196 | 1 | 34 | 17 | 14 | 0.1455 |
| H | 1.100576 | 1 | 119.313546 | 1 | -179.902143 | 1 | 35 | 34 | 17 | 0.1332 |
| H | 1.099053 | 1 | 120.268033 | 1 | 179.840864 | 1 | 36 | 35 | 34 | 0.1333 |
| H | 1.100550 | 1 | 119.938838 | 1 | -179.933710 | 1 | 37 | 36 | 35 | 0.1331 |
| H | 1.101176 | 1 | 120.046060 | 1 | 0.566423 | 1 | 38 | 17 | 14 | 0.1454 |

Structure 2B

FIG. 21-(1)

```
                SUMMARY OF AM1      CALCULATION

MOPAC2002
Version 1.00
            EMPIRICAL FORMULA: C36 H28 N2

Thu Feb  3 10:32:39
2005
EF AM1
 NPB2.mop

GEOMETRY OPTIMISED USING EIGENVECTOR FOLLOWING (EF).
        SCF FIELD WAS ACHIEVED

HEAT OF FORMATION      =      199.698549 KCAL =     835.53873
KJ
            ELECTRONIC ENERGY      =    -49455.658929 EV
            CORE-CORE REPULSION    =     44051.194597 EV
            DIPOLE              =          0.23669 DEBYE       SYMMETRY:
C1
            NO. OF FILLED LEVELS   =         91
            IONIZATION POTENTIAL   =          7.772289 EV
            HOMO LUMO ENERGIES (EV) =        -7.772 -0.286
            MOLECULAR WEIGHT       =        488.631
            SCF CALCULATIONS       =        125
            COMPUTATION TIME  =       44.09 SECONDS
```

FIG. 21-(2)

```
                FINAL GEOMETRY OBTAINED
EF AM1
NPB2.mop

| | | | | | | | | | | |
|---|---|---|---|---|---|---|---|---|---|---|
| H | 1.101466 | 1 | 120.018527 | 1 | -179.243172 | 1 | 1 | 2 | 3 | 0.1464 |
| H | 1.101456 | 1 | 120.056693 | 1 | 179.249571 | 1 | 3 | 2 | 1 | 0.1462 |
| H | 1.101283 | 1 | 119.295425 | 1 | -179.969733 | 1 | 4 | 3 | 2 | 0.1366 |
| H | 1.101258 | 1 | 119.290701 | 1 | 179.296147 | 1 | 6 | 1 | 2 | 0.1365 |
| H | 1.101258 | 1 | 119.629534 | 1 | -0.209766 | 1 | 8 | 7 | 5 | 0.1364 |
| H | 1.101531 | 1 | 119.360712 | 1 | -179.491256 | 1 | 9 | 8 | 7 | 0.1460 |
| H | 1.101466 | 1 | 120.028811 | 1 | 179.731429 | 1 | 11 | 10 | 9 | 0.1467 |
| H | 1.101242 | 1 | 119.612747 | 1 | 1.288741 | 1 | 12 | 7 | 5 | 0.1365 |
| H | 1.101233 | 1 | 120.045383 | 1 | 1.192301 | 1 | 19 | 16 | 13 | 0.1455 |
| H | 1.100584 | 1 | 119.338227 | 1 | -179.992569 | 1 | 20 | 19 | 16 | 0.1332 |
| H | 1.099047 | 1 | 120.242413 | 1 | 179.801396 | 1 | 21 | 20 | 19 | 0.1332 |
| H | 1.100516 | 1 | 119.970908 | 1 | -179.816825 | 1 | 22 | 21 | 20 | 0.1329 |
| H | 1.101267 | 1 | 120.195977 | 1 | -1.049050 | 1 | 23 | 16 | 13 | 0.1451 |
| H | 1.101170 | 1 | 120.042048 | 1 | 1.151669 | 1 | 24 | 15 | 13 | 0.1458 |
| H | 1.100576 | 1 | 119.340714 | 1 | 179.956308 | 1 | 25 | 24 | 15 | 0.1335 |
| H | 1.099146 | 1 | 120.231447 | 1 | 179.927378 | 1 | 26 | 25 | 24 | 0.1334 |
| H | 1.100523 | 1 | 119.976105 | 1 | -179.869922 | 1 | 27 | 26 | 25 | 0.1333 |
| H | 1.101238 | 1 | 120.126755 | 1 | -0.716677 | 1 | 28 | 15 | 13 | 0.1453 |
| H | 1.101170 | 1 | 120.071479 | 1 | 0.708838 | 1 | 29 | 18 | 14 | 0.1454 |
| H | 1.100567 | 1 | 119.340167 | 1 | 179.914521 | 1 | 30 | 29 | 18 | 0.1332 |
| H | 1.099053 | 1 | 120.237330 | 1 | 179.847644 | 1 | 31 | 30 | 29 | 0.1333 |
| H | 1.100574 | 1 | 119.967340 | 1 | -179.853033 | 1 | 32 | 31 | 30 | 0.1331 |
| H | 1.101189 | 1 | 120.119299 | 1 | -0.407466 | 1 | 33 | 18 | 14 | 0.1453 |
| H | 1.101236 | 1 | 120.129990 | 1 | -0.230264 | 1 | 34 | 17 | 14 | 0.1452 |
| H | 1.100575 | 1 | 119.308913 | 1 | -179.935785 | 1 | 35 | 34 | 17 | 0.1330 |
| H | 1.099030 | 1 | 120.274095 | 1 | 179.822694 | 1 | 36 | 35 | 34 | 0.1333 |
| H | 1.100572 | 1 | 119.931528 | 1 | -179.887155 | 1 | 37 | 36 | 35 | 0.1331 |
| H | 1.101165 | 1 | 120.084792 | 1 | 0.458214 | 1 | 38 | 17 | 14 | 0.1454 |

Structure 3B

SUMMARY OF AM1 CALCULATION

MOPAC2002
Version 1.00

EMPIRICAL FORMULA: C36 H28 N2

Thu Feb  3 10:34:28 2005
EF AM1
 NPB3.mop

GEOMETRY OPTIMISED USING EIGENVECTOR FOLLOWING (EF).
SCF FIELD WAS ACHIEVED

```
         HEAT OF FORMATION      =      199.660334 KCAL =     835.37884 KJ
         ELECTRONIC ENERGY      =    -49437.581533 EV
         CORE-CORE REPULSION    =     44033.115544 EV
         DIPOLE                 =          0.32149 DEBYE     SYMMETRY:  C1
         NO. OF FILLED LEVELS   =           91
         IONIZATION POTENTIAL   =       7.769662 EV
         HOMO LUMO ENERGIES (EV) =      -7.770 -0.295
         MOLECULAR WEIGHT       =      488.631
         SCF CALCULATIONS       =          130
         COMPUTATION TIME       =        49.14 SECONDS
```

FIG. 23-(2)

FINAL GEOMETRY OBTAINED
EF AM1
NPB3.mop

| | | | | | | | | | | |
|---|---|---|---|---|---|---|---|---|---|---|
| C | 0.000000 | 0 | 0.000000 | 0 | 0.000000 | 0 | 0 | 0 | 0 | -0.1632 |
| C | 1.413743 | 1 | 0.000000 | 0 | 0.000000 | 0 | 1 | 0 | 0 | 0.0828 |
| C | 1.413456 | 1 | 118.331060 | 1 | 0.000000 | 0 | 2 | 1 | 0 | -0.1651 |
| C | 1.388860 | 1 | 120.456255 | 1 | -0.491151 | 1 | 3 | 2 | 1 | -0.0998 |
| C | 1.401626 | 1 | 121.124357 | 1 | 0.375425 | 1 | 4 | 3 | 2 | -0.0557 |
| C | 1.388932 | 1 | 120.458492 | 1 | 0.222112 | 1 | 1 | 2 | 3 | -0.0997 |
| C | 1.459192 | 1 | 120.655615 | 1 | -179.843132 | 1 | 5 | 4 | 3 | -0.0570 |
| C | 1.401345 | 1 | 120.753570 | 1 | -37.441187 | 1 | 7 | 5 | 4 | -0.0985 |
| C | 1.389126 | 1 | 121.110192 | 1 | 179.295473 | 1 | 8 | 7 | 5 | -0.1687 |
| C | 1.413139 | 1 | 120.525394 | 1 | 0.457475 | 1 | 9 | 8 | 7 | 0.0809 |
| C | 1.414231 | 1 | 118.252891 | 1 | -0.149752 | 1 | 10 | 9 | 8 | -0.1614 |
| C | 1.401889 | 1 | 120.755723 | 1 | 142.271426 | 1 | 7 | 5 | 4 | -0.0997 |
| N | 1.412978 | 1 | 121.333629 | 1 | 178.539083 | 1 | 10 | 9 | 8 | -0.2032 |
| N | 1.412145 | 1 | 120.703334 | 1 | -179.635294 | 1 | 2 | 1 | 6 | -0.2096 |
| C | 1.416332 | 1 | 119.495071 | 1 | -25.156272 | 1 | 13 | 10 | 9 | 0.0718 |
| C | 1.415017 | 1 | 119.931349 | 1 | 141.491309 | 1 | 13 | 10 | 9 | 0.0754 |
| C | 1.413478 | 1 | 120.014424 | 1 | -36.079547 | 1 | 14 | 2 | 1 | 0.0795 |
| C | 1.413525 | 1 | 119.980590 | 1 | 147.066862 | 1 | 14 | 2 | 1 | 0.0795 |
| C | 1.414380 | 1 | 120.006069 | 1 | 151.622149 | 1 | 16 | 13 | 10 | -0.1574 |
| C | 1.390614 | 1 | 120.243903 | 1 | -178.518240 | 1 | 19 | 16 | 13 | -0.1106 |
| C | 1.394113 | 1 | 120.730195 | 1 | 0.062253 | 1 | 20 | 19 | 16 | -0.1526 |
| C | 1.393465 | 1 | 119.479818 | 1 | -0.221810 | 1 | 21 | 20 | 19 | -0.1093 |
| C | 1.412857 | 1 | 121.427028 | 1 | -27.198258 | 1 | 16 | 13 | 10 | -0.1665 |
| C | 1.413812 | 1 | 120.145296 | 1 | -44.786193 | 1 | 15 | 13 | 10 | -0.1544 |
| C | 1.390956 | 1 | 120.196306 | 1 | -178.988242 | 1 | 24 | 15 | 13 | -0.1124 |
| C | 1.394105 | 1 | 120.716818 | 1 | 0.165114 | 1 | 25 | 24 | 15 | -0.1502 |
| C | 1.393634 | 1 | 119.519673 | 1 | -0.023061 | 1 | 26 | 25 | 24 | -0.1112 |
| C | 1.412731 | 1 | 121.209602 | 1 | 136.336694 | 1 | 15 | 13 | 10 | -0.1623 |
| C | 1.413944 | 1 | 120.568831 | 1 | -36.572673 | 1 | 18 | 14 | 2 | -0.1620 |
| C | 1.390893 | 1 | 120.231806 | 1 | -179.823104 | 1 | 29 | 18 | 14 | -0.1096 |
| C | 1.393919 | 1 | 120.726854 | 1 | 0.321486 | 1 | 30 | 29 | 18 | -0.1532 |
| C | 1.393707 | 1 | 119.496732 | 1 | -0.147547 | 1 | 31 | 30 | 29 | -0.1094 |
| C | 1.413554 | 1 | 120.851768 | 1 | 143.776253 | 1 | 18 | 14 | 2 | -0.1637 |
| C | 1.413645 | 1 | 120.828225 | 1 | -33.144150 | 1 | 17 | 14 | 2 | -0.1640 |
| C | 1.391007 | 1 | 120.240340 | 1 | 179.711428 | 1 | 34 | 17 | 14 | -0.1092 |
| C | 1.393740 | 1 | 120.727092 | 1 | 0.311131 | 1 | 35 | 34 | 17 | -0.1532 |
| C | 1.393873 | 1 | 119.487832 | 1 | -0.191978 | 1 | 36 | 35 | 34 | -0.1098 |
| C | 1.413814 | 1 | 120.592013 | 1 | 146.675098 | 1 | 17 | 14 | 2 | -0.1618 |

FIG. 23-(3)

| | | | | | | | | | | |
|---|---|---|---|---|---|---|---|---|---|---|
| H | 1.101425 | 1 | 120.050772 | 1 | -179.454955 | 1 | 1 | 2 | 3 | 0.1465 |
| H | 1.101470 | 1 | 120.075712 | 1 | -179.957159 | 1 | 3 | 2 | 1 | 0.1463 |
| H | 1.101331 | 1 | 119.203958 | 1 | -179.346428 | 1 | 4 | 3 | 2 | 0.1365 |
| H | 1.101296 | 1 | 119.229443 | 1 | -179.629722 | 1 | 6 | 1 | 2 | 0.1368 |
| H | 1.101322 | 1 | 119.695706 | 1 | -0.838720 | 1 | 8 | 7 | 5 | 0.1364 |
| H | 1.101589 | 1 | 119.329252 | 1 | -179.919068 | 1 | 9 | 8 | 7 | 0.1460 |
| H | 1.101460 | 1 | 120.035798 | 1 | -179.889211 | 1 | 11 | 10 | 9 | 0.1467 |
| H | 1.101270 | 1 | 119.644971 | 1 | 0.052778 | 1 | 12 | 7 | 5 | 0.1366 |
| H | 1.101168 | 1 | 120.048932 | 1 | 1.711713 | 1 | 19 | 16 | 13 | 0.1455 |
| H | 1.100582 | 1 | 119.333254 | 1 | 179.821737 | 1 | 20 | 19 | 16 | 0.1332 |
| H | 1.099039 | 1 | 120.253425 | 1 | 179.821748 | 1 | 21 | 20 | 19 | 0.1333 |
| H | 1.100569 | 1 | 119.956813 | 1 | -179.747086 | 1 | 22 | 21 | 20 | 0.1331 |
| H | 1.101285 | 1 | 120.197938 | 1 | -1.482067 | 1 | 23 | 16 | 13 | 0.1454 |
| H | 1.101161 | 1 | 120.048912 | 1 | 1.315568 | 1 | 24 | 15 | 13 | 0.1461 |
| H | 1.100557 | 1 | 119.333128 | 1 | 179.973916 | 1 | 25 | 24 | 15 | 0.1337 |
| H | 1.099157 | 1 | 120.236324 | 1 | 179.982876 | 1 | 26 | 25 | 24 | 0.1335 |
| H | 1.100535 | 1 | 119.968219 | 1 | -179.912657 | 1 | 27 | 26 | 25 | 0.1333 |
| H | 1.101256 | 1 | 120.123934 | 1 | -0.873655 | 1 | 28 | 15 | 13 | 0.1451 |
| H | 1.101184 | 1 | 120.085804 | 1 | 0.455967 | 1 | 29 | 18 | 14 | 0.1456 |
| H | 1.100591 | 1 | 119.327446 | 1 | -179.957303 | 1 | 30 | 29 | 18 | 0.1332 |
| H | 1.099045 | 1 | 120.241575 | 1 | 179.829229 | 1 | 31 | 30 | 29 | 0.1332 |
| H | 1.100566 | 1 | 119.961313 | 1 | -179.926590 | 1 | 32 | 31 | 30 | 0.1330 |
| H | 1.101190 | 1 | 120.107801 | 1 | -0.127068 | 1 | 33 | 18 | 14 | 0.1452 |
| H | 1.101239 | 1 | 120.120404 | 1 | 0.020396 | 1 | 34 | 17 | 14 | 0.1455 |
| H | 1.100584 | 1 | 119.322668 | 1 | -179.925928 | 1 | 35 | 34 | 17 | 0.1332 |
| H | 1.099043 | 1 | 120.267098 | 1 | 179.823342 | 1 | 36 | 35 | 34 | 0.1333 |
| H | 1.100562 | 1 | 119.936970 | 1 | -179.888829 | 1 | 37 | 36 | 35 | 0.1330 |
| H | 1.101169 | 1 | 120.084818 | 1 | 0.294525 | 1 | 38 | 17 | 14 | 0.1454 |

Structure 4B

FIG. 25-(1)

SUMMARY OF AM1 CALCULATION

MOPAC2002
Version 1.00

EMPIRICAL FORMULA: C36 H28 N2

Thu Feb 3 10:37:14 2005
EF AM1
 NPB4.mop

GEOMETRY OPTIMISED USING EIGENVECTOR FOLLOWING (EF).
SCF FIELD WAS ACHIEVED

```
        HEAT OF FORMATION      =      199.699336 KCAL =     835.54202
KJ
        ELECTRONIC ENERGY      =    -49455.810156 EV
        CORE-CORE REPULSION    =     44051.345858 EV
        DIPOLE                 =          0.25323 DEBYE     SYMMETRY:
C1
        NO. OF FILLED LEVELS   =         91
        IONIZATION POTENTIAL   =          7.771302 EV
        HOMO LUMO ENERGIES (EV)=         -7.771 -0.293
        MOLECULAR WEIGHT       =        488.631
        SCF CALCULATIONS       =        142
        COMPUTATION TIME   =     53.61 SECONDS
```

FIG. 25-(2)

```
           FINAL GEOMETRY OBTAINED
EF AM1
 NPB4.mop

| | | | | | | | | | | |
|---|---|---|---|---|---|---|---|---|---|---|
| H | 1.101447 | 1 | 120.047849 | 1 | -179.305617 | 1 | 1  | 2  | 3  | 0.1464 |
| H | 1.101469 | 1 | 120.068368 | 1 | 179.362559  | 1 | 3  | 2  | 1  | 0.1462 |
| H | 1.101304 | 1 | 119.264362 | 1 | 179.869665  | 1 | 4  | 3  | 2  | 0.1365 |
| H | 1.101258 | 1 | 119.259494 | 1 | 179.234770  | 1 | 6  | 1  | 2  | 0.1364 |
| H | 1.101254 | 1 | 119.646087 | 1 | -0.112280   | 1 | 8  | 7  | 5  | 0.1363 |
| H | 1.101532 | 1 | 119.363853 | 1 | -179.534985 | 1 | 9  | 8  | 7  | 0.1459 |
| H | 1.101427 | 1 | 120.006491 | 1 | 179.802974  | 1 | 11 | 10 | 9  | 0.1467 |
| H | 1.101262 | 1 | 119.628571 | 1 | 1.302841    | 1 | 12 | 7  | 5  | 0.1364 |
| H | 1.101169 | 1 | 120.038851 | 1 | 1.443075    | 1 | 19 | 16 | 13 | 0.1455 |
| H | 1.100579 | 1 | 119.337682 | 1 | 179.943422  | 1 | 20 | 19 | 16 | 0.1332 |
| H | 1.099067 | 1 | 120.239444 | 1 | 179.854764  | 1 | 21 | 20 | 19 | 0.1332 |
| H | 1.100506 | 1 | 119.970035 | 1 | -179.774215 | 1 | 22 | 21 | 20 | 0.1330 |
| H | 1.101265 | 1 | 120.184773 | 1 | -1.218191   | 1 | 23 | 16 | 13 | 0.1451 |
| H | 1.101137 | 1 | 120.032276 | 1 | 1.382098    | 1 | 24 | 15 | 13 | 0.1458 |
| H | 1.100586 | 1 | 119.350435 | 1 | 179.910522  | 1 | 25 | 24 | 15 | 0.1335 |
| H | 1.099159 | 1 | 120.222857 | 1 | 179.988433  | 1 | 26 | 25 | 24 | 0.1334 |
| H | 1.100511 | 1 | 119.977834 | 1 | -179.825112 | 1 | 27 | 26 | 25 | 0.1333 |
| H | 1.101207 | 1 | 120.118779 | 1 | -0.890564   | 1 | 28 | 15 | 13 | 0.1451 |
| H | 1.101167 | 1 | 120.077264 | 1 | 0.598258    | 1 | 29 | 18 | 14 | 0.1454 |
| H | 1.100579 | 1 | 119.333695 | 1 | 179.990956  | 1 | 30 | 29 | 18 | 0.1331 |
| H | 1.099044 | 1 | 120.240045 | 1 | 179.855808  | 1 | 31 | 30 | 29 | 0.1333 |
| H | 1.100569 | 1 | 119.958777 | 1 | -179.946763 | 1 | 32 | 31 | 30 | 0.1331 |
| H | 1.101202 | 1 | 120.111970 | 1 | -0.311981   | 1 | 33 | 18 | 14 | 0.1453 |
| H | 1.101236 | 1 | 120.127512 | 1 | -0.212729   | 1 | 34 | 17 | 14 | 0.1452 |
| H | 1.100571 | 1 | 119.326118 | 1 | 179.999364  | 1 | 35 | 34 | 17 | 0.1331 |
| H | 1.099041 | 1 | 120.268701 | 1 | 179.887939  | 1 | 36 | 35 | 34 | 0.1333 |
| H | 1.100564 | 1 | 119.939373 | 1 | -179.875001 | 1 | 37 | 36 | 35 | 0.1331 |
| H | 1.101171 | 1 | 120.077963 | 1 | 0.474858    | 1 | 38 | 17 | 14 | 0.1455 |

Structure 5B

SUMMARY OF AM1    CALCULATION

MOPAC2002
Version 1.00

EMPIRICAL FORMULA: C36 H28 N2

Thu Feb  3 10:40:55 2005
EF AM1
 NPB5.mop

GEOMETRY OPTIMISED USING EIGENVECTOR FOLLOWING (EF).
SCF FIELD WAS ACHIEVED

|  | HEAT OF FORMATION | = | 203.055616 KCAL = | 849.58470 KJ |

HEAT OF FORMATION       =     203.055616 KCAL =     849.58470 KJ

ELECTRONIC ENERGY       =    -49475.728475 EV
  CORE-CORE REPULSION     =     44071.409719 EV
  GRADIENT NORM           =         16.922804
  DIPOLE                  =          2.35164 DEBYE       SYMMETRY: C1
  NO. OF FILLED LEVELS    =         91
  IONIZATION POTENTIAL    =          7.999599 EV
  HOMO LUMO ENERGIES (EV) =         -8.000 -0.222
  MOLECULAR WEIGHT        =        488.631
  SCF CALCULATIONS        =        142
  COMPUTATION TIME        =         55.19 SECONDS

FIG. 27-(2)

```
                FINAL GEOMETRY OBTAINED
EF AM1
NPB5.mop

| | | | | | | | | | | | |
|---|---|---|---|---|---|---|---|---|---|---|---|
| H | 1.101822 | 1 | 120.021942 | 1 | -178.728166 | 1 | 1 | 2 | 3 | 0.1425 |
| H | 1.101232 | 1 | 120.067771 | 1 | 179.143444 | 1 | 3 | 2 | 1 | 0.1469 |
| H | 1.101096 | 1 | 118.891436 | 1 | 178.637632 | 1 | 4 | 3 | 2 | 0.1365 |
| H | 1.100912 | 1 | 118.951866 | 1 | 178.081366 | 1 | 6 | 1 | 2 | 0.1352 |
| H | 1.101299 | 1 | 119.896521 | 1 | -1.115250 | 1 | 8 | 7 | 5 | 0.1331 |
| H | 1.101225 | 1 | 118.839884 | 1 | 178.906266 | 1 | 9 | 8 | 7 | 0.1444 |
| H | 1.101411 | 1 | 120.137325 | 1 | 178.919530 | 1 | 11 | 10 | 9 | 0.1440 |
| H | 1.101257 | 1 | 119.883135 | 1 | 3.118513 | 1 | 12 | 7 | 5 | 0.1339 |
| H | 1.101048 | 1 | 120.054694 | 1 | 0.828371 | 1 | 19 | 16 | 13 | 0.1407 |
| H | 1.100257 | 1 | 119.584786 | 1 | 179.908112 | 1 | 20 | 19 | 16 | 0.1347 |
| H | 1.099665 | 1 | 120.104865 | 1 | 179.776299 | 1 | 21 | 20 | 19 | 0.1343 |
| H | 1.100394 | 1 | 119.950329 | 1 | -179.845556 | 1 | 22 | 21 | 20 | 0.1347 |
| H | 1.101164 | 1 | 120.201438 | 1 | -0.505725 | 1 | 23 | 16 | 13 | 0.1437 |
| H | 1.101133 | 1 | 120.148463 | 1 | -0.537961 | 1 | 24 | 15 | 13 | 0.1429 |
| H | 1.100454 | 1 | 119.428135 | 1 | -179.990756 | 1 | 25 | 24 | 15 | 0.1345 |
| H | 1.099594 | 1 | 120.173793 | 1 | -179.696882 | 1 | 26 | 25 | 24 | 0.1341 |
| H | 1.100313 | 1 | 119.993296 | 1 | 179.831769 | 1 | 27 | 26 | 25 | 0.1344 |
| H | 1.101232 | 1 | 120.044745 | 1 | 0.207317 | 1 | 28 | 15 | 13 | 0.1410 |
| H | 1.101041 | 1 | 120.143227 | 1 | 3.573161 | 1 | 29 | 18 | 14 | 0.1430 |
| H | 1.100499 | 1 | 119.315435 | 1 | -179.892289 | 1 | 30 | 29 | 18 | 0.1304 |
| H | 1.098688 | 1 | 120.309470 | 1 | -179.940775 | 1 | 31 | 30 | 29 | 0.1309 |
| H | 1.100518 | 1 | 119.924713 | 1 | 179.946493 | 1 | 32 | 31 | 30 | 0.1299 |
| H | 1.101068 | 1 | 120.385743 | 1 | -3.763322 | 1 | 33 | 18 | 14 | 0.1428 |
| H | 1.101230 | 1 | 119.980579 | 1 | -0.131762 | 1 | 34 | 17 | 14 | 0.1429 |
| H | 1.100250 | 1 | 119.538337 | 1 | -179.926897 | 1 | 35 | 34 | 17 | 0.1336 |
| H | 1.099480 | 1 | 120.123262 | 1 | 179.830748 | 1 | 36 | 35 | 34 | 0.1334 |
| H | 1.100469 | 1 | 119.959052 | 1 | -179.797135 | 1 | 37 | 36 | 35 | 0.1346 |
| H | 1.101188 | 1 | 120.202730 | 1 | 0.748328 | 1 | 38 | 17 | 14 | 0.1475 |

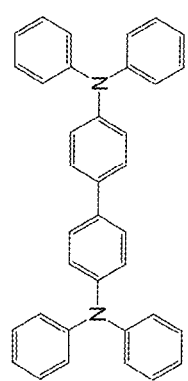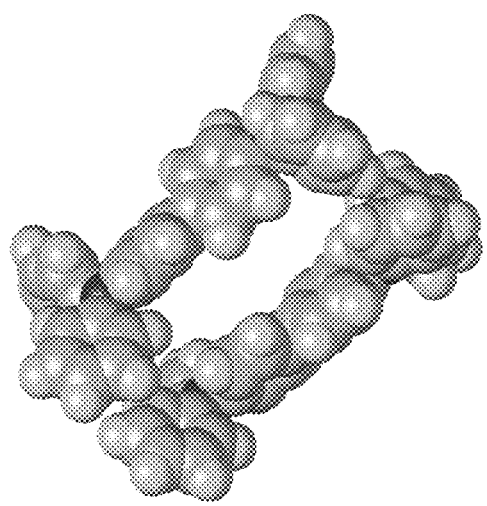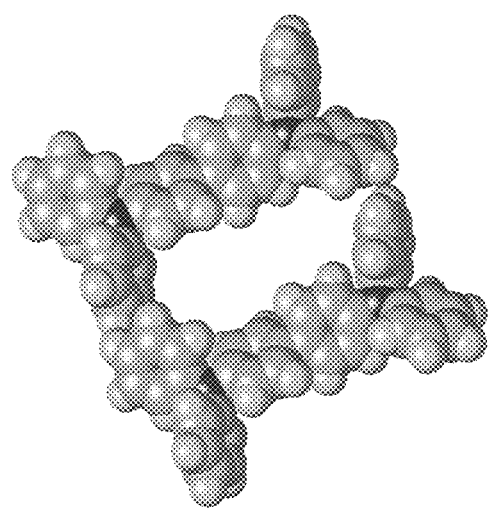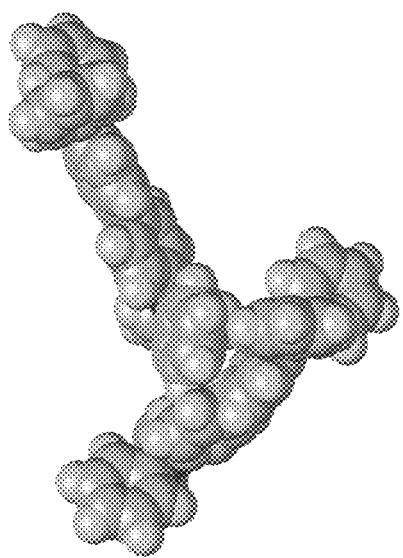
FIG. 28

FIG. 29-(1)

SUMMARY OF AM1 CALCULATION

MOPAC2002 Version 1.00

EMPIRICAL FORMULA: C72 H56 N4

Thu Dec 9 11:56:24 2004
EF AM1
NPB2mer-ptp.mop

GEOMETRY OPTIMISED USING EIGENVECTOR FOLLOWING (EF).
SCF FIELD WAS ACHIEVED

```
        HEAT OF FORMATION      =      399.021586 KCAL =    1669.50632 KJ
        ELECTRONIC ENERGY      =   -149433.137706 EV
        CORE-CORE REPULSION    =    138624.192759 EV
        DIPOLE                 =           0.39458 DEBYE     SYMMETRY: C1
        NO. OF FILLED LEVELS   =       182
        IONIZATION POTENTIAL   =         7.727606 EV
        HOMO LUMO ENERGIES (EV) =       -7.728 -0.276
        MOLECULAR WEIGHT       =       977.261
        SCF CALCULATIONS       =       183
        COMPUTATION TIME = 6 MINUTES AND 28 SECONDS
```

FIG. 29-(2)

```
               FINAL GEOMETRY OBTAINED
EF AM1
NPB2mer-ptp.mop

| | | | | | | | | | | | |
|---|---|---|---|---|---|---|---|---|---|---|---|
| H | 1.101396 | 1 | 119.997196 | 1 | -179.810061 | 1 | 1 | 2 | 3 | 0.1461 |
| H | 1.101627 | 1 | 120.127727 | 1 | 179.656004 | 1 | 3 | 2 | 1 | 0.1474 |
| H | 1.101455 | 1 | 119.193321 | 1 | 179.417345 | 1 | 4 | 3 | 2 | 0.1381 |
| H | 1.101225 | 1 | 119.209245 | 1 | 179.274396 | 1 | 6 | 1 | 2 | 0.1356 |
| H | 1.101334 | 1 | 119.664104 | 1 | 1.024801 | 1 | 8 | 7 | 5 | 0.1373 |
| H | 1.101518 | 1 | 119.457113 | 1 | -179.986021 | 1 | 9 | 8 | 7 | 0.1467 |
| H | 1.101404 | 1 | 120.055033 | 1 | -179.714642 | 1 | 11 | 10 | 9 | 0.1453 |
| H | 1.101212 | 1 | 119.655083 | 1 | 0.183983 | 1 | 12 | 7 | 5 | 0.1355 |
| H | 1.101237 | 1 | 120.087704 | 1 | 0.204285 | 1 | 19 | 16 | 13 | 0.1452 |
| H | 1.100574 | 1 | 119.326177 | 1 | -179.966409 | 1 | 20 | 19 | 16 | 0.1327 |
| H | 1.099033 | 1 | 120.260412 | 1 | 179.852273 | 1 | 21 | 20 | 19 | 0.1330 |
| H | 1.100523 | 1 | 119.948060 | 1 | -179.829135 | 1 | 22 | 21 | 20 | 0.1330 |
| H | 1.101200 | 1 | 120.099700 | 1 | 0.066741 | 1 | 23 | 16 | 13 | 0.1455 |
| H | 1.101464 | 1 | 120.128893 | 1 | 0.010758 | 1 | 24 | 15 | 13 | 0.1488 |
| H | 1.101033 | 1 | 119.233546 | 1 | 179.991317 | 1 | 25 | 24 | 15 | 0.1323 |
| H | 1.099025 | 1 | 120.258732 | 1 | 179.871113 | 1 | 26 | 25 | 24 | 0.1322 |
| H | 1.100513 | 1 | 119.956589 | 1 | -179.906754 | 1 | 27 | 26 | 25 | 0.1326 |
| H | 1.101120 | 1 | 120.109315 | 1 | 0.275916 | 1 | 28 | 15 | 13 | 0.1450 |
| H | 1.101089 | 1 | 120.032035 | 1 | 1.416603 | 1 | 29 | 18 | 14 | 0.1457 |
| H | 1.100515 | 1 | 119.353617 | 1 | 179.813601 | 1 | 30 | 29 | 18 | 0.1330 |
| H | 1.099055 | 1 | 120.194155 | 1 | 179.975837 | 1 | 31 | 30 | 29 | 0.1312 |
| H | 1.102353 | 1 | 120.002515 | 1 | -179.355031 | 1 | 32 | 31 | 30 | 0.1366 |
| H | 1.101378 | 1 | 120.136835 | 1 | -0.895136 | 1 | 33 | 18 | 14 | 0.1474 |
| H | 1.101231 | 1 | 120.173435 | 1 | -1.405166 | 1 | 34 | 17 | 14 | 0.1447 |
| H | 1.100517 | 1 | 119.313457 | 1 | -179.854323 | 1 | 35 | 34 | 17 | 0.1321 |
| H | 1.099001 | 1 | 120.285077 | 1 | 179.866276 | 1 | 36 | 35 | 34 | 0.1327 |
| H | 1.100542 | 1 | 119.927179 | 1 | 179.964448 | 1 | 37 | 36 | 35 | 0.1328 |
| H | 1.101103 | 1 | 120.035510 | 1 | 1.614335 | 1 | 38 | 17 | 14 | 0.1453 |
| C | 8.731377 | 1 | 26.677299 | 1 | -84.987899 | 1 | 1 | 2 | 3 | -0.1592 |
| C | 1.413658 | 1 | 68.365863 | 1 | -123.732143 | 1 | 67 | 1 | 2 | 0.0784 |
| C | 1.413103 | 1 | 118.350499 | 1 | -48.626253 | 1 | 68 | 67 | 1 | -0.1638 |
| C | 1.389016 | 1 | 120.475251 | 1 | -0.221086 | 1 | 69 | 68 | 67 | -0.0988 |
| C | 1.401528 | 1 | 121.077431 | 1 | 0.405756 | 1 | 70 | 69 | 68 | -0.0538 |
| C | 1.388995 | 1 | 120.441287 | 1 | -0.135122 | 1 | 67 | 68 | 69 | -0.1009 |
| C | 1.459176 | 1 | 120.635235 | 1 | 179.629301 | 1 | 71 | 70 | 69 | -0.0567 |
| C | 1.401550 | 1 | 120.694129 | 1 | 38.682065 | 1 | 73 | 71 | 70 | -0.0977 |
| C | 1.388749 | 1 | 121.104357 | 1 | -179.811470 | 1 | 74 | 73 | 71 | -0.1656 |
| C | 1.413729 | 1 | 120.485344 | 1 | 0.400430 | 1 | 75 | 74 | 73 | 0.0843 |
| C | 1.413807 | 1 | 118.296287 | 1 | -0.385850 | 1 | 76 | 75 | 74 | -0.1656 |
| C | 1.401450 | 1 | 120.773271 | 1 | -141.079992 | 1 | 73 | 71 | 70 | -0.0991 |

FIG. 29-(4)

| | | | | | | | | | |
|---|---|---|---|---|---|---|---|---|---|
| N | 1.411687 | 1 | 120.947893 | 1 | 179.074300 | 1 | 76 | 75 | 74 -0.2093 |
| N | 1.413652 | 1 | 120.500143 | 1 | -179.367890 | 1 | 68 | 67 | 72 -0.2068 |
| C | 1.414555 | 1 | 119.900227 | 1 | -30.829296 | 1 | 79 | 76 | 75  0.0749 |
| C | 1.413041 | 1 | 120.205280 | 1 | 144.956237 | 1 | 79 | 76 | 75  0.0814 |
| C | 1.413568 | 1 | 119.831951 | 1 | -40.269506 | 1 | 80 | 68 | 67  0.0804 |
| C | 1.414363 | 1 | 119.699731 | 1 | 148.930859 | 1 | 80 | 68 | 67  0.0777 |
| C | 1.414098 | 1 | 120.492375 | 1 | 147.205834 | 1 | 82 | 79 | 76 -0.1627 |
| C | 1.390875 | 1 | 120.238648 | 1 | -179.724501 | 1 | 85 | 82 | 79 -0.1099 |
| C | 1.393870 | 1 | 120.737023 | 1 | 0.188681 | 1 | 86 | 85 | 82 -0.1535 |
| C | 1.393762 | 1 | 119.482440 | 1 | -0.129890 | 1 | 87 | 86 | 85 -0.1086 |
| C | 1.413601 | 1 | 120.951153 | 1 | -32.507539 | 1 | 82 | 79 | 76 -0.1649 |
| C | 1.413628 | 1 | 120.519053 | 1 | -38.605209 | 1 | 81 | 79 | 76 -0.1599 |
| C | 1.391023 | 1 | 120.204801 | 1 | -179.687995 | 1 | 90 | 81 | 79 -0.1097 |
| C | 1.394013 | 1 | 120.713941 | 1 | 0.194010 | 1 | 91 | 90 | 81 -0.1503 |
| C | 1.393748 | 1 | 119.516683 | 1 | -0.096471 | 1 | 92 | 91 | 90 -0.1109 |
| C | 1.413244 | 1 | 120.841390 | 1 | 141.779755 | 1 | 81 | 79 | 76 -0.1636 |
| C | 1.414200 | 1 | 120.294545 | 1 | -39.833236 | 1 | 84 | 80 | 68 -0.1591 |
| C | 1.390812 | 1 | 120.225751 | 1 | -179.330911 | 1 | 95 | 84 | 80 -0.1102 |
| C | 1.394013 | 1 | 120.734264 | 1 | 0.246845 | 1 | 96 | 95 | 84 -0.1528 |
| C | 1.393568 | 1 | 119.488041 | 1 | -0.167396 | 1 | 97 | 96 | 95 -0.1092 |
| C | 1.413214 | 1 | 121.124497 | 1 | 140.883351 | 1 | 84 | 80 | 68 -0.1649 |
| C | 1.413353 | 1 | 121.095853 | 1 | -29.433743 | 1 | 83 | 80 | 68 -0.1700 |
| C | 1.391280 | 1 | 120.262969 | 1 | 179.057830 | 1 | 100 | 83 | 80 -0.1126 |
| C | 1.393513 | 1 | 120.739997 | 1 | 0.311018 | 1 | 101 | 100 | 83 -0.1531 |
| C | 1.394173 | 1 | 119.467110 | 1 | -0.101205 | 1 | 102 | 101 | 100 -0.1094 |
| C | 1.414366 | 1 | 120.363503 | 1 | 149.880798 | 1 | 83 | 80 | 68 -0.1597 |

FIG. 29-(5)

| | | | | | | | | | | |
|---|---|---|---|---|---|---|---|---|---|---|
| H | 1.101352 | 1 | 120.031385 | 1 | -179.893668 | 1 | 67 | 68 | 69 | 0.1460 |
| H | 1.101526 | 1 | 120.104028 | 1 | 179.899816 | 1 | 69 | 68 | 67 | 0.1467 |
| H | 1.101308 | 1 | 119.264278 | 1 | 179.468699 | 1 | 70 | 69 | 68 | 0.1374 |
| H | 1.101248 | 1 | 119.262979 | 1 | 179.630379 | 1 | 72 | 67 | 68 | 0.1363 |
| H | 1.101275 | 1 | 119.629179 | 1 | 0.863825 | 1 | 74 | 73 | 71 | 0.1366 |
| H | 1.101513 | 1 | 119.433294 | 1 | -179.912625 | 1 | 75 | 74 | 73 | 0.1466 |
| H | 1.101401 | 1 | 120.063819 | 1 | -179.914806 | 1 | 77 | 76 | 75 | 0.1456 |
| H | 1.101274 | 1 | 119.625629 | 1 | 0.275066 | 1 | 78 | 73 | 71 | 0.1363 |
| H | 1.101449 | 1 | 120.104301 | 1 | 0.573783 | 1 | 85 | 82 | 79 | 0.1427 |
| H | 1.100514 | 1 | 119.336214 | 1 | 179.922852 | 1 | 86 | 85 | 82 | 0.1322 |
| H | 1.099056 | 1 | 120.255507 | 1 | 179.862983 | 1 | 87 | 86 | 85 | 0.1334 |
| H | 1.100592 | 1 | 119.947064 | 1 | -179.812730 | 1 | 88 | 87 | 86 | 0.1332 |
| H | 1.101278 | 1 | 120.098436 | 1 | -0.275797 | 1 | 89 | 82 | 79 | 0.1457 |
| H | 1.101308 | 1 | 120.124329 | 1 | 0.542478 | 1 | 90 | 81 | 79 | 0.1475 |
| H | 1.100678 | 1 | 119.315740 | 1 | 179.838198 | 1 | 91 | 90 | 81 | 0.1361 |
| H | 1.099165 | 1 | 120.223634 | 1 | 179.773739 | 1 | 92 | 91 | 90 | 0.1344 |
| H | 1.100549 | 1 | 119.951319 | 1 | -179.915247 | 1 | 93 | 92 | 91 | 0.1331 |
| H | 1.101172 | 1 | 120.106704 | 1 | -0.209279 | 1 | 94 | 81 | 79 | 0.1445 |
| H | 1.101194 | 1 | 120.061268 | 1 | 0.944653 | 1 | 95 | 84 | 80 | 0.1457 |
| H | 1.100593 | 1 | 119.322635 | 1 | -179.996376 | 1 | 96 | 95 | 84 | 0.1332 |
| H | 1.099036 | 1 | 120.256895 | 1 | 179.868260 | 1 | 97 | 96 | 95 | 0.1332 |
| H | 1.100530 | 1 | 119.961150 | 1 | -179.820183 | 1 | 98 | 97 | 96 | 0.1329 |
| H | 1.101174 | 1 | 120.149455 | 1 | -0.699689 | 1 | 99 | 84 | 80 | 0.1447 |
| H | 1.101882 | 1 | 120.169609 | 1 | -0.619724 | 1 | 100 | 83 | 80 | 0.1478 |
| H | 1.100806 | 1 | 119.275272 | 1 | -179.916814 | 1 | 101 | 100 | 83 | 0.1316 |
| H | 1.099025 | 1 | 120.281438 | 1 | 179.882020 | 1 | 102 | 101 | 100 | 0.1334 |
| H | 1.100605 | 1 | 119.927832 | 1 | -179.938397 | 1 | 103 | 102 | 101 | 0.1334 |
| H | 1.101217 | 1 | 120.048876 | 1 | 0.910624 | 1 | 104 | 83 | 80 | 0.1460 |

FIG. 30-(1)

```
              SUMMARY OF AM1      CALCULATION

MOPAC2002
Version 1.00

EMPIRICAL FORMULA: C72 H56 N4

Thu Dec  9 11:48:15
2004
EF AM1
 NPB2mer-per.mop

GEOMETRY OPTIMISED USING EIGENVECTOR FOLLOWING (EF).
       SCF FIELD WAS ACHIEVED

HEAT OF FORMATION       =        398.979202 KCAL =     1669.32898
KJ
           ELECTRONIC ENERGY       =     -136861.717029 EV
           CORE-CORE REPULSION     =      126052.770243 EV
           DIPOLE                  =             0.29521 DEBYE    SYMMETRY:
C1
           NO. OF FILLED LEVELS    =            182
           IONIZATION POTENTIAL    =              7.736611 EV
           HOMO LUMO ENERGIES (EV) =             -7.737 -0.329
           MOLECULAR WEIGHT        =            977.261
           SCF CALCULATIONS        =            153
           COMPUTATION TIME = 5 MINUTES AND 28 SECONDS
```

FIG. 30-(2)

```
                FINAL GEOMETRY OBTAINED
EF AM1
NPB2mer-per.mop

| | | | | | | | | | | |
|---|---|---|---|---|---|---|---|---|---|---|
| H | 1.101504  | 1 | 120.048713 | 1 | -179.832042 | 1 | 1  | 2  | 3  | 0.1468 |
| H | 1.101520  | 1 | 120.078828 | 1 |  179.772179 | 1 | 3  | 2  | 1  | 0.1468 |
| H | 1.101734  | 1 | 119.227435 | 1 |  179.687938 | 1 | 4  | 3  | 2  | 0.1369 |
| H | 1.101293  | 1 | 119.252719 | 1 |  179.439259 | 1 | 6  | 1  | 2  | 0.1368 |
| H | 1.101351  | 1 | 119.645185 | 1 |    0.802603 | 1 | 8  | 7  | 5  | 0.1372 |
| H | 1.101525  | 1 | 119.445922 | 1 | -179.759335 | 1 | 9  | 8  | 7  | 0.1469 |
| H | 1.101525  | 1 | 120.070020 | 1 | -179.933661 | 1 | 11 | 10 | 9  | 0.1470 |
| H | 1.101293  | 1 | 119.645938 | 1 |    0.468270 | 1 | 12 | 7  | 5  | 0.1367 |
| H | 1.101238  | 1 | 120.102251 | 1 |    0.078961 | 1 | 19 | 16 | 13 | 0.1455 |
| H | 1.100604  | 1 | 119.337648 | 1 | -179.993233 | 1 | 20 | 19 | 16 | 0.1335 |
| H | 1.099095  | 1 | 120.248905 | 1 |  179.836862 | 1 | 21 | 20 | 19 | 0.1335 |
| H | 1.100522  | 1 | 119.950484 | 1 | -179.872461 | 1 | 22 | 21 | 20 | 0.1333 |
| H | 1.101175  | 1 | 120.115426 | 1 |    0.164269 | 1 | 23 | 16 | 13 | 0.1453 |
| H | 1.101512  | 1 | 120.131759 | 1 |    0.101332 | 1 | 24 | 15 | 13 | 0.1424 |
| H | 1.100650  | 1 | 119.348503 | 1 | -179.980297 | 1 | 25 | 24 | 15 | 0.1338 |
| H | 1.099123  | 1 | 120.241212 | 1 |  179.881454 | 1 | 26 | 25 | 24 | 0.1338 |
| H | 1.100572  | 1 | 119.951771 | 1 | -179.929907 | 1 | 27 | 26 | 25 | 0.1335 |
| H | 1.101169  | 1 | 120.080385 | 1 |    0.211147 | 1 | 28 | 15 | 13 | 0.1456 |
| H | 1.101190  | 1 | 120.101635 | 1 |    0.237477 | 1 | 29 | 18 | 14 | 0.1454 |
| H | 1.100592  | 1 | 119.323313 | 1 | -179.950569 | 1 | 30 | 29 | 18 | 0.1334 |
| H | 1.099079  | 1 | 120.243185 | 1 |  179.888566 | 1 | 31 | 30 | 29 | 0.1336 |
| H | 1.100588  | 1 | 119.957556 | 1 | -179.944310 | 1 | 32 | 31 | 30 | 0.1334 |
| H | 1.101179  | 1 | 120.110931 | 1 |    0.037786 | 1 | 33 | 18 | 14 | 0.1453 |
| H | 1.101190  | 1 | 120.127020 | 1 |   -0.031943 | 1 | 34 | 17 | 14 | 0.1450 |
| H | 1.100587  | 1 | 119.322448 | 1 | -179.905061 | 1 | 35 | 34 | 17 | 0.1333 |
| H | 1.099072  | 1 | 120.264749 | 1 |  179.874278 | 1 | 36 | 35 | 34 | 0.1336 |
| H | 1.100566  | 1 | 119.945181 | 1 | -179.914449 | 1 | 37 | 36 | 35 | 0.1334 |
| H | 1.101191  | 1 | 120.079918 | 1 |    0.308971 | 1 | 38 | 17 | 14 | 0.1456 |
| C | 15.738328 | 1 |  57.168441 | 1 |  -63.731901 | 1 | 1  | 2  | 3  | -0.1633 |
| C | 1.413819  | 1 |  76.513322 | 1 |  -89.648179 | 1 | 67 | 1  | 2  | 0.0830 |
| C | 1.413419  | 1 | 118.318881 | 1 |   -1.865185 | 1 | 68 | 67 | 1  | -0.1656 |
| C | 1.388808  | 1 | 120.476653 | 1 |   -0.217751 | 1 | 69 | 68 | 67 | -0.0992 |
| C | 1.401495  | 1 | 121.103863 | 1 |    0.364029 | 1 | 70 | 69 | 68 | -0.0558 |
| C | 1.388844  | 1 | 120.459817 | 1 |   -0.096938 | 1 | 67 | 68 | 69 | -0.0996 |
| C | 1.459015  | 1 | 120.666619 | 1 |  179.691973 | 1 | 71 | 70 | 69 | -0.0567 |
| C | 1.401667  | 1 | 120.689021 | 1 |   38.403304 | 1 | 73 | 71 | 70 | -0.0994 |
| C | 1.388612  | 1 | 121.101715 | 1 | -179.833656 | 1 | 74 | 73 | 71 | -0.1627 |
| C | 1.414034  | 1 | 120.473097 | 1 |    0.319683 | 1 | 75 | 74 | 73 | 0.0836 |
| C | 1.413430  | 1 | 118.312177 | 1 |   -0.271923 | 1 | 76 | 75 | 74 | -0.1662 |
| C | 1.401389  | 1 | 120.772307 | 1 | -141.402249 | 1 | 73 | 71 | 70 | -0.0991 |

FIG. 30-(4)

| | | | | | | | | | | |
|---|---|---|---|---|---|---|---|---|---|---|
| N | 1.411919 | 1 | 120.596410 | 1 | 179.875434 | 1 | 76 | 75 | 74 | -0.2092 |
| N | 1.412060 | 1 | 120.715674 | 1 | -179.792960 | 1 | 68 | 67 | 72 | -0.2090 |
| C | 1.414274 | 1 | 119.829132 | 1 | -36.146226 | 1 | 79 | 76 | 75 | 0.0768 |
| C | 1.412992 | 1 | 120.139908 | 1 | 147.976290 | 1 | 79 | 76 | 75 | 0.0812 |
| C | 1.413387 | 1 | 120.075070 | 1 | -36.152532 | 1 | 80 | 68 | 67 | 0.0798 |
| C | 1.413702 | 1 | 119.941062 | 1 | 148.051828 | 1 | 80 | 68 | 67 | 0.0788 |
| C | 1.413698 | 1 | 120.854766 | 1 | 143.686643 | 1 | 82 | 79 | 76 | -0.1649 |
| C | 1.391000 | 1 | 120.249664 | 1 | 179.470431 | 1 | 85 | 82 | 79 | -0.1097 |
| C | 1.393793 | 1 | 120.728112 | 1 | 0.277429 | 1 | 86 | 85 | 82 | -0.1542 |
| C | 1.393894 | 1 | 119.485705 | 1 | -0.157171 | 1 | 87 | 86 | 85 | -0.1093 |
| C | 1.414025 | 1 | 120.582874 | 1 | -36.721522 | 1 | 82 | 79 | 76 | -0.1626 |
| C | 1.413455 | 1 | 120.820168 | 1 | -33.520843 | 1 | 81 | 79 | 76 | -0.1632 |
| C | 1.390962 | 1 | 120.229759 | 1 | 179.410727 | 1 | 90 | 81 | 79 | -0.1104 |
| C | 1.393840 | 1 | 120.722094 | 1 | 0.354991 | 1 | 91 | 90 | 81 | -0.1525 |
| C | 1.393880 | 1 | 119.491526 | 1 | -0.209148 | 1 | 92 | 91 | 90 | -0.1104 |
| C | 1.413538 | 1 | 120.563934 | 1 | 146.089309 | 1 | 81 | 79 | 76 | -0.1611 |
| C | 1.413881 | 1 | 120.516126 | 1 | -37.698702 | 1 | 84 | 80 | 68 | -0.1610 |
| C | 1.390863 | 1 | 120.228319 | 1 | -179.721675 | 1 | 95 | 84 | 80 | -0.1101 |
| C | 1.393938 | 1 | 120.727092 | 1 | 0.228487 | 1 | 96 | 95 | 84 | -0.1527 |
| C | 1.393738 | 1 | 119.495867 | 1 | -0.105186 | 1 | 97 | 96 | 95 | -0.1097 |
| C | 1.413436 | 1 | 120.892757 | 1 | 142.674916 | 1 | 84 | 80 | 68 | -0.1632 |
| C | 1.413514 | 1 | 120.920099 | 1 | -32.331790 | 1 | 83 | 80 | 68 | -0.1647 |
| C | 1.391142 | 1 | 120.240107 | 1 | 179.380136 | 1 | 100 | 83 | 80 | -0.1093 |
| C | 1.393707 | 1 | 120.728452 | 1 | 0.352098 | 1 | 101 | 100 | 83 | -0.1534 |
| C | 1.393938 | 1 | 119.482238 | 1 | -0.106477 | 1 | 102 | 101 | 100 | -0.1096 |
| C | 1.413999 | 1 | 120.500771 | 1 | 147.330381 | 1 | 83 | 80 | 68 | -0.1615 |

FIG. 30-(5)

| | | | | | | | | | | |
|---|---|---|---|---|---|---|---|---|---|---|
| H | 1.101479 | 1 | 120.051857 | 1 | 179.995380 | 1 | 67 | 68 | 69 | 0.1464 |
| H | 1.101492 | 1 | 120.090062 | 1 | 179.902558 | 1 | 69 | 68 | 67 | 0.1462 |
| H | 1.101252 | 1 | 119.248406 | 1 | 179.520907 | 1 | 70 | 69 | 68 | 0.1366 |
| H | 1.101270 | 1 | 119.244926 | 1 | 179.584630 | 1 | 72 | 67 | 68 | 0.1364 |
| H | 1.101278 | 1 | 119.651713 | 1 | 0.892241 | 1 | 74 | 73 | 71 | 0.1365 |
| H | 1.101493 | 1 | 119.488824 | 1 | -179.886658 | 1 | 75 | 74 | 73 | 0.1471 |
| H | 1.101457 | 1 | 120.086502 | 1 | 179.968949 | 1 | 77 | 76 | 75 | 0.1460 |
| H | 1.101278 | 1 | 119.646117 | 1 | 0.345950 | 1 | 78 | 73 | 71 | 0.1360 |
| H | 1.101148 | 1 | 120.095588 | 1 | -0.209369 | 1 | 85 | 82 | 79 | 0.1450 |
| H | 1.100542 | 1 | 119.324757 | 1 | 179.975590 | 1 | 86 | 85 | 82 | 0.1324 |
| H | 1.099016 | 1 | 120.256613 | 1 | 179.824399 | 1 | 87 | 86 | 85 | 0.1329 |
| H | 1.100609 | 1 | 119.944655 | 1 | -179.850538 | 1 | 88 | 87 | 86 | 0.1330 |
| H | 1.101194 | 1 | 120.076099 | 1 | 0.476638 | 1 | 89 | 82 | 79 | 0.1456 |
| H | 1.101224 | 1 | 120.125213 | 1 | -0.230893 | 1 | 90 | 81 | 79 | 0.1450 |
| H | 1.100684 | 1 | 119.350400 | 1 | -179.844076 | 1 | 91 | 90 | 81 | 0.1347 |
| H | 1.100192 | 1 | 120.217824 | 1 | 179.893834 | 1 | 92 | 91 | 90 | 0.1391 |
| H | 1.101055 | 1 | 119.892920 | 1 | -179.706730 | 1 | 93 | 92 | 91 | 0.1328 |
| H | 1.101040 | 1 | 120.066356 | 1 | 0.500208 | 1 | 94 | 81 | 79 | 0.1441 |
| H | 1.101178 | 1 | 120.084274 | 1 | 0.542662 | 1 | 95 | 84 | 80 | 0.1456 |
| H | 1.100572 | 1 | 119.323828 | 1 | 179.997950 | 1 | 96 | 95 | 84 | 0.1332 |
| H | 1.099048 | 1 | 120.250037 | 1 | 179.925159 | 1 | 97 | 96 | 95 | 0.1332 |
| H | 1.100574 | 1 | 119.949094 | 1 | -179.848584 | 1 | 98 | 97 | 96 | 0.1330 |
| H | 1.101186 | 1 | 120.109527 | 1 | -0.210880 | 1 | 99 | 84 | 80 | 0.1452 |
| H | 1.101206 | 1 | 120.133755 | 1 | -0.355412 | 1 | 100 | 83 | 80 | 0.1453 |
| H | 1.100577 | 1 | 119.306837 | 1 | -179.912488 | 1 | 101 | 100 | 83 | 0.1330 |
| H | 1.099072 | 1 | 120.264777 | 1 | 179.891364 | 1 | 102 | 101 | 100 | 0.1332 |
| H | 1.100585 | 1 | 119.938956 | 1 | -179.937708 | 1 | 103 | 102 | 101 | 0.1330 |
| H | 1.101163 | 1 | 120.064361 | 1 | 0.616686 | 1 | 104 | 83 | 80 | 0.1454 |

FIG. 31-(1)

SUMMARY OF AM1 CALCULATION

MOPAC2002
Version 1.00

EMPIRICAL FORMULA: C72 H56 N4

Thu Dec 9 12:07:24 2004
EF AM1
NPB2mer1.mop

GEOMETRY OPTIMISED USING EIGENVECTOR FOLLOWING (EF).
SCF FIELD WAS ACHIEVED

| | | | |
|---|---|---|---|
| HEAT OF FORMATION | = | 398.713494 KCAL = | 1668.21726 KJ |
| ELECTRONIC ENERGY | = | -138351.766306 EV | |
| CORE-CORE REPULSION | = | 127542.807998 EV | |
| DIPOLE | = | 0.12710 DEBYE | SYMMETRY: C1 |
| NO. OF FILLED LEVELS | = | 182 | |
| IONIZATION POTENTIAL | = | 7.775046 EV | |
| HOMO LUMO ENERGIES (EV) | = | -7.775 -0.298 | |
| MOLECULAR WEIGHT | = | 977.261 | |
| SCF CALCULATIONS | = | 171 | |
| COMPUTATION TIME | = | 6 MINUTES AND 6 SECONDS | |

FIG. 31-(2)

```
        FINAL GEOMETRY OBTAINED
EF AM1
NPB2mer1.mop

| | | | | | | | | | | |
|---|---|---|---|---|---|---|---|---|---|---|
| H | 1.101464 | 1 | 120.024283 | 1 | -179.666658 | 1 | 1 | 2 | 3 | 0.1464 |
| H | 1.101491 | 1 | 120.107446 | 1 | 179.453675 | 1 | 3 | 2 | 1 | 0.1460 |
| H | 1.101302 | 1 | 119.265789 | 1 | 179.898582 | 1 | 4 | 3 | 2 | 0.1363 |
| H | 1.101292 | 1 | 119.273604 | 1 | 179.442216 | 1 | 6 | 1 | 2 | 0.1364 |
| H | 1.101264 | 1 | 119.620748 | 1 | 0.248897 | 1 | 8 | 7 | 5 | 0.1363 |
| H | 1.101444 | 1 | 119.397763 | 1 | -179.554163 | 1 | 9 | 8 | 7 | 0.1455 |
| H | 1.101477 | 1 | 120.045202 | 1 | 179.940822 | 1 | 11 | 10 | 9 | 0.1465 |
| H | 1.101264 | 1 | 119.612260 | 1 | 0.866762 | 1 | 12 | 7 | 5 | 0.1366 |
| H | 1.101203 | 1 | 120.069110 | 1 | 0.762420 | 1 | 19 | 16 | 13 | 0.1454 |
| H | 1.100588 | 1 | 119.339140 | 1 | 179.936020 | 1 | 20 | 19 | 16 | 0.1334 |
| H | 1.099105 | 1 | 120.245109 | 1 | 179.797176 | 1 | 21 | 20 | 19 | 0.1335 |
| H | 1.100524 | 1 | 119.956979 | 1 | -179.800721 | 1 | 22 | 21 | 20 | 0.1334 |
| H | 1.101225 | 1 | 120.134171 | 1 | -0.480914 | 1 | 23 | 16 | 13 | 0.1454 |
| H | 1.101280 | 1 | 120.080680 | 1 | 0.560415 | 1 | 24 | 15 | 13 | 0.1466 |
| H | 1.101017 | 1 | 119.314985 | 1 | -179.917084 | 1 | 25 | 24 | 15 | 0.1351 |
| H | 1.099338 | 1 | 120.268883 | 1 | 179.808841 | 1 | 26 | 25 | 24 | 0.1329 |
| H | 1.100592 | 1 | 119.960020 | 1 | -179.957368 | 1 | 27 | 26 | 25 | 0.1338 |
| H | 1.101212 | 1 | 120.106213 | 1 | -0.243683 | 1 | 28 | 15 | 13 | 0.1458 |
| H | 1.101178 | 1 | 120.060277 | 1 | 0.426646 | 1 | 29 | 18 | 14 | 0.1457 |
| H | 1.100673 | 1 | 119.357716 | 1 | 179.993438 | 1 | 30 | 29 | 18 | 0.1347 |
| H | 1.101127 | 1 | 120.166080 | 1 | -179.738627 | 1 | 31 | 30 | 29 | 0.1363 |
| H | 1.100542 | 1 | 119.989243 | 1 | 179.901783 | 1 | 32 | 31 | 30 | 0.1322 |
| H | 1.101213 | 1 | 120.112166 | 1 | -0.080605 | 1 | 33 | 18 | 14 | 0.1452 |
| H | 1.101255 | 1 | 120.136644 | 1 | -0.521895 | 1 | 34 | 17 | 14 | 0.1453 |
| H | 1.100578 | 1 | 119.322743 | 1 | -179.885641 | 1 | 35 | 34 | 17 | 0.1332 |
| H | 1.099068 | 1 | 120.266599 | 1 | 179.874746 | 1 | 36 | 35 | 34 | 0.1334 |
| H | 1.100561 | 1 | 119.938365 | 1 | -179.928605 | 1 | 37 | 36 | 35 | 0.1333 |
| H | 1.101143 | 1 | 120.059818 | 1 | 0.762695 | 1 | 38 | 17 | 14 | 0.1455 |
| C | 10.851193 | 1 | 31.911052 | 1 | 51.509531 | 1 | 1 | 2 | 3 | -0.1651 |
| C | 1.413805 | 1 | 147.816718 | 1 | 10.149867 | 1 | 67 | 1 | 2 | 0.0836 |
| C | 1.413670 | 1 | 118.312443 | 1 | -125.729012 | 1 | 68 | 67 | 1 | -0.1651 |
| C | 1.389112 | 1 | 120.464242 | 1 | 0.054554 | 1 | 69 | 68 | 67 | -0.0985 |
| C | 1.401204 | 1 | 121.078415 | 1 | 0.485443 | 1 | 70 | 69 | 68 | -0.0563 |
| C | 1.388698 | 1 | 120.483807 | 1 | -0.555302 | 1 | 67 | 68 | 69 | -0.0991 |
| C | 1.459152 | 1 | 120.806445 | 1 | 179.285783 | 1 | 71 | 70 | 69 | -0.0588 |
| C | 1.401309 | 1 | 120.825768 | 1 | 40.801632 | 1 | 73 | 71 | 70 | -0.0979 |
| C | 1.388906 | 1 | 121.077449 | 1 | 179.716734 | 1 | 74 | 73 | 71 | -0.1649 |
| C | 1.414210 | 1 | 120.488066 | 1 | 0.520744 | 1 | 75 | 74 | 73 | 0.0853 |
| C | 1.413750 | 1 | 118.270583 | 1 | -0.111808 | 1 | 76 | 75 | 74 | -0.1688 |
| C | 1.401290 | 1 | 120.597179 | 1 | -139.130205 | 1 | 73 | 71 | 70 | -0.0976 |

FIG. 31-(4)

| | | | | | | | | | | |
|---|---|---|---|---|---|---|---|---|---|---|
| N | 1.411450 | 1 | 120.644378 | 1 | -179.467711 | 1 | 76 | 75 | 74 | -0.2081 |
| N | 1.411863 | 1 | 120.734487 | 1 | 179.483615 | 1 | 68 | 67 | 72 | -0.2095 |
| C | 1.414388 | 1 | 120.078517 | 1 | -35.448250 | 1 | 79 | 76 | 75 | 0.0772 |
| C | 1.414388 | 1 | 120.035222 | 1 | 151.108029 | 1 | 79 | 76 | 75 | 0.0774 |
| C | 1.413284 | 1 | 120.049669 | 1 | -33.927855 | 1 | 80 | 68 | 67 | 0.0811 |
| C | 1.413759 | 1 | 120.056188 | 1 | 147.330743 | 1 | 80 | 68 | 67 | 0.0785 |
| C | 1.413359 | 1 | 120.890037 | 1 | 141.003854 | 1 | 82 | 79 | 76 | -0.1626 |
| C | 1.391146 | 1 | 120.236916 | 1 | 179.600839 | 1 | 85 | 82 | 79 | -0.1117 |
| C | 1.393641 | 1 | 120.723800 | 1 | 0.294603 | 1 | 86 | 85 | 82 | -0.1564 |
| C | 1.393968 | 1 | 119.489175 | 1 | -0.436053 | 1 | 87 | 86 | 85 | -0.1094 |
| C | 1.413759 | 1 | 120.513343 | 1 | -39.550864 | 1 | 82 | 79 | 76 | -0.1600 |
| C | 1.413195 | 1 | 121.072295 | 1 | -32.627675 | 1 | 81 | 79 | 76 | -0.1636 |
| C | 1.391266 | 1 | 120.231540 | 1 | 179.180773 | 1 | 90 | 81 | 79 | -0.1101 |
| C | 1.393689 | 1 | 120.707963 | 1 | 0.360415 | 1 | 91 | 90 | 81 | -0.1519 |
| C | 1.393982 | 1 | 119.512566 | 1 | -0.050670 | 1 | 92 | 91 | 90 | -0.1106 |
| C | 1.413904 | 1 | 120.316421 | 1 | 146.932405 | 1 | 81 | 79 | 76 | -0.1586 |
| C | 1.413649 | 1 | 120.678732 | 1 | -36.362780 | 1 | 84 | 80 | 68 | -0.1616 |
| C | 1.390980 | 1 | 120.220877 | 1 | 179.936768 | 1 | 95 | 84 | 80 | -0.1100 |
| C | 1.393903 | 1 | 120.716411 | 1 | 0.298512 | 1 | 96 | 95 | 84 | -0.1522 |
| C | 1.393807 | 1 | 119.513907 | 1 | -0.090519 | 1 | 97 | 96 | 95 | -0.1098 |
| C | 1.413584 | 1 | 120.711326 | 1 | 143.818591 | 1 | 84 | 80 | 68 | -0.1621 |
| C | 1.413883 | 1 | 120.790348 | 1 | -34.080604 | 1 | 83 | 80 | 68 | -0.1630 |
| C | 1.390897 | 1 | 120.250542 | 1 | 179.552152 | 1 | 100 | 83 | 80 | -0.1123 |
| C | 1.393858 | 1 | 120.729151 | 1 | 0.364106 | 1 | 101 | 100 | 83 | -0.1577 |
| C | 1.393842 | 1 | 119.486079 | 1 | -0.045273 | 1 | 102 | 101 | 100 | -0.1081 |
| C | 1.413864 | 1 | 120.650610 | 1 | 145.822718 | 1 | 83 | 80 | 68 | -0.1624 |

FIG. 31-(5)

| | | | | | | | | | |
|---|---|---|---|---|---|---|---|---|---|
| H | 1.101403 | 1 | 120.072737 | 1 | 179.677946 | 1 | 67 | 68 | 69 | 0.1457 |
| H | 1.101434 | 1 | 120.079759 | 1 | -179.838653 | 1 | 69 | 68 | 67 | 0.1463 |
| H | 1.101288 | 1 | 119.315988 | 1 | 179.657424 | 1 | 70 | 69 | 68 | 0.1366 |
| H | 1.101261 | 1 | 119.325801 | 1 | 179.854877 | 1 | 72 | 67 | 68 | 0.1365 |
| H | 1.101248 | 1 | 119.599670 | 1 | 0.544821 | 1 | 74 | 73 | 71 | 0.1364 |
| H | 1.101448 | 1 | 119.447146 | 1 | -179.543996 | 1 | 75 | 74 | 73 | 0.1465 |
| H | 1.101501 | 1 | 120.125387 | 1 | 179.711609 | 1 | 77 | 76 | 75 | 0.1461 |
| H | 1.101265 | 1 | 119.593955 | 1 | 0.469476 | 1 | 78 | 73 | 71 | 0.1362 |
| H | 1.101246 | 1 | 120.109263 | 1 | -0.077717 | 1 | 85 | 82 | 79 | 0.1451 |
| H | 1.100553 | 1 | 119.292461 | 1 | 179.971042 | 1 | 86 | 85 | 82 | 0.1321 |
| H | 1.101295 | 1 | 120.344864 | 1 | 179.372641 | 1 | 87 | 86 | 85 | 0.1370 |
| H | 1.100604 | 1 | 119.906855 | 1 | -179.632190 | 1 | 88 | 87 | 86 | 0.1346 |
| H | 1.101181 | 1 | 120.073830 | 1 | 0.416853 | 1 | 89 | 82 | 79 | 0.1457 |
| H | 1.101253 | 1 | 120.116914 | 1 | -0.492163 | 1 | 90 | 81 | 79 | 0.1453 |
| H | 1.100569 | 1 | 119.330784 | 1 | -179.927887 | 1 | 91 | 90 | 81 | 0.1333 |
| H | 1.099127 | 1 | 120.247752 | 1 | 179.911991 | 1 | 92 | 91 | 90 | 0.1334 |
| H | 1.100549 | 1 | 119.949794 | 1 | -179.966221 | 1 | 93 | 92 | 91 | 0.1333 |
| H | 1.101138 | 1 | 120.054075 | 1 | 0.829672 | 1 | 94 | 81 | 79 | 0.1455 |
| H | 1.101184 | 1 | 120.083423 | 1 | 0.230561 | 1 | 95 | 84 | 80 | 0.1455 |
| H | 1.100575 | 1 | 119.338664 | 1 | -179.999522 | 1 | 96 | 95 | 84 | 0.1334 |
| H | 1.099089 | 1 | 120.237056 | 1 | 179.867687 | 1 | 97 | 96 | 95 | 0.1335 |
| H | 1.100573 | 1 | 119.961648 | 1 | -179.918743 | 1 | 98 | 97 | 96 | 0.1334 |
| H | 1.101175 | 1 | 120.102999 | 1 | 0.067559 | 1 | 99 | 84 | 80 | 0.1453 |
| H | 1.101318 | 1 | 120.122009 | 1 | -0.140644 | 1 | 100 | 83 | 80 | 0.1464 |
| H | 1.101020 | 1 | 119.310141 | 1 | -179.851643 | 1 | 101 | 100 | 83 | 0.1350 |
| H | 1.099260 | 1 | 120.269195 | 1 | 179.858533 | 1 | 102 | 101 | 100 | 0.1326 |
| H | 1.100583 | 1 | 119.945353 | 1 | 179.994924 | 1 | 103 | 102 | 101 | 0.1337 |
| H | 1.101213 | 1 | 120.085356 | 1 | 0.368862 | 1 | 104 | 83 | 80 | 0.1459 |

FIG. 32-(1)

```
                SUMMARY OF AM1      CALCULATION

MOPAC2002
Version 1.00

EMPIRICAL FORMULA: C36 H28 N2

Fri Dec 10 11:54:40
2004
EF AM1 CHARGE=1
 NPB++.mop

GEOMETRY OPTIMISED USING EIGENVECTOR FOLLOWING (EF).
        SCF FIELD WAS ACHIEVED

HEAT OF FORMATION       =      418.144745 KCAL =      1749.51761
KJ
            ELECTRONIC ENERGY       =    -49896.582591 EV       STATE: DOUBLET
A
            CORE-CORE REPULSION     =     44501.590985 EV
            GRADIENT NORM           =        22.950207
            DIPOLE                  =            0.65784 DEBYE    SYMMETRY:
C1
            NO. OF FILLED LEVELS    =           90
            AND NO. OF OPEN LEVELS  =            1
            CONFIGURATION INTERACTION WAS USED
            CHARGE ON SYSTEM        =            1
            IONIZATION POTENTIAL    =            9.856785 EV
            HOMO (SOMO) LUMO (EV)   =          -11.828 ( -11.209 ) -7.541
            MOLECULAR WEIGHT        =          488.631
            SCF CALCULATIONS        =          122
            COMPUTATION TIME = 2 HOURS   0 MINUTES AND 38 SECONDS
```

FIG. 32-(2)

```
        FINAL GEOMETRY OBTAINED
EF AM1 CHARGE=1   NPB++.mop

| | | | | | | | | | | |
|---|---|---|---|---|---|---|---|---|---|---|
| H | 1.103337 | 1 | 118.201415 | 1 | 156.272954 | 1 | 1 | 2 | 3 | 0.1697 |
| H | 1.103062 | 1 | 118.530997 | 1 | -157.387746 | 1 | 3 | 2 | 1 | 0.1681 |
| H | 1.099031 | 1 | 122.481478 | 1 | -172.270547 | 1 | 4 | 3 | 2 | 0.1612 |
| H | 1.099012 | 1 | 122.575785 | 1 | 171.033721 | 1 | 6 | 1 | 2 | 0.1614 |
| H | 1.102464 | 1 | 117.960230 | 1 | -0.991849 | 1 | 8 | 7 | 5 | 0.1483 |
| H | 1.104509 | 1 | 119.879248 | 1 | -179.776886 | 1 | 9 | 8 | 7 | 0.1651 |
| H | 1.104360 | 1 | 118.630131 | 1 | 179.859642 | 1 | 11 | 10 | 9 | 0.1648 |
| H | 1.102458 | 1 | 117.880211 | 1 | 1.159531 | 1 | 12 | 7 | 5 | 0.1473 |
| H | 1.101499 | 1 | 120.594108 | 1 | -0.738454 | 1 | 19 | 16 | 13 | 0.1508 |
| H | 1.101500 | 1 | 119.426517 | 1 | -179.846205 | 1 | 20 | 19 | 16 | 0.1517 |
| H | 1.101261 | 1 | 120.064358 | 1 | -179.852614 | 1 | 21 | 20 | 19 | 0.1516 |
| H | 1.101423 | 1 | 120.020486 | 1 | -179.701176 | 1 | 22 | 21 | 20 | 0.1501 |
| H | 1.101226 | 1 | 120.603940 | 1 | 1.079683 | 1 | 23 | 16 | 13 | 0.1469 |
| H | 1.101103 | 1 | 120.566427 | 1 | 1.032144 | 1 | 24 | 15 | 13 | 0.1452 |
| H | 1.101372 | 1 | 119.492015 | 1 | 179.863025 | 1 | 25 | 24 | 15 | 0.1494 |
| H | 1.101263 | 1 | 120.039851 | 1 | 179.784051 | 1 | 26 | 25 | 24 | 0.1514 |
| H | 1.101606 | 1 | 120.044508 | 1 | 179.814922 | 1 | 27 | 26 | 25 | 0.1524 |
| H | 1.101593 | 1 | 120.619336 | 1 | -0.657385 | 1 | 28 | 15 | 13 | 0.1514 |
| H | 1.101640 | 1 | 120.549217 | 1 | 0.375162 | 1 | 29 | 18 | 14 | 0.1484 |
| H | 1.101645 | 1 | 119.476194 | 1 | 179.835624 | 1 | 30 | 29 | 18 | 0.1531 |
| H | 1.101441 | 1 | 120.019541 | 1 | 179.856602 | 1 | 31 | 30 | 29 | 0.1535 |
| H | 1.101745 | 1 | 120.036591 | 1 | 179.867349 | 1 | 32 | 31 | 30 | 0.1544 |
| H | 1.101539 | 1 | 120.658237 | 1 | -0.467343 | 1 | 33 | 18 | 14 | 0.1527 |
| H | 1.101463 | 1 | 120.485298 | 1 | 0.404448 | 1 | 34 | 17 | 14 | 0.1458 |
| H | 1.101465 | 1 | 119.422395 | 1 | 179.862536 | 1 | 35 | 34 | 17 | 0.1501 |
| H | 1.101421 | 1 | 120.101159 | 1 | 179.892260 | 1 | 36 | 35 | 34 | 0.1534 |
| H | 1.101784 | 1 | 120.034328 | 1 | 179.925986 | 1 | 37 | 36 | 35 | 0.1540 |
| H | 1.102130 | 1 | 120.489903 | 1 | -0.671724 | 1 | 38 | 17 | 14 | 0.1549 |

FIG. 33-(1)

```
                  SUMMARY OF AM1      CALCULATION

MOPAC2002
Version 1.00
            EMPIRICAL FORMULA: C72 H56 N4

Mon Dec 20 22:38:55
2004
EF AM1 CHARGE=1
 NPB2mer-ptp-gro-cati.mop

GEOMETRY OPTIMISED USING EIGENVECTOR FOLLOWING (EF).
       SCF FIELD WAS ACHIEVED

HEAT OF FORMATION      =       568.226649 KCAL =       2377.46030
KJ
          ELECTRONIC ENERGY      =    -148187.875408 EV      STATE: DOUBLET
A
          CORE-CORE REPULSION    =     137386.267888 EV
          GRADIENT NORM          =        267.672526
          DIPOLE                 =             15.10612 DEBYE     SYMMETRY:
C1
          NO. OF FILLED LEVELS   =      181
          AND NO. OF OPEN LEVELS =        1
          CHARGE ON SYSTEM       =        1
          IONIZATION POTENTIAL   =       10.538548 EV
          HOMO (SOMO) LUMO (EV)  =       -9.711 ( -9.258 ) -8.433
          MOLECULAR WEIGHT       =      977.261
          SCF CALCULATIONS       =       45
          COMPUTATION TIME = 12 HOURS 57 MINUTES AND  4 SECONDS
```

FIG. 33-(2)

```
             FINAL GEOMETRY OBTAINED
EF AM1 CHARGE=1
NPB2mer-ptp-gro-cati.mop C     0.000000  0    0.000000  0     0.000000  0     0     0     0   -0.1754
   C     1.438413  1    0.000000  0     0.000000  0     1     0     0    0.1493
   C     1.436963  1  117.955694  1     0.000000  0     2     1     0   -0.1732
   C     1.370740  1  120.564970  1    -0.404897  1     3     2     1   -0.0652
   C     1.421939  1  121.393561  1     0.699370  1     4     3     2   -0.0465
   C     1.371900  1  120.213515  1    -2.458275  1     1     2     3   -0.0730
   C     1.422958  1  120.824941  1   177.174931  1     5     4     3   -0.0296
   C     1.421293  1  120.913936  1    44.531441  1     7     5     4   -0.0752
   C     1.372003  1  121.089173  1   179.172583  1     8     7     5   -0.1692
   C     1.437157  1  120.605839  1     2.416306  1     9     8     7    0.1369
   C     1.437004  1  117.999531  1    -2.654843  1    10     9     8   -0.1637
   C     1.422083  1  120.612676  1  -135.756037  1     7     5     4   -0.0750
   N     1.370780  1  121.087033  1  -179.664523  1    10     9     8   -0.1097
   N     1.369201  1  121.060682  1   179.145318  1     2     1     6   -0.1201
   C     1.423905  1  122.589773  1   -27.394339  1    13    10     9    0.0230
   C     1.434270  1  119.441747  1   154.411832  1    13    10     9   -0.0106
   C     1.425659  1  122.616699  1   -25.261077  1    14     2     1    0.0235
   C     1.436219  1  119.622665  1   161.268743  1    14     2     1   -0.0108
   C     1.409898  1  120.141289  1   110.865058  1    16    13    10   -0.1121
   C     1.392854  1  119.661688  1   179.773926  1    19    16    13   -0.1196
   C     1.394594  1  120.333030  1    -0.003773  1    20    19    16   -0.1039
   C     1.394531  1  120.130333  1    -0.037459  1    21    20    19   -0.1217
   C     1.409769  1  120.041421  1   -69.417679  1    16    13    10   -0.1185
   C     1.411335  1  120.993510  1   -32.782244  1    15    13    10   -0.1413
   C     1.392731  1  119.923442  1   178.776473  1    24    15    13   -0.1115
   C     1.394127  1  120.502698  1     1.987209  1    25    24    15   -0.1132
   C     1.394382  1  119.969981  1    -0.589819  1    26    25    24   -0.1088
   C     1.412402  1  119.593241  1   148.134213  1    15    13    10   -0.1243
   C     1.409124  1  119.786809  1   -88.737165  1    18    14     2   -0.1169
   C     1.393107  1  119.689185  1  -179.208864  1    29    18    14   -0.1216
   C     1.394439  1  120.377202  1    -0.027830  1    30    29    18   -0.1060
   C     1.394562  1  120.199042  1     0.260588  1    31    30    29   -0.1186
   C     1.409371  1  120.296094  1    92.425145  1    18    14     2   -0.1153
   C     1.410275  1  121.111331  1   -36.864345  1    17    14     2   -0.1420
   C     1.392046  1  119.830013  1  -179.172850  1    34    17    14   -0.1137
   C     1.393953  1  120.371744  1     0.962344  1    35    34    17   -0.1118
   C     1.394516  1  119.923669  1    -0.287874  1    36    35    34   -0.1094
   C     1.411736  1  119.510917  1   145.001398  1    17    14     2   -0.1213
```

FIG. 33-(3)

| | | | | | | | | | | | |
|---|---|---|---|---|---|---|---|---|---|---|---|
| H | 1.103096 | 1 | 119.900513 | 1 | 178.363615 | 1 | 1 | 2 | 3 | 0.1673 |
| H | 1.103701 | 1 | 119.801069 | 1 | 179.716669 | 1 | 3 | 2 | 1 | 0.1679 |
| H | 1.103458 | 1 | 119.570666 | 1 | 179.095991 | 1 | 4 | 3 | 2 | 0.1547 |
| H | 1.103969 | 1 | 119.408617 | 1 | -179.424447 | 1 | 6 | 1 | 2 | 0.1520 |
| H | 1.103047 | 1 | 119.636264 | 1 | 1.439863 | 1 | 8 | 7 | 5 | 0.1559 |
| H | 1.103781 | 1 | 119.760887 | 1 | -177.688625 | 1 | 9 | 8 | 7 | 0.1674 |
| H | 1.103360 | 1 | 119.814311 | 1 | 179.829221 | 1 | 11 | 10 | 9 | 0.1666 |
| H | 1.103226 | 1 | 119.616510 | 1 | 0.899834 | 1 | 12 | 7 | 5 | 0.1546 |
| H | 1.102099 | 1 | 120.357809 | 1 | 0.093572 | 1 | 19 | 16 | 13 | 0.1556 |
| H | 1.101498 | 1 | 119.764950 | 1 | -179.931182 | 1 | 20 | 19 | 16 | 0.1536 |
| H | 1.101650 | 1 | 119.972684 | 1 | 179.988267 | 1 | 21 | 20 | 19 | 0.1517 |
| H | 1.101435 | 1 | 119.984668 | 1 | -179.957778 | 1 | 22 | 21 | 20 | 0.1516 |
| H | 1.101280 | 1 | 120.415912 | 1 | -0.038192 | 1 | 23 | 16 | 13 | 0.1492 |
| H | 1.101698 | 1 | 120.558181 | 1 | -1.090012 | 1 | 24 | 15 | 13 | 0.1482 |
| H | 1.101565 | 1 | 119.669655 | 1 | -178.690250 | 1 | 25 | 24 | 15 | 0.1518 |
| H | 1.101244 | 1 | 120.069914 | 1 | 179.075078 | 1 | 26 | 25 | 24 | 0.1504 |
| H | 1.101643 | 1 | 119.982883 | 1 | 179.364848 | 1 | 27 | 26 | 25 | 0.1526 |
| H | 1.102076 | 1 | 120.330043 | 1 | 0.192294 | 1 | 28 | 15 | 13 | 0.1550 |
| H | 1.101383 | 1 | 120.381792 | 1 | 0.509994 | 1 | 29 | 18 | 14 | 0.1487 |
| H | 1.101194 | 1 | 119.776361 | 1 | 179.763564 | 1 | 30 | 29 | 18 | 0.1507 |
| H | 1.101581 | 1 | 120.001763 | 1 | 179.874637 | 1 | 31 | 30 | 29 | 0.1504 |
| H | 1.103349 | 1 | 120.007888 | 1 | 179.548404 | 1 | 32 | 31 | 30 | 0.1611 |
| H | 1.101769 | 1 | 120.511603 | 1 | -0.815523 | 1 | 33 | 18 | 14 | 0.1499 |
| H | 1.101344 | 1 | 120.418788 | 1 | 0.849657 | 1 | 34 | 17 | 14 | 0.1441 |
| H | 1.101153 | 1 | 119.744577 | 1 | -179.371636 | 1 | 35 | 34 | 17 | 0.1488 |
| H | 1.101242 | 1 | 120.092575 | 1 | 179.431549 | 1 | 36 | 35 | 34 | 0.1508 |
| H | 1.101611 | 1 | 119.987572 | 1 | 179.437024 | 1 | 37 | 36 | 35 | 0.1517 |
| H | 1.102283 | 1 | 120.261439 | 1 | -0.976396 | 1 | 38 | 17 | 14 | 0.1529 |
| C | 8.591585 | 1 | 41.276760 | 1 | -49.079416 | 1 | 1 | 2 | 3 | -0.1793 |
| C | 1.414654 | 1 | 63.663299 | 1 | -91.981580 | 1 | 67 | 1 | 2 | 0.1030 |
| C | 1.413914 | 1 | 118.353609 | 1 | -71.607070 | 1 | 68 | 67 | 1 | -0.1853 |
| C | 1.390152 | 1 | 120.455070 | 1 | -0.244676 | 1 | 69 | 68 | 67 | -0.0923 |
| C | 1.399977 | 1 | 120.963440 | 1 | 1.095015 | 1 | 70 | 69 | 68 | -0.0721 |
| C | 1.388793 | 1 | 120.305281 | 1 | -1.194741 | 1 | 67 | 68 | 69 | -0.0906 |
| C | 1.461522 | 1 | 120.444121 | 1 | 179.272438 | 1 | 71 | 70 | 69 | -0.0593 |
| C | 1.400401 | 1 | 120.312505 | 1 | 44.238087 | 1 | 73 | 71 | 70 | -0.0947 |
| C | 1.389830 | 1 | 120.958305 | 1 | 179.793971 | 1 | 74 | 73 | 71 | -0.1698 |
| C | 1.413523 | 1 | 120.234631 | 1 | 1.378167 | 1 | 75 | 74 | 73 | 0.0919 |
| C | 1.412588 | 1 | 118.683945 | 1 | -0.993315 | 1 | 76 | 75 | 74 | -0.1733 |
| C | 1.399177 | 1 | 120.761701 | 1 | -135.038392 | 1 | 73 | 71 | 70 | -0.1018 |

FIG. 33-(4)

| | | | | | | | | | | | |
|---|---|---|---|---|---|---|---|---|---|---|---|
| N | 1.409900 | 1 | 120.818283 | 1 | 179.544092 | 1 | 76 | 75 | 74 | -0.2266 |
| N | 1.406807 | 1 | 120.807106 | 1 | 179.902594 | 1 | 68 | 67 | 72 | -0.2293 |
| C | 1.411424 | 1 | 121.543849 | 1 | -28.575621 | 1 | 79 | 76 | 75 | 0.0839 |
| C | 1.420645 | 1 | 119.115588 | 1 | 145.375610 | 1 | 79 | 76 | 75 | 0.0581 |
| C | 1.411594 | 1 | 122.473033 | 1 | -27.287126 | 1 | 80 | 68 | 67 | 0.0870 |
| C | 1.426447 | 1 | 119.100625 | 1 | 162.371653 | 1 | 80 | 68 | 67 | 0.0487 |
| C | 1.411322 | 1 | 120.284342 | 1 | 123.742665 | 1 | 82 | 79 | 76 | -0.1416 |
| C | 1.392542 | 1 | 119.989301 | 1 | 178.477823 | 1 | 85 | 82 | 79 | -0.1278 |
| C | 1.393617 | 1 | 120.468906 | 1 | 0.845418 | 1 | 86 | 85 | 82 | -0.1337 |
| C | 1.393871 | 1 | 119.928960 | 1 | -0.750882 | 1 | 87 | 86 | 85 | -0.1182 |
| C | 1.411936 | 1 | 120.636417 | 1 | -57.656461 | 1 | 82 | 79 | 76 | -0.1367 |
| C | 1.412562 | 1 | 120.926849 | 1 | -38.491834 | 1 | 81 | 79 | 76 | -0.1711 |
| C | 1.391809 | 1 | 120.144678 | 1 | -179.366853 | 1 | 90 | 81 | 79 | -0.1121 |
| C | 1.393281 | 1 | 120.560667 | 1 | 0.768473 | 1 | 91 | 90 | 81 | -0.1527 |
| C | 1.393785 | 1 | 119.786749 | 1 | -0.287572 | 1 | 92 | 91 | 90 | -0.1036 |
| C | 1.414325 | 1 | 120.255340 | 1 | 142.659901 | 1 | 81 | 79 | 76 | -0.1608 |
| C | 1.410023 | 1 | 120.197513 | 1 | -90.477433 | 1 | 84 | 80 | 68 | -0.1180 |
| C | 1.393264 | 1 | 119.932370 | 1 | -179.457515 | 1 | 95 | 84 | 80 | -0.1235 |
| C | 1.393647 | 1 | 120.388672 | 1 | -0.181206 | 1 | 96 | 95 | 84 | -0.1215 |
| C | 1.393970 | 1 | 120.031944 | 1 | 0.157472 | 1 | 97 | 96 | 95 | -0.1293 |
| C | 1.411059 | 1 | 120.606410 | 1 | 89.926819 | 1 | 84 | 80 | 68 | -0.1363 |
| C | 1.412313 | 1 | 121.670026 | 1 | -34.340237 | 1 | 83 | 80 | 68 | -0.1785 |
| C | 1.392161 | 1 | 120.160176 | 1 | -178.877255 | 1 | 100 | 83 | 80 | -0.1179 |
| C | 1.392955 | 1 | 120.573411 | 1 | 1.092461 | 1 | 101 | 100 | 83 | -0.1543 |
| C | 1.394237 | 1 | 119.762169 | 1 | -0.775431 | 1 | 102 | 101 | 100 | -0.1038 |
| C | 1.415140 | 1 | 119.579643 | 1 | 147.490403 | 1 | 83 | 80 | 68 | -0.1539 |

FIG. 33-(5)

| | | | | | | | | | | |
|---|---|---|---|---|---|---|---|---|---|---|
| H | 1.101255 | 1 | 120.152609 | 1 | 178.622906 | 1 | 67 | 68 | 69 | 0.1485 |
| H | 1.101078 | 1 | 120.271853 | 1 | -179.798060 | 1 | 69 | 68 | 67 | 0.1424 |
| H | 1.100839 | 1 | 119.249956 | 1 | 179.666779 | 1 | 70 | 69 | 68 | 0.1337 |
| H | 1.101320 | 1 | 119.236952 | 1 | -179.871805 | 1 | 72 | 67 | 68 | 0.1375 |
| H | 1.101286 | 1 | 119.898189 | 1 | 2.147173 | 1 | 74 | 73 | 71 | 0.1406 |
| H | 1.101343 | 1 | 119.602223 | 1 | -178.622801 | 1 | 75 | 74 | 73 | 0.1502 |
| H | 1.100336 | 1 | 120.070772 | 1 | -179.807008 | 1 | 77 | 76 | 75 | 0.1383 |
| H | 1.100505 | 1 | 119.870220 | 1 | -0.252046 | 1 | 78 | 73 | 71 | 0.1304 |
| H | 1.100225 | 1 | 120.174569 | 1 | -0.957958 | 1 | 85 | 82 | 79 | 0.1394 |
| H | 1.099974 | 1 | 119.806786 | 1 | -179.294839 | 1 | 86 | 85 | 82 | 0.1320 |
| H | 1.100104 | 1 | 120.000822 | 1 | 179.555966 | 1 | 87 | 86 | 85 | 0.1378 |
| H | 1.100689 | 1 | 119.952943 | 1 | -179.358843 | 1 | 88 | 87 | 86 | 0.1410 |
| H | 1.101316 | 1 | 120.111685 | 1 | 0.986094 | 1 | 89 | 82 | 79 | 0.1488 |
| H | 1.100220 | 1 | 120.146718 | 1 | 1.192930 | 1 | 90 | 81 | 79 | 0.1373 |
| H | 1.100042 | 1 | 119.745758 | 1 | -179.342998 | 1 | 91 | 90 | 81 | 0.1307 |
| H | 1.099577 | 1 | 120.125306 | 1 | 179.624400 | 1 | 92 | 91 | 90 | 0.1361 |
| H | 1.100722 | 1 | 119.971997 | 1 | 179.618988 | 1 | 93 | 92 | 91 | 0.1385 |
| H | 1.101054 | 1 | 120.206824 | 1 | -0.934234 | 1 | 94 | 81 | 79 | 0.1468 |
| H | 1.101412 | 1 | 120.162619 | 1 | 0.277045 | 1 | 95 | 84 | 80 | 0.1504 |
| H | 1.100682 | 1 | 119.810396 | 1 | 179.737345 | 1 | 96 | 95 | 84 | 0.1429 |
| H | 1.100480 | 1 | 119.958363 | 1 | -179.904770 | 1 | 97 | 96 | 95 | 0.1395 |
| H | 1.100038 | 1 | 119.945808 | 1 | 179.994905 | 1 | 98 | 97 | 96 | 0.1337 |
| H | 1.100292 | 1 | 120.146280 | 1 | -0.394191 | 1 | 99 | 84 | 80 | 0.1306 |
| H | 1.100354 | 1 | 120.210717 | 1 | 1.577636 | 1 | 100 | 83 | 80 | 0.1372 |
| H | 1.100107 | 1 | 119.725354 | 1 | -179.678671 | 1 | 101 | 100 | 83 | 0.1302 |
| H | 1.099658 | 1 | 120.155144 | 1 | 178.914538 | 1 | 102 | 101 | 100 | 0.1364 |
| H | 1.100854 | 1 | 119.972030 | 1 | 179.617030 | 1 | 103 | 102 | 101 | 0.1399 |
| H | 1.101597 | 1 | 120.080370 | 1 | -1.753993 | 1 | 104 | 83 | 80 | 0.1471 |

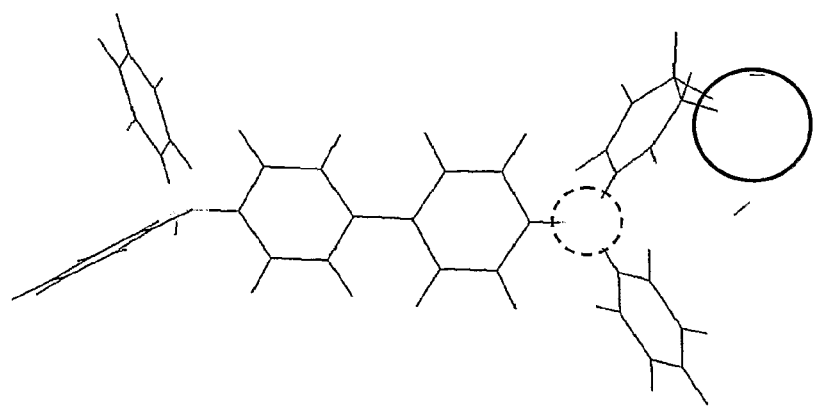
Structure 21
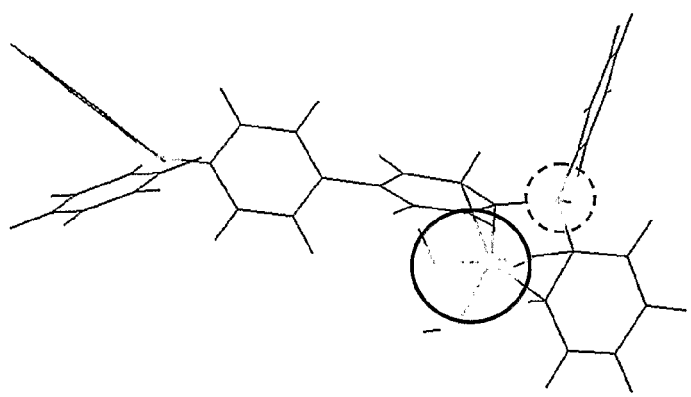
Structure 22
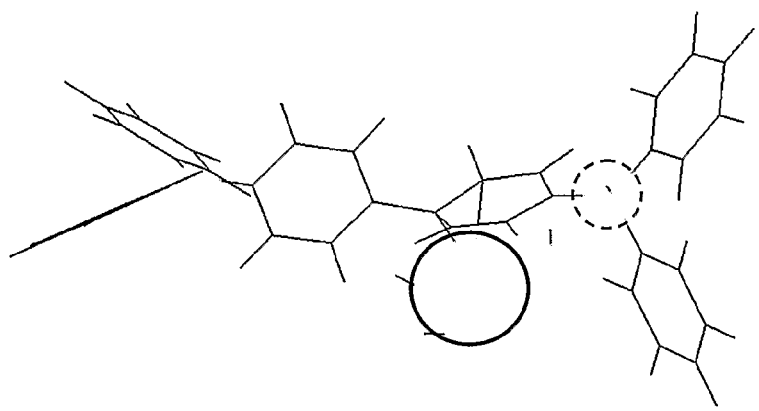
Structure 23
FIG. 34

FIG. 35-(1)

```
                SUMMARY OF AM1      CALCULATION

MOPAC2002
Version 1.00
          EMPIRICAL FORMULA: C36 H32 N2 O3 Mo

Mon Jan 17 09:37:06
2005
EF AM1
 NPB-MoO-line.mop

GEOMETRY OPTIMISED USING EIGENVECTOR FOLLOWING (EF).
      SCF FIELD WAS ACHIEVED

HEAT OF FORMATION      =      131.256215 KCAL =      549.17600
KJ
            ELECTRONIC ENERGY      =    -62017.528322 EV
            CORE-CORE REPULSION    =     55405.016816 EV
            DIPOLE                 =         50.51182 DEBYE      SYMMETRY:
C1
            NO. OF FILLED LEVELS   =        105
            IONIZATION POTENTIAL   =          4.985691 EV
            HOMO LUMO ENERGIES (EV) =        -4.986 -2.139
            MOLECULAR WEIGHT       =        636.600
            SCF CALCULATIONS       =        203
            COMPUTATION TIME = 9 MINUTES AND  4 SECONDS
```

FIG. 35-(2)

```
        FINAL GEOMETRY OBTAINED
EF AM1
NPB-MoO-line.mop

| | | | | | | | | |
|---|---|---|---|---|---|---|---|---|
| H | 1.101044 | 1 | 119.678706 | 1 | -177.428559 | 1 | 1 | 2 | 3 | 0.1480 |
| H | 1.104520 | 1 | 118.801479 | 1 | 178.791455 | 1 | 3 | 2 | 1 | 0.1781 |
| H | 1.101691 | 1 | 118.587327 | 1 | -178.558589 | 1 | 4 | 3 | 2 | 0.1210 |
| H | 1.101685 | 1 | 118.558622 | 1 | -179.064138 | 1 | 6 | 1 | 2 | 0.1155 |
| H | 1.102328 | 1 | 119.462426 | 1 | -1.143354 | 1 | 8 | 7 | 5 | 0.1623 |
| H | 1.102321 | 1 | 119.639669 | 1 | -179.742332 | 1 | 9 | 8 | 7 | 0.1429 |
| H | 1.101725 | 1 | 121.065983 | 1 | 179.826418 | 1 | 11 | 10 | 9 | 0.1345 |
| H | 1.102024 | 1 | 119.388569 | 1 | -0.906686 | 1 | 12 | 7 | 5 | 0.1591 |
| H | 1.033950 | 1 | 106.410478 | 1 | 152.212398 | 1 | 13 | 10 | 9 | 0.2425 |
| H | 1.101765 | 1 | 121.261199 | 1 | -1.330267 | 1 | 19 | 16 | 13 | 0.1484 |
| H | 1.101851 | 1 | 119.459971 | 1 | -179.790419 | 1 | 20 | 19 | 16 | 0.1585 |
| H | 1.101982 | 1 | 119.928473 | 1 | -179.769162 | 1 | 21 | 20 | 19 | 0.1589 |
| H | 1.102281 | 1 | 120.221900 | 1 | -179.704313 | 1 | 22 | 21 | 20 | 0.1630 |
| H | 1.104089 | 1 | 120.914125 | 1 | 0.367234 | 1 | 23 | 16 | 13 | 0.1720 |
| H | 1.102728 | 1 | 120.858514 | 1 | -0.018278 | 1 | 24 | 15 | 13 | 0.1593 |
| H | 1.102014 | 1 | 119.351745 | 1 | 179.975211 | 1 | 25 | 24 | 15 | 0.1601 |
| H | 1.102058 | 1 | 120.042728 | 1 | -179.767348 | 1 | 26 | 25 | 24 | 0.1597 |
| H | 1.102153 | 1 | 120.111654 | 1 | -179.604689 | 1 | 27 | 26 | 25 | 0.1614 |
| H | 1.102126 | 1 | 121.311629 | 1 | -0.847255 | 1 | 28 | 15 | 13 | 0.1537 |
| H | 1.105216 | 1 | 120.557035 | 1 | 2.851166 | 1 | 29 | 18 | 14 | 0.1100 |
| H | 1.107786 | 1 | 116.611316 | 1 | -152.540178 | 1 | 30 | 29 | 18 | 0.1167 |
| H | 1.109901 | 1 | 117.203834 | 1 | -146.653021 | 1 | 31 | 30 | 29 | 0.1057 |
| H | 1.103509 | 1 | 117.146324 | 1 | -172.653429 | 1 | 32 | 31 | 30 | 0.0967 |
| H | 1.098416 | 1 | 118.410586 | 1 | -1.474013 | 1 | 33 | 18 | 14 | 0.1019 |
| H | 1.100525 | 1 | 120.235389 | 1 | -1.216902 | 1 | 34 | 17 | 14 | 0.1355 |
| H | 1.099940 | 1 | 119.401737 | 1 | -179.671406 | 1 | 35 | 34 | 17 | 0.1260 |
| H | 1.099093 | 1 | 120.199897 | 1 | -179.330842 | 1 | 36 | 35 | 34 | 0.1295 |
| H | 1.100746 | 1 | 120.036734 | 1 | -178.912793 | 1 | 37 | 36 | 35 | 0.1387 |
| H | 1.103857 | 1 | 119.711246 | 1 | 1.529880 | 1 | 38 | 17 | 14 | 0.1626 |
| Mo | 7.204594 | 1 | 25.412255 | 1 | -175.565656 | 1 | 1 | 2 | 3 | 0.9821 |
| O | 1.900378 | 1 | 104.551942 | 1 | -93.796208 | 1 | 68 | 1 | 2 | -0.5462 |
| O | 1.875135 | 1 | 104.113139 | 1 | 78.505451 | 1 | 68 | 69 | 1 | -0.5653 |
| O | 1.891972 | 1 | 117.455413 | 1 | 112.120374 | 1 | 68 | 69 | 70 | -0.5302 |
| H | 0.965442 | 1 | 109.585673 | 1 | -93.131456 | 1 | 69 | 68 | 70 | 0.1791 |
| H | 0.964916 | 1 | 113.467937 | 1 | -100.138979 | 1 | 70 | 68 | 69 | 0.2046 |
| H | 0.970749 | 1 | 109.802940 | 1 | 175.660968 | 1 | 71 | 68 | 69 | 0.1605 |

SUMMARY OF AM1 CALCULATION

MOPAC2002
Version 1.00

EMPIRICAL FORMULA: C36 H32 N2 O3 Mo

Mon Jan 17 08:51:18 2005
EF AM1
NPB-MoO-pp1.mop

GEOMETRY OPTIMISED USING EIGENVECTOR FOLLOWING (EF).
SCF FIELD WAS ACHIEVED

```
        HEAT OF FORMATION     =       60.496168 KCAL =      253.11597 KJ
        ELECTRONIC ENERGY     =    -65049.306713 EV
        CORE-CORE REPULSION   =     58433.726760 EV
        DIPOLE                =           6.76689 DEBYE     SYMMETRY: C1
        NO. OF FILLED LEVELS  =         105
        IONIZATION POTENTIAL  =           7.552077 EV
        HOMO LUMO ENERGIES (EV) =        -7.552  -0.655
        MOLECULAR WEIGHT      =         636.600
        SCF CALCULATIONS      =         154
        COMPUTATION TIME      =   2 MINUTES AND 4 SECONDS
```

FIG. 36-(2)

```
        FINAL GEOMETRY OBTAINED
EF AM1
NPB-MoO-pp1.mop

| | | | | | | | | | | |
|---|---|---|---|---|---|---|---|---|---|---|
| H | 1.101457 | 1 | 120.056937 | 1 | -179.889761 | 1 | 1 | 2 | 3 | 0.1466 |
| H | 1.101352 | 1 | 120.109135 | 1 | 179.956370 | 1 | 3 | 2 | 1 | 0.1453 |
| H | 1.101101 | 1 | 119.285872 | 1 | -179.785895 | 1 | 4 | 3 | 2 | 0.1340 |
| H | 1.101381 | 1 | 119.324626 | 1 | -179.395975 | 1 | 6 | 1 | 2 | 0.1390 |
| H | 1.103474 | 1 | 120.743639 | 1 | 2.879038 | 1 | 8 | 7 | 5 | 0.1347 |
| H | 1.118752 | 1 | 113.533258 | 1 | -146.255368 | 1 | 9 | 8 | 7 | 0.1431 |
| H | 1.102720 | 1 | 118.535654 | 1 | -175.435620 | 1 | 11 | 10 | 9 | 0.1244 |
| H | 1.101421 | 1 | 117.534937 | 1 | -0.490683 | 1 | 12 | 7 | 5 | 0.1373 |
| H | 1.029021 | 1 | 109.136736 | 1 | 155.850982 | 1 | 13 | 10 | 9 | 0.2061 |
| H | 1.100360 | 1 | 119.263889 | 1 | -17.759837 | 1 | 19 | 16 | 13 | 0.1249 |
| H | 1.099960 | 1 | 120.738571 | 1 | 176.382431 | 1 | 20 | 19 | 16 | 0.1266 |
| H | 1.099609 | 1 | 117.832965 | 1 | 177.092523 | 1 | 21 | 20 | 19 | 0.1275 |
| H | 1.103007 | 1 | 121.336720 | 1 | -175.466532 | 1 | 22 | 21 | 20 | 0.1386 |
| H | 1.111282 | 1 | 121.249923 | 1 | -22.186050 | 1 | 23 | 16 | 13 | 0.1270 |
| H | 1.107278 | 1 | 121.347797 | 1 | -2.586767 | 1 | 24 | 15 | 13 | 0.1880 |
| H | 1.101343 | 1 | 119.147446 | 1 | 179.903306 | 1 | 25 | 24 | 15 | 0.1489 |
| H | 1.100615 | 1 | 120.167743 | 1 | -179.938438 | 1 | 26 | 25 | 24 | 0.1442 |
| H | 1.100829 | 1 | 120.104254 | 1 | 179.921859 | 1 | 27 | 26 | 25 | 0.1454 |
| H | 1.101776 | 1 | 120.938851 | 1 | 0.742664 | 1 | 28 | 15 | 13 | 0.1428 |
| H | 1.101118 | 1 | 120.102099 | 1 | 0.098886 | 1 | 29 | 18 | 14 | 0.1448 |
| H | 1.100519 | 1 | 119.320521 | 1 | 179.896004 | 1 | 30 | 29 | 18 | 0.1326 |
| H | 1.099045 | 1 | 120.256717 | 1 | -179.861474 | 1 | 31 | 30 | 29 | 0.1330 |
| H | 1.100623 | 1 | 119.942048 | 1 | 179.851655 | 1 | 32 | 31 | 30 | 0.1333 |
| H | 1.101303 | 1 | 120.077935 | 1 | -0.358142 | 1 | 33 | 18 | 14 | 0.1466 |
| H | 1.101143 | 1 | 120.105254 | 1 | 0.084702 | 1 | 34 | 17 | 14 | 0.1446 |
| H | 1.100503 | 1 | 119.324007 | 1 | 179.936356 | 1 | 35 | 34 | 17 | 0.1323 |
| H | 1.098984 | 1 | 120.265225 | 1 | -179.892472 | 1 | 36 | 35 | 34 | 0.1330 |
| H | 1.100578 | 1 | 119.940173 | 1 | 179.880476 | 1 | 37 | 36 | 35 | 0.1331 |
| H | 1.101211 | 1 | 120.080044 | 1 | -0.380953 | 1 | 38 | 17 | 14 | 0.1457 |
| Mo | 7.113213 | 1 | 114.291414 | 1 | -18.566505 | 1 | 1 | 2 | 3 | 1.3397 |
| O | 1.945207 | 1 | 72.259446 | 1 | -60.274665 | 1 | 68 | 1 | 2 | -0.6550 |
| O | 1.856832 | 1 | 80.390132 | 1 | -165.243766 | 1 | 68 | 69 | 1 | -0.5058 |
| O | 1.855908 | 1 | 75.449125 | 1 | -118.534252 | 1 | 68 | 69 | 70 | -0.4894 |
| H | 0.957947 | 1 | 114.664851 | 1 | -93.480242 | 1 | 69 | 68 | 70 | 0.2008 |
| H | 0.976388 | 1 | 111.822775 | 1 | -13.893543 | 1 | 70 | 68 | 69 | 0.2447 |
| H | 0.977936 | 1 | 114.104546 | 1 | -7.957478 | 1 | 71 | 68 | 69 | 0.2429 |

FIG. 37-(1)

SUMMARY OF AM1 CALCULATION

MOPAC2002
Version 1.00

EMPIRICAL FORMULA: C36 H32 N2 O3 Mo

Mon Jan 17 08:48:25 2005
EF AM1
NPB-MoO-pp2.mop

GEOMETRY OPTIMISED USING EIGENVECTOR FOLLOWING (EF).
SCF FIELD WAS ACHIEVED

```
        HEAT OF FORMATION     =      94.563042 KCAL =    395.65177 KJ
        ELECTRONIC ENERGY     =   -64989.040579 EV
        CORE-CORE REPULSION   =    58374.937906 EV
        DIPOLE                =         13.39708 DEBYE    SYMMETRY: C1
        NO. OF FILLED LEVELS  =        105
        IONIZATION POTENTIAL  =          6.663149 EV
        HOMO LUMO ENERGIES (EV) =       -6.663 -1.058
        MOLECULAR WEIGHT      =        636.600
        SCF CALCULATIONS      =        149
        COMPUTATION TIME      =  1 MINUTE AND 58 SECONDS
```

FIG. 37-(2)

```
         FINAL GEOMETRY OBTAINED
EF AM1
NPB-MoO-pp2.mop

| | | | | | | | | | | | |
|---|---|---|---|---|---|---|---|---|---|---|---|
| H | 1.101398 | 1 | 120.032302 | 1 | 179.243458 | 1 | 1 | 2 | 3 | 0.1395 |
| H | 1.101242 | 1 | 119.974797 | 1 | -179.724757 | 1 | 3 | 2 | 1 | 0.1388 |
| H | 1.100611 | 1 | 118.426839 | 1 | -178.354980 | 1 | 4 | 3 | 2 | 0.1334 |
| H | 1.101678 | 1 | 118.629733 | 1 | 179.183531 | 1 | 6 | 1 | 2 | 0.1274 |
| H | 1.107145 | 1 | 119.119796 | 1 | 5.953110 | 1 | 8 | 7 | 5 | 0.1289 |
| H | 1.105975 | 1 | 117.030868 | 1 | -179.502341 | 1 | 9 | 8 | 7 | 0.1219 |
| H | 1.098488 | 1 | 119.184397 | 1 | -172.671779 | 1 | 11 | 10 | 9 | 0.1150 |
| H | 1.103965 | 1 | 117.227401 | 1 | 19.426396 | 1 | 12 | 7 | 5 | 0.1236 |
| H | 1.033304 | 1 | 105.632337 | 1 | 139.469980 | 1 | 13 | 10 | 9 | 0.2347 |
| H | 1.100937 | 1 | 121.228373 | 1 | -1.292720 | 1 | 19 | 16 | 13 | 0.1355 |
| H | 1.100576 | 1 | 119.533995 | 1 | -179.757211 | 1 | 20 | 19 | 16 | 0.1444 |
| H | 1.100944 | 1 | 119.840062 | 1 | -179.385317 | 1 | 21 | 20 | 19 | 0.1461 |
| H | 1.102346 | 1 | 120.527438 | 1 | -179.317098 | 1 | 22 | 21 | 20 | 0.1646 |
| H | 1.109057 | 1 | 121.420885 | 1 | 0.950498 | 1 | 23 | 16 | 13 | 0.2110 |
| H | 1.104258 | 1 | 120.588090 | 1 | 0.864104 | 1 | 24 | 15 | 13 | 0.1720 |
| H | 1.101478 | 1 | 119.285737 | 1 | -179.961272 | 1 | 25 | 24 | 15 | 0.1541 |
| H | 1.101104 | 1 | 120.058965 | 1 | -179.967744 | 1 | 26 | 25 | 24 | 0.1492 |
| H | 1.101200 | 1 | 120.108132 | 1 | -179.585062 | 1 | 27 | 26 | 25 | 0.1506 |
| H | 1.101891 | 1 | 121.166541 | 1 | -1.251250 | 1 | 28 | 15 | 13 | 0.1486 |
| H | 1.101018 | 1 | 120.041565 | 1 | -1.518832 | 1 | 29 | 18 | 14 | 0.1436 |
| H | 1.100411 | 1 | 119.307218 | 1 | 179.965709 | 1 | 30 | 29 | 18 | 0.1296 |
| H | 1.098780 | 1 | 120.277449 | 1 | -179.898278 | 1 | 31 | 30 | 29 | 0.1302 |
| H | 1.100543 | 1 | 119.948927 | 1 | 179.908653 | 1 | 32 | 31 | 30 | 0.1311 |
| H | 1.101219 | 1 | 120.036815 | 1 | 1.359301 | 1 | 33 | 18 | 14 | 0.1456 |
| H | 1.101187 | 1 | 119.939357 | 1 | -1.446152 | 1 | 34 | 17 | 14 | 0.1463 |
| H | 1.100418 | 1 | 119.326064 | 1 | -179.925246 | 1 | 35 | 34 | 17 | 0.1298 |
| H | 1.098702 | 1 | 120.275228 | 1 | -179.832300 | 1 | 36 | 35 | 34 | 0.1300 |
| H | 1.100457 | 1 | 119.942852 | 1 | 179.660296 | 1 | 37 | 36 | 35 | 0.1300 |
| H | 1.101187 | 1 | 120.147192 | 1 | 1.255469 | 1 | 38 | 17 | 14 | 0.1441 |
| Mo | 4.841538 | 1 | 107.672478 | 1 | -26.753182 | 1 | 1 | 2 | 3 | 1.0222 |
| O | 1.898197 | 1 | 161.755412 | 1 | 16.510520 | 1 | 68 | 1 | 2 | -0.5432 |
| O | 1.872562 | 1 | 115.895263 | 1 | -163.326831 | 1 | 68 | 69 | 1 | -0.5044 |
| O | 1.858932 | 1 | 101.689589 | 1 | -108.921022 | 1 | 68 | 69 | 70 | -0.5341 |
| H | 0.970986 | 1 | 109.152164 | 1 | 170.093058 | 1 | 69 | 68 | 70 | 0.1697 |
| H | 0.973256 | 1 | 110.485548 | 1 | 172.590140 | 1 | 70 | 68 | 69 | 0.1770 |
| H | 0.965645 | 1 | 114.945227 | 1 | -132.262906 | 1 | 71 | 68 | 69 | 0.2165 |

US 8,426,034 B2

LIGHT-EMITTING ELEMENT, LIGHT-EMITTING DEVICE, AND ELECTRONIC APPLIANCE

TECHNICAL FIELD

The present invention relates to a light-emitting element having a structure in which a plurality of layers are sandwiched between a pair of electrodes, a light-emitting device equipped with the light-emitting element, and an electronic appliance in which the light-emitting element is mounted. More specifically, the present invention relates to a light-emitting element which is driven at low voltage and which has long element lifetime and high production yield, a light-emitting device equipped with the light-emitting element, and an electronic appliance in which the light-emitting element is mounted.

BACKGROUND ART

A light-emitting device using luminescence from an electrolight-emitting element (light-emitting element) is attracting attention as a device for display or illumination. As a light-emitting element used in a light-emitting device, a light-emitting element having a structure in which a layer containing a light-emitting compound is sandwiched between a pair of electrodes is well known. In such a light-emitting element, one electrode serves as an anode while the other serves as a cathode. Then, a hole injected from the anode and an electron injected from the cathode are recombined to form an excited molecule, and light is emitted when the excited molecule returns to a ground state.

In a display device to be incorporated in various kinds of information processing appliances which have developed rapidly in recent years, reduction of power consumption is particularly required, and it has been attempted to decrease the drive voltage of a light-emitting element in order to achieve the low power consumption. Further, in view of commercialization, not only the decrease in the drive voltage but also the extension of lifetime of a light-emitting element is significant. Therefore, development of a light-emitting element to achieve the extension of lifetime has been advanced.

For example, in Patent Document 1 (Japanese Patent Application Laid-Open No. H9-63771), the decrease in drive voltage of a light-emitting element has been achieved by forming an anode with metal oxide having high work function such as molybdenum oxide. Moreover, an advantageous effect of long lifetime is also obtained.

However, in order to extend the lifetime, a means shown in Patent Document 1 is not enough and technical development to achieve the longer lifetime has been required. Moreover, since a light-emitting element is usually formed with a thin film of about sub-micrometer thick, such a light-emitting element has a problem in that an upper electrode and a lower electrode are easily shorted. In particular, low yield due to dust generated in a manufacturing process of a light-emitting element is a problem.

DISCLOSURE OF INVENTION

The present invention has been made as the result of concerted study directed towards eliminating the above problems. Therefore, it is an object of the present invention to provide a light-emitting element which is driven at low voltage and has long lifetime. Moreover, it is an object of the present invention to provide a light-emitting element having high production yield, a light-emitting device equipped with the light-emitting element, and an electronic appliance in which the light-emitting element is mounted.

The present invention is to provide a light-emitting element, a light-emitting device, and an electronic appliance, as described above. The light-emitting element has a layer including a cluster, wherein the cluster is formed in such a way that two molecules of arylamine compounds in each of which two arylamines each having one phenyl group and two aryl groups bonded with a nitrogen atom form a bisphenyl bond through the respective phenyl groups are arranged in parallel to form a dimolecular body and the dimolecular body is coordinated to metal oxide. It is preferable that the layer including a cluster be disposed adjacent to an electrode in a light-emitting element. Moreover, the light-emitting device of the present invention is equipped with the light-emitting element, and the electronic appliance of the present invention has the light-emitting element mounted in its display portion.

A light-emitting element of the present invention has a layer including a cluster in which two molecules of arylamine compounds in each of which two arylamines each having one phenyl group and two aryl groups bonded with a nitrogen atom form a bisphenyl bond through the respective phenyl groups are coordinated in parallel to form a dimolecular body and the dimolecular body is adjacent to metal oxide. This makes it possible to decrease the drive voltage. Moreover, a light-emitting element with long lifetime can also be obtained. Further, since the increase in the drive voltage of the layer including a cluster can be suppressed even when the film thickness is large, it is possible to suppress the shorting between an upper electrode and a lower electrode by increasing the thickness of the layer including a cluster. For this reason, the decrease in the yield due to dust generated in the manufacturing process can be suppressed.

BRIEF DESCRIPTION OF DRAWINGS

In the accompanying drawings:

FIGS. 19-(1) to (3) show a calculation result of an electron state of a TPD monomolecule;

FIGS. 21-(1) to (3) show a calculation result of an electron state of a TPD monomolecule;

FIGS. 23-(1) to (3) show a calculation result of an electron state of a TPD monomolecule;

FIGS. 25-(1) to (3) show a calculation result of an electron state of a TPD monomolecule;

FIGS. 27-(1) to (3) show a calculation result of an electron state of a TPD monomolecule;

FIG. 28 shows an optimal structure of a TPD dimolecular body;

FIGS. 29-(1) to (5) show a calculation result of an electron state of a TPD dimolecular body;

FIGS. 30-(1) to (5) show a calculation result of an electron state of a TPD dimolecular body;

FIGS. 31-(1) to (5) show a calculation result of an electron state of a TPD dimolecular body;

FIGS. 32-(1) to (3) show a calculation result of an electron state of a cation radical of a TPD monomolecule;

FIGS. 33-(1) to (5) show a calculation result of an electron state of a cation radical of a TPD dimolecular body;

FIG. 34 shows an optimal structure of TPD and molybdenum oxide;

FIGS. 35-(1) to (3) show a calculation result of an electron state of TPD and molybdenum oxide;

FIGS. 36-(1) to (3) show a calculation result of an electron state of TPD and molybdenum oxide;

FIGS. 37-(1) to (3) show a calculation result of an electron state of TPD and molybdenum oxide;

BEST MODE FOR CARRYING OUT THE INVENTION

Embodiment Modes will be described with reference to the drawings. However, the present invention is not limited to the description of Embodiment Modes and is specified by the scope of claims. It is easily understood by those skilled in the art that the mode and detail of the present invention can be variously changed without departing from the spirit and scope of the present invention. Therefore, the present invention will not be construed as being limited to the description of Embodiment Modes hereinafter shown.

In a pair of electrodes in a light-emitting element of the present invention, one electrode from which luminescence is obtained when voltage is applied so that the one electrode has higher electric potential than the other serves as an anode, while the other serves as a cathode.

Embodiment Mode 1

Here, a scheme of a mode of a light-emitting element will be described based on a first mode with reference to FIGS. 1A to 1C and FIG. 2. The first mode is a case of having a layer including a cluster adjacent to only one of two electrodes in a light-emitting element. A light-emitting element of the present invention has a plurality of layers between a pair of electrodes. The plurality of layers are stacked by combining layers formed with a substance having a high carrier-injecting property and a substance having a high carrier-transporting property so that a light-emitting region is formed apart from the electrodes, or, so that carriers are recombined in a portion apart from the electrodes.

Figure 1A:
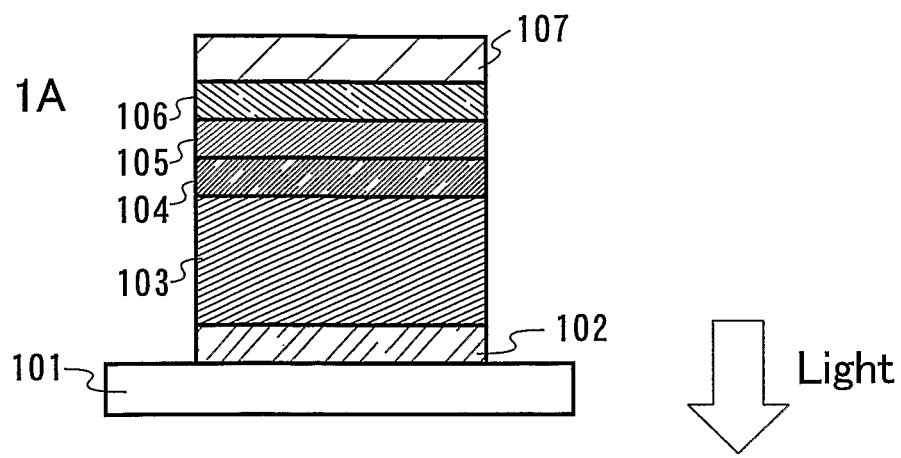
FIGS. 1A to 1C show a light-emitting element of the present invention.

A mode of a light-emitting element of the present invention is described with reference to FIG. 1A. In this mode, the light-emitting element is provided over a substrate 101 for supporting the light-emitting element, and includes a first electrode 102. Over the first electrode 102, a first layer 103, a second layer 104, a third layer 105, a fourth layer 106, and a second electrode 107 are stacked in order. In this mode, the first electrode 102 serves as an anode and the second electrode 107 serves as a cathode.

The substrate 101 can be formed with, for example, glass, plastic, or the like. Alternatively, the substrate 101 may be formed with any other material as long as the material can serve as a supporter in a manufacturing process of the light-emitting element. The first electrode 102 is preferably formed with metal, alloy, an electrically conductive compound, a mixture of these, or the like, each having a high work function (work function of 4.0 eV or more).

Specifically, indium tin oxide (ITO), indium tin oxide containing silicon, indium zinc oxide (IZO) in which 2 to 20% of zinc oxide (ZnO) is added in indium oxide, gold (Au), platinum (Pt), nickel (Ni), tungsten (W), chromium (Cr), molybdenum (Mo), iron (Fe), cobalt (Co), copper (Cu), palladium (Pd), metal nitride (such as TiN), or the like can be used. In the light-emitting element of the present invention, the first electrode 102 is not limited to the material having a high work function, and a material having a low work function such as aluminum (Al) or silver (Ag) can also be used.

The first layer 103 is a layer including a cluster in which arylamine compounds having a biphenyl skeleton form a dimolecular body by being arranged in parallel and metal oxide is adjacent to the dimolecular body. As a specific example of the metal oxide included in the first layer 103, molybdenum oxide ($MoO_x$), vanadium oxide ($VO_x$), ruthenium oxide ($RuO_x$), tungsten oxide ($WO_x$), or the like is given. Moreover, indium tin oxide (ITO) or zinc oxide (ZnO) can be used. Not only the above mentioned substances, but also other substances may be used.

As an organic material having an arylamine skeleton, for example, the following aromatic amine compound (that is, having a bond of nitrogen and a benzene ring) can be used: 4,4'-bis[N-(1-naphtyl)-N-phenylamino]biphenyl (abbreviation: α-NPD), 4,4'-bis[N-(3-methylphenyl)-N-phenylamino]biphenyl (abbreviation: TPD), 4,4'-bis[N-(4-biphenylyl)-N-phenylamino]biphenyl (abbreviation: BBPB), or the like.

The substance mentioned here mainly has a hole mobility of $10^{-6}$ $cm^2/Vs$ or more. However, any other substance may be used as long as the substance has the higher hole-transporting property than the electron-transporting property. The first layer 103 may have either a single-layer structure or a multilayer structure including layers which contain, for example, a semiconductor and a compound having a high hole-transporting property with different mixture ratio.

The second layer 104 is a layer including an aromatic amine compound (that is, having a bond of nitrogen and a benzene ring) having a high hole-transporting property, such as α-NPD, TPD, 4,4',4''-tris(N,N-diphenylamino)triphenylamine (abbreviation: TDATA), or 4,4',4''-tris[N-(3-methylphenyl)-N-phenylamino]triphenylamine (abbreviation: MTDATA). The substance mentioned here mainly has a hole mobility of $10^{-6}$ $cm^2/Vs$ or more. However, any other substance may be used as long as the substance has the higher hole-transporting property than the electron-transporting property. The second layer 104 may have either a single-layer structure or a multilayer structure in which two or more layers including the above substances are stacked.

The third layer 105 is a layer containing a substance with a high light-emitting property. For example, the third layer 105 is formed by freely combining a substance having a high light-emitting property such as N,N'-dimethylquinacridone (abbreviation: DMQd) or 2H-chromen-2-one (abbreviation: coumarin) and a substance having a high carrier-transporting property and a favorable film quality (which means, difficult to be crystallized) such as tris(8-quinolinolato)aluminum (abbreviation: $Alq_3$) or 9,10-di(2-naphthyl)anthracene (abbreviation: DNA). However, since the $Alq_3$ and the DNA have high light-emitting properties, the third layer 105 may be formed with one of these substances alone.

The fourth layer 106 is a layer formed with a substance having a high electron-transporting property, for example, a metal complex having a quinoline skeleton or a benzoquinoline skeleton, such as tris(8-quinolinolato)aluminum (abbreviation: $Alq_3$), tris(5-methyl-8-quinolinolato)aluminum (abbreviation: $Almq_3$), bis(10-hydroxybenzo[h]-quinolinato) beryllium (abbreviation: $BeBq_2$), or bis(2-methyl-8-quinolinolato)-4-phenylphenolato-aluminum (abbreviation: BAlq) or the like.

In addition to the above metal complex, another metal complex having an oxazole ligand or a thiazole ligand, such as bis[2-(2-hydroxyphenyl)-benzoxazolato]zinc (abbreviation: $Zn(BOX)_2$) or bis[2-(2-hydroxyphenyl)-benzothiazolato]zinc (abbreviation: $Zn(BTZ)_2$) or the like can also be used.

In addition to the metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (BCP), or the like can be used.

The substance mentioned here mainly has an electron mobility of $10^{-6}$ $cm^2/Vs$ or more. However, any other substance may be used as long as the substance has the higher electron-transporting property than the hole-transporting property. The fourth layer 106 may have either a single-layer structure or a multilayer structure in which two or more layers including the above substances are stacked.

The second electrode 107 (cathode) can be formed with metal, alloy, an electrically conductive compound, a mixture of these, or the like, each having a low work function (work function of 3.8 eV or less). As a specific example of such a cathode material, an element belonging to Group 1 or Group 2 in the periodic table, which is alkali metal such as lithium (Li) or cesium (Cs), alkali-earth metal such as magnesium (Mg), calcium (Ca), or strontium (Sr), or alloy containing these such as Mg:Ag or AL:Li is given.

However, by stacking the second electrode 107 and a layer having a function to promote electron injection between the second electrode 107 and the light-emitting layer, various conductive materials such as Al, Ag, ITO, and ITO containing silicon can be used as the second electrode 107 regardless of their work functions. As the layer having a function to promote electron injection, a compound of alkali metal or alkali-earth metal can be used, such as lithium fluoride (LiF), cesium fluoride (CsF), or calcium fluoride ($CaF_2$).

In addition to that, a layer formed with an electron-transporting substance which contains alkali metal or alkali-earth metal, for example, $Alq_3$ containing magnesium (Mg) or the like can be used. Moreover, other methods than an evaporation method may be used to form the first layer 103, the second layer 104, the third layer 105, and the fourth layer 106. For example, an ink jet method, a spin coating method, or the like may be used. Further, a different film-forming method may be employed for each electrode or each layer.

The light-emitting element of the present invention having the above structure emits light by flowing current due to an electric potential difference generated between the first electrode 102 and the second electrode 107 and recombining a hole and an electron in the third layer 105 which is a layer containing a substance having a high light-emitting property. That is to say, the light-emitting element has a structure in which a light-emitting region is formed in the third layer 105. However, the entire third layer 105 does not need to serve as the light-emitting region. For example, the light-emitting region may be formed in a part of the third layer 105 on the second layer 104 side or the fourth layer 106 side.

The emitted light is extracted to the outside through one or both of the first electrode 102 and the second electrode 107.

Therefore, the one or both of the first electrode 102 and the second electrode 107 is/are formed with a light-transmitting substance. If only the first electrode 102 is formed with a light-transmitting substance, the emitted light is extracted from the substrate side through the first electrode 102 as shown in FIG. 1A.

Figure 1B:
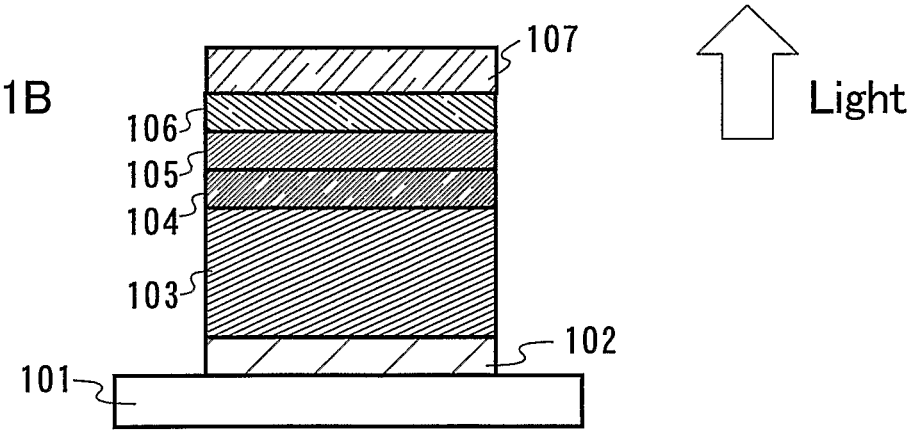
Figure 1C:
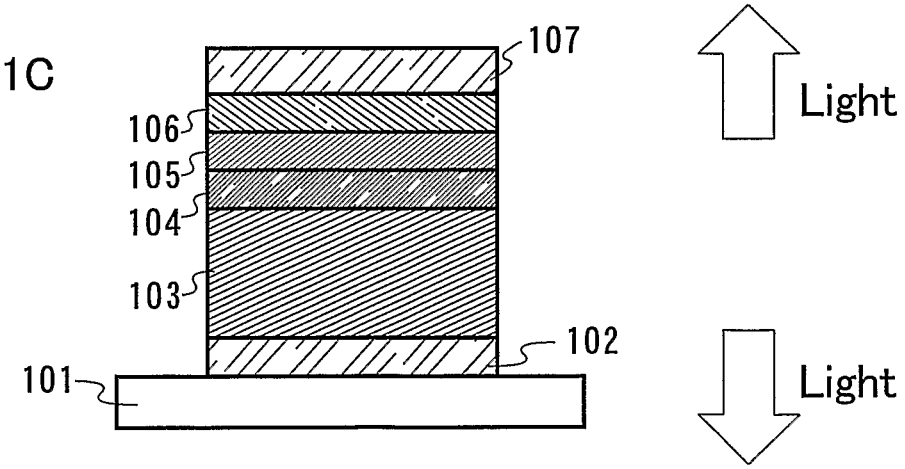

If only the second electrode 107 is formed with a light-transmitting substance, the emitted light is extracted from a side opposite to the substrate side through the second electrode 107 as shown in FIG. 1B. Meanwhile, in the case that both of the first electrode 102 and the second electrode 107 are formed with light-transmitting substances, the emitted light is extracted from both of the substrate side and the side opposite to the substrate side through the first electrode 102 and the second electrode 107 as shown in FIG. 1C.

The structure of the layer provided between the first electrode 102 and the second electrode 107 is not limited to the above one. Any other structure may be employed as long as a layer including a cluster of the present invention is provided and a region where a hole and an electron are recombined is provided in a portion apart from the first electrode 102 and the second electrode 107 so that light quenching due to approximation between a light-emitting region and metal is suppressed.

In other words, the multilayer structure of the layer is not limited in particular. A layer including a substance having a high electron-transporting property, a substance having a high hole-transporting property, a substance having a high electron-injecting property, a substance having a high hole-injecting property, a substance having a bipolar property (a substance having a high hole-transporting property and a high electron-transporting property), or the like may be freely combined with a layer including a cluster of the present invention. Moreover, by providing an extremely thin layer including silicon oxide or the like, a portion where the carriers are recombined may be controlled. For example, a structure shown in FIG. 2 may be used. However, the layer structure is not limited to these.

Figure 2:
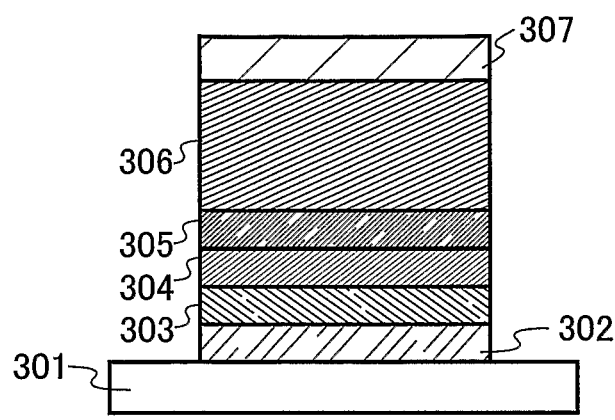
FIG. 2 shows a light-emitting element of the present invention.

A light-emitting element shown in FIG. 2 has a structure in which a first layer 303 including a substance having a high electron-transporting property, a second layer 304 including a substance having a high light-emitting property, a third layer 305 including a substance having a high hole-transporting property, a fourth layer 306 including a cluster in which two molecules of arylamine compounds each having a biphenyl skeleton are coordinated in parallel to form a dimolecular body and in which the dimolecular body is adjacent to metal oxide, and a second electrode 307 serving as an anode are stacked in order over a first electrode 302 serving as a cathode. A reference numeral 301 denotes a substrate.

In this embodiment mode, the light-emitting element is manufactured over a substrate including glass, plastic, or the like. By forming a plurality of such light-emitting elements over one substrate, a passive light-emitting device can be manufactured. Further, beside the substrate including glass, plastic, or the like, the light-emitting element may be manufactured over, for example, a thin film transistor (TFT) array substrate.

Thus, an active matrix light-emitting device which controls the driving of a light-emitting element by a TFT can be manufactured. A structure of the TFT is not particularly limited. Either a staggered TFT or an inverted staggered TFT may be employed. As for a driver circuit formed over a TFT array substrate, both of N-type and P-type TFTs may be employed, and moreover, only one of N-type TFTs or P-type TFTs may be employed.

A light-emitting element of the present invention has a layer including a cluster formed in such a way that two molecules of arylamine compounds each having a biphenyl skeleton are coordinated in parallel to form a dimolecular body and the dimolecular body is adjacent to metal oxide. This makes it possible to improve the carrier-injecting property and the carrier-transporting property and to decrease the drive voltage. That is to say, since the layer including a cluster has high carrier density, ohmic contact with an electrode is possible and contact resistance to the electrode is low. Thus, the drive voltage can be decreased.

Moreover, even though the layer including a cluster gets thicker, the increase in drive voltage can be suppressed. As a result, the shorting between an upper electrode and a lower electrode can be suppressed by increasing the thickness of the layer including a cluster. Accordingly, a defect due to dust generated in the manufacturing process can be suppressed and the yield can be increased. Moreover, the shorting due to impact or the like can be prevented by increasing the thickness of the layer including a cluster; therefore, a light-emitting element having high reliability can be obtained. For example, the layer including a light-emitting substance (corresponding to the first layer 303, the second layer 304, and the third layer 305) usually has a thickness of 100 to 150 nm, while the layer including a cluster can have a thickness from 50 to 1,000 nm, preferably 100 to 500 nm.

Since the layer including a cluster used in the light-emitting element of the present invention has high carrier density, the layer including a cluster can have ohmic contact with the electrode. That is, the contact resistance to the electrode is low. Therefore, the electrode material can be selected without considering the work function and the like. In other words, there are many choices for the electrode materials.

Moreover, since the layer including a cluster according to the present invention can be formed by vacuum evaporation, in the case of forming the layer including a light-emitting substance also by vacuum evaporation, both layers can be formed in the same vacuum apparatus, and it is not necessary to break the vacuum state. Thus, the dust can be prevented from sticking through the manufacturing process, thereby improving the yield. Since the layer including a cluster of the present invention contains an organic material and metal oxide, a difference of the stress generated between the electrode and the layer containing a light-emitting substance can be relaxed.

Embodiment Mode 2

Embodiment Mode 2 will describe more specifically a mode of the cluster and the layer including the cluster, which are shown in Embodiment Mode 1. A layer including a cluster used in a light-emitting element of the present invention includes a cluster in which two molecules of arylamine compounds each having a biphenyl skeleton are coordinated in parallel to form a dimolecular body and the dimolecular body is adjacent to metal oxide. In this embodiment mode, a cluster containing α-NPD and molybdenum oxide, and a cluster containing TPD and molybdenum oxide are described.

After a glass substrate with a size of 5 inch and a thickness of 0.7 mm was washed with water and dried sufficiently, the substrate was set in an evaporation apparatus. Then, a vacuum chamber in the apparatus was evacuated until the pressure in the vacuum chamber became $1 \times 10^{-3}$ Pa or less. After the evacuation, α-NPD, which is an organic material, and molybdenum oxide, which is an inorganic material, were set in advance in an evaporation source to be operated by a resistance heating method, and heated so as to be evaporated at the same time, which is so-called co-evaporation. Thus, a sample was manufactured. Here, the evaporation rate of α-NPD was set to 0.4 nm/s and the concentration of molybdenum oxide was controlled at the level shown in Table 1. It is noted that the film thicknesses are all 100 nm.

TABLE 1

| Level No. | Concentration of molybdenum oxide (wt %) |
|---|---|
| 1 | 0 |
| 2 | 3 |
| 3 | 6 |
| 4 | 11 |
| 5 | 20 |
| 6 | 33 |

Figure 11:
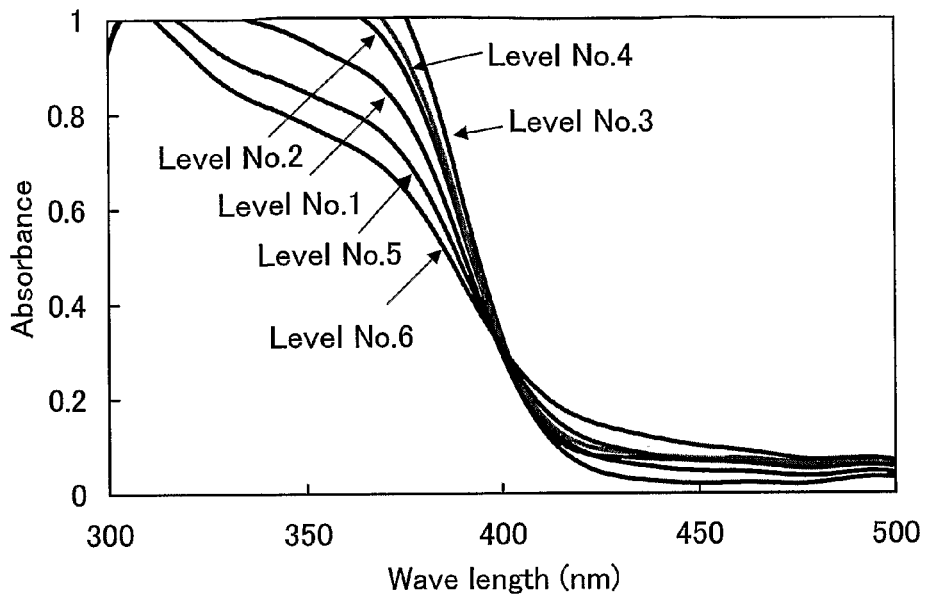
FIG. 11 shows an absorption spectrum of a sample formed by co-evaporating α-NPD and molybdenum oxide.

FIG. 11 is a graph showing an absorption spectrum. The shape of the spectrum changes in accordance with the change of the concentration of molybdenum oxide and it is understood that an isosbestic point appears at about 400 nm. This indicates that an equilibrium reaction exists between α-NPD and molybdenum oxide and a new substance is generated.

Figure 12:
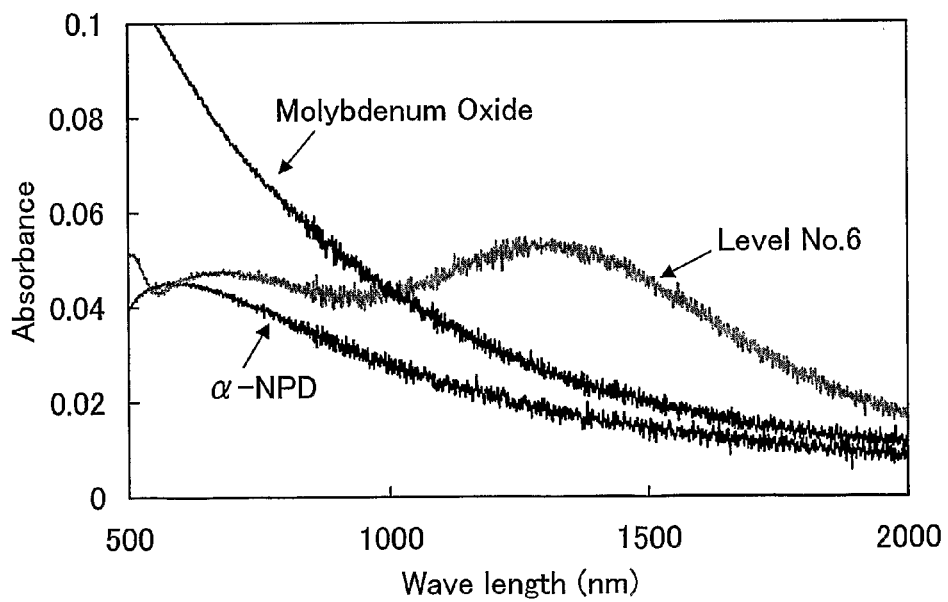
FIG. 12 shows an absorption spectrum of a sample formed by co-evaporating α-NPD and molybdenum oxide.

Meanwhile, FIG. 12 shows an absorption spectrum in a near-infrared region of a level-No. 6 sample. For comparison, results of samples of a single film of α-NPD and a single film of molybdenum oxide are also shown. As is clear from FIG. 12, in the level-No. 6 sample formed by co-evaporating α-NPD and molybdenum oxide, a peak appears at a wavelength of about 1,400 nm (corresponding to an energy of 0.88 eV) which does not appear in the samples of the single film of α-NPD and the single film of molybdenum oxide. Therefore, it is considered that a new substance, which does not exist in the single film of α-NPD and the single film of molybdenum oxide, is generated in the sample formed by co-evaporating α-NPD and molybdenum oxide.

Figure 13:
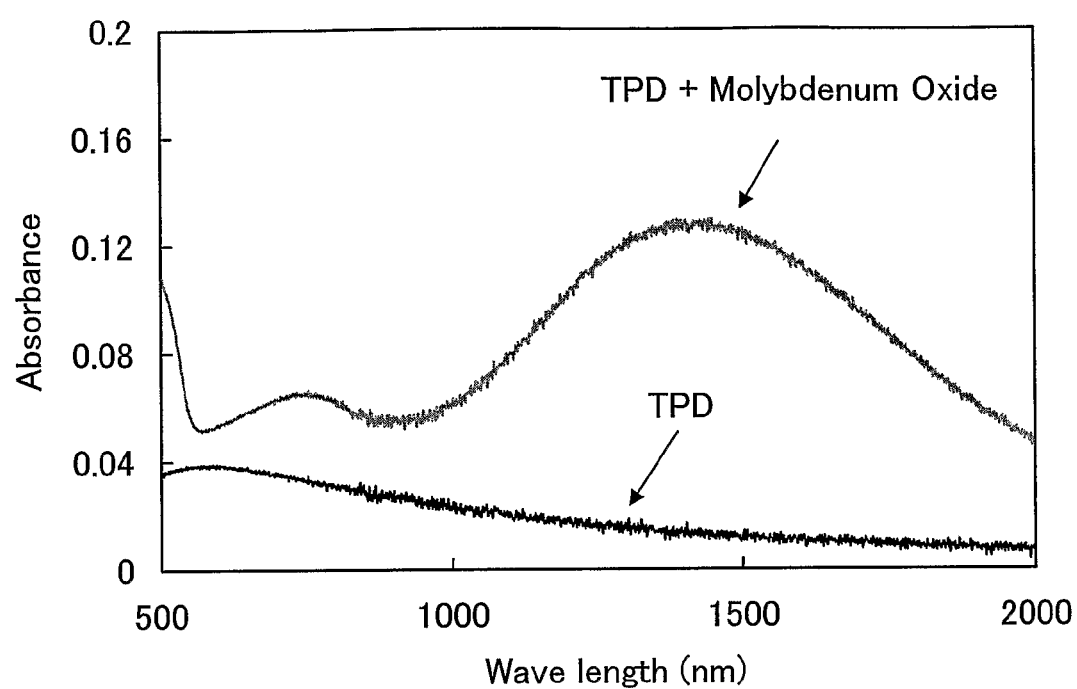
FIG. 13 shows an absorption spectrum of a sample formed by co-evaporating TPD and molybdenum oxide.

Next, another sample was manufactured by co-evaporating molybdenum oxide and TPD having a similar skeleton to α-NPD. FIG. 13 shows an absorption spectrum of the sample formed by co-evaporating TPD and molybdenum oxide. It is understood that a peak appears at a wavelength of about 1,400 nm (corresponding to an energy of 0.88 eV) in the sample formed by co-evaporating TPD and molybdenum oxide, which does not appear in the samples of the single film of α-NPD and the single film of molybdenum oxide. Therefore, even in the sample formed by co-evaporating TPD and molybdenum oxide, it is considered that a new substance, which does not exist in the single film of α-NPD and the single film of molybdenum oxide, is generated similarly to the sample formed by co-evaporating α-NPD and molybdenum oxide.

Figure 14:
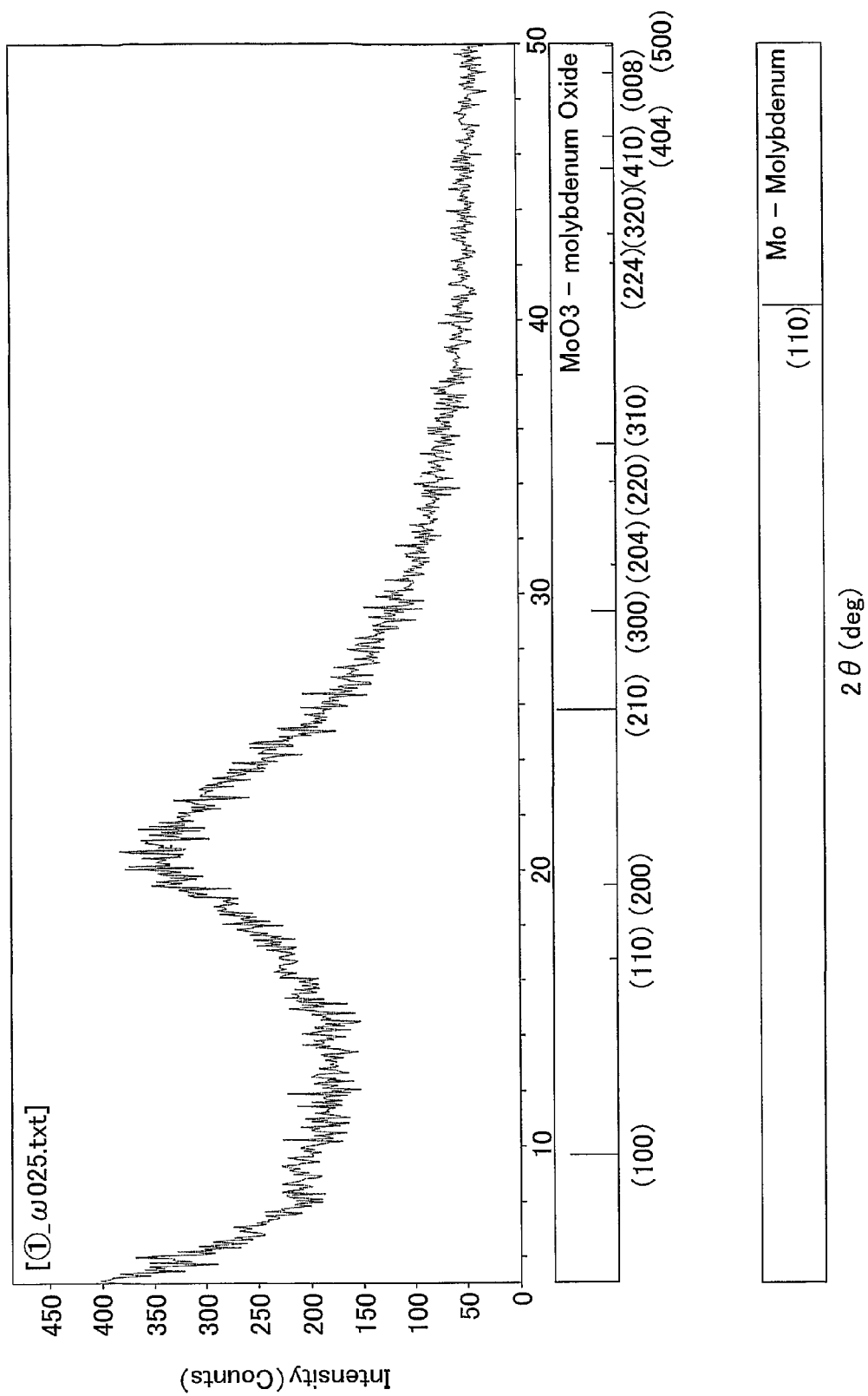
FIG. 14 shows a result of X-ray crystal structure analysis of a sample formed by co-evaporating α-NPD and molybdenum oxide.

Moreover, FIG. 14 shows a result of an X-ray crystallographic analysis of the sample formed by co-evaporating α-NPD and molybdenum oxide. FIG. 14 shows a result of a 2θ_ω (also expressed as 2θ/ω) scan measurement. Since a crystal peak is not observed in FIG. 14, the sample formed by co-evaporating α-NPD and molybdenum oxide is regarded as being amorphous.

Further, FIGS. 38 to 50 show results of ToF-SIMS (Time of Flight-Secondary Ion Mass Spectrometry). From the result of the ToF-SIMS, the existences of $MoO_3$, $MoO_4H$, $Mo_2O_6$, $Mo_2O_7$, $Mo_3O_6$, $Mo_3O_7$, $Mo_3O_8$, $Mo_3O_9$, $Mo_3O_{10}$, $Mo_4O_{10}$, $Mo_4O_{11}$, $Mo_4O_{12}$, $Mo_4O_{13}$, $Mo_5O_{10}$, $Mo_5O_{11}$, $Mo_5O_{12}$, $Mo_5O_{13}$, $Mo_5O_{14}$, $Mo_5O_{15}$, $Mo_6O_{12}$, $Mo_6O_{13}$, $Mo_6O_{14}$, $Mo_6O_{15}$, $Mo_6O_{16}$, $Mo_6O_{18}$, and $Mo_6O_{19}$ are confirmed as molybdenum oxide according to anion analysis. Moreover, according to cation analysis, a peak corresponding to two organic molecules and one molybdenum atom can be confirmed. Thus, new substances are considered to generate in the co-evaporation of α-NPD and molybdenum oxide and the co-evaporation of TPD and molybdenum oxide, respectively. It is considered that the new substances are generated by the interaction of the organic compound and molybdenum oxide.

In view of the above, the following simulation was carried out. Since TPD and α-NPD are both hole-transporting materials, TPD and α-NPD are likely to have a stable structure even through they have a positive charge. Consequently, simulation was carried out in view of the fact that TPD absorbs a cation radical. The absorption of a cation radical corresponds to a band gap between an energy level of the lowest unoccupied molecular orbital (LUMO) and an energy level of the singly occupied molecular orbital (SOMO) formed by removing one electron from the highest occupied molecular orbital (HOMO).

Structural relaxation of cation radical electron conditions of a TPD monomolecular body and a TPD dimolecular body was carried out using a molecular mechanics method (MM2). After that, calculation was carried out by a semi-empirical molecular orbital method to optimize the structure. At the calculation, WinMOPAC 3.5 was used as a semi-empirical molecular orbital calculation program and EF (geometry optimization), AM1 (Hamiltonian), and CHARGE=1 (+1 charge) were used as keywords. Configuration Interaction (CI) was not specified because the calculation cost increases.

As an optimal structure of a TPD monomolecular body, five initial structures (1a to 5a) in which dihedral angles have been changed are set and the most stable structure was employed. At the calculation, a methyl group of TPD is replaced by a hydrogen atom for simplicity. Even though a methyl group of TPD is replaced by a hydrogen atom, the location of the absorption spectrum hardly changes (that is, the energy gap between the HOMO level and the LUMO level does not change). Therefore, the calculation was carried out replacing the methyl group with a hydrogen atom. Calculation results of the TPD monomolecular body are shown in FIGS. 18 to 27.

The initial (input) structures at the calculation are hereinafter described. The initial structures have benzene rings, which are numbered as the formulas below, arranged in the following manner. The structure 1a is formed by arranging benzene rings 1 to 6 so that an angle between planes of the benzene rings 2 and 3 is 90° and an angle between planes of the benzene rings 4 and 5 is 90°. The structure 2a is formed by arranging the benzene rings 1 to 6 so that an angle between a plane of the benzene ring 3 and planes of the benzene rings 1 and 2 is 90° and an angle between a plane of the benzene ring 4 and planes of the benzene rings 5 and 6 is 90°. The structure 3a is a structure, in addition to Structure 2a, in which an angle between planes of the benzene rings 3 and 4 is 90°. The structure 4a is formed by arranging the benzene rings 1 to 6 so that an angle between planes of the benzene rings 3 and 4 is 0° and an angle between the planes of the benzene rings 1, 2, 5, and 6 and the planes of the benzene rings 3 and 4 is 90°. The structure 5a is formed by arranging the benzene rings 1 to 6 so that an angle between the planes of all the benzene rings is 0°. Calculation to optimize these structures was conducted by AM1, and the calculation results are shown in FIG. 18 to 27.

Chemical Formula 1

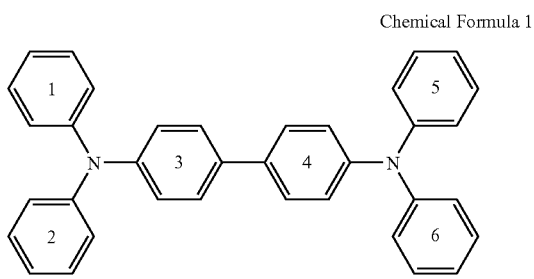 [SMILES: c1ccc(N(c2ccccc2)c2ccc(-c3ccc(N(c4ccccc4)c4ccccc4)cc3)cc2)cc1]

Figure 18:
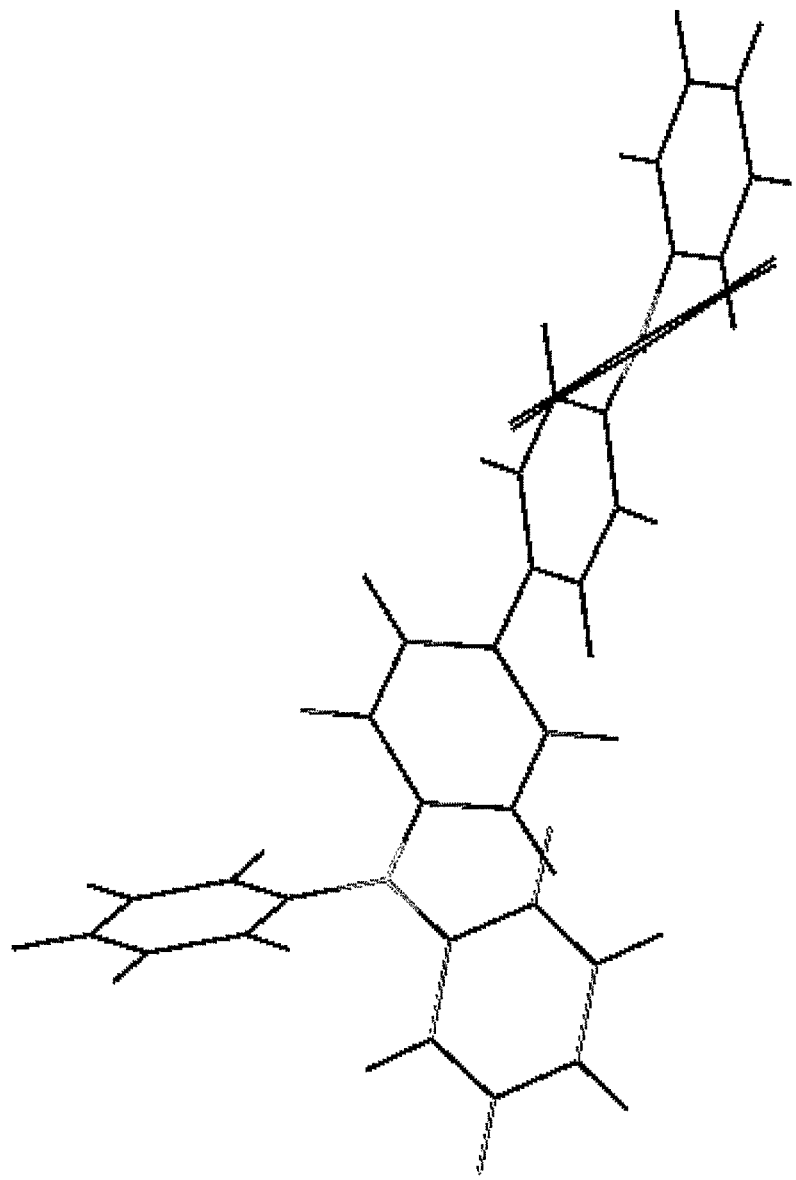
FIG. 18 shows an optimal structure of a TPD monomolecule.
Figure 20:
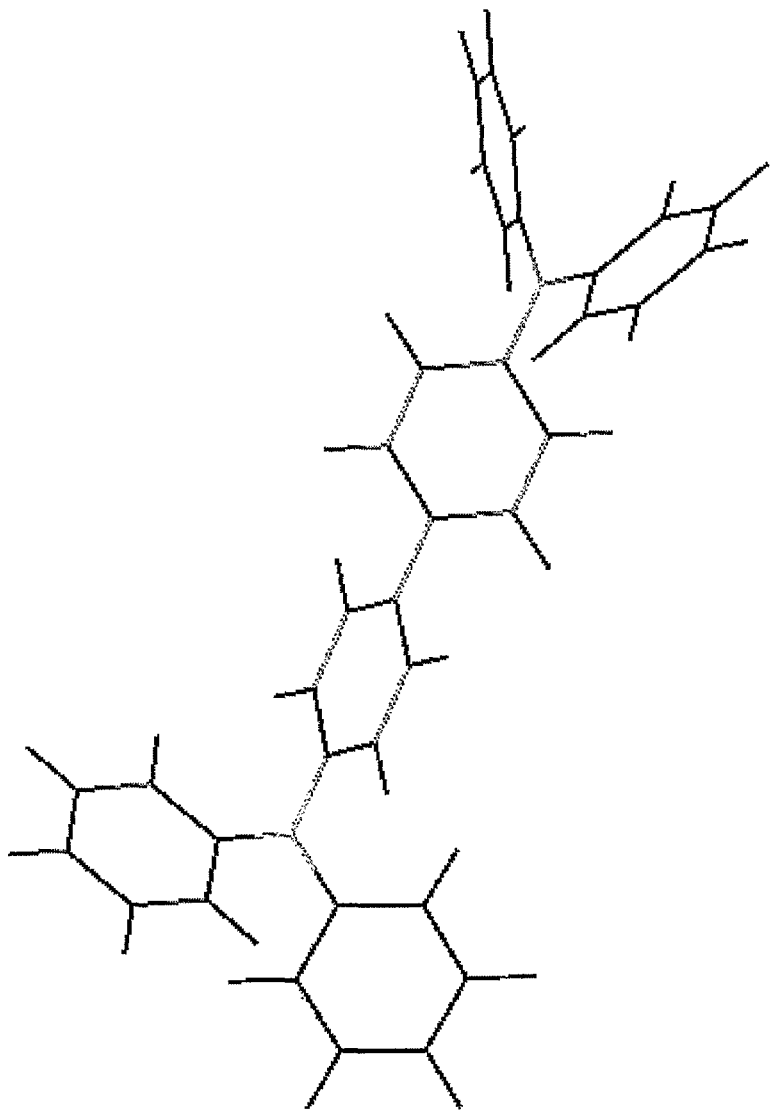
FIG. 20 shows an optimal structure of a TPD monomolecule.
Figure 22:
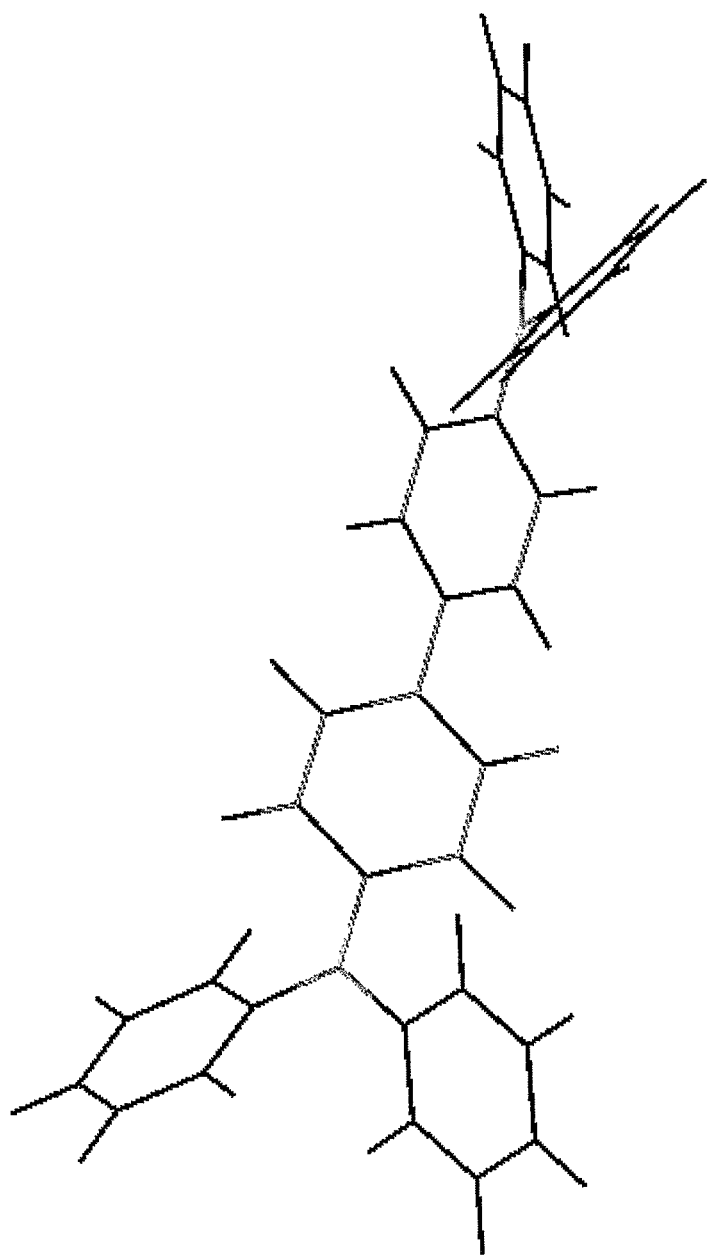
FIG. 22 shows an optimal structure of a TPD monomolecule.
Figure 24:
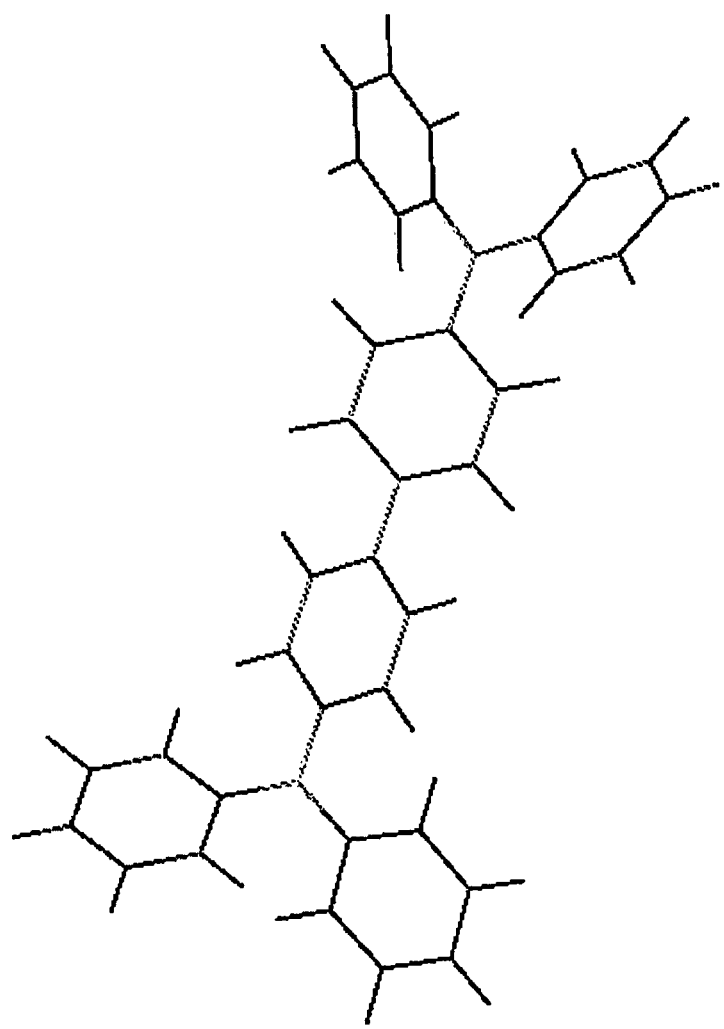
FIG. 24 shows an optimal structure of a TPD monomolecule.
Figure 26:
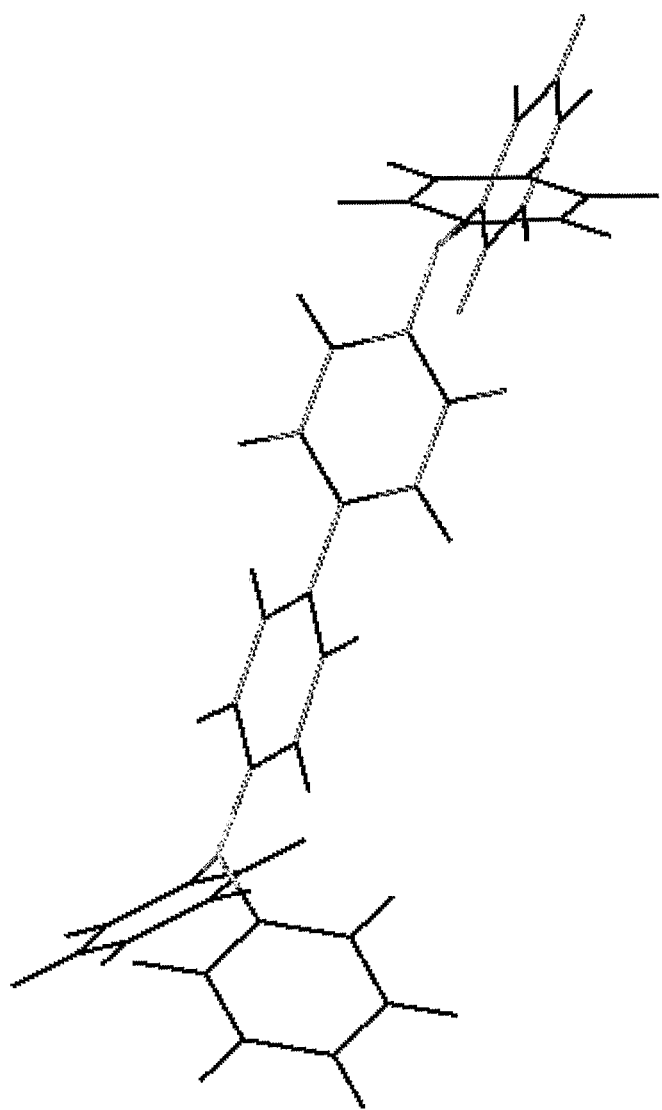
FIG. 26 shows an optimal structure of a TPD monomolecule.
Figure 38:
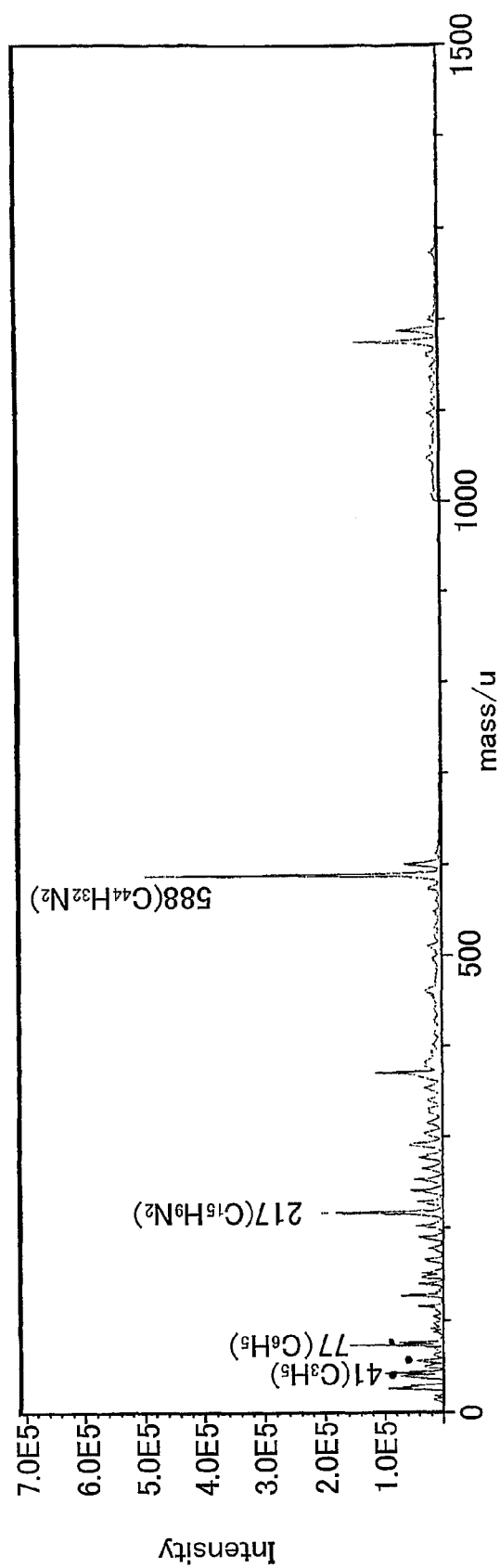
FIG. 38 shows a measurement result of ToF-SIMS of a sample formed by co-evaporating α-NPD and molybdenum oxide.
Figure 39:
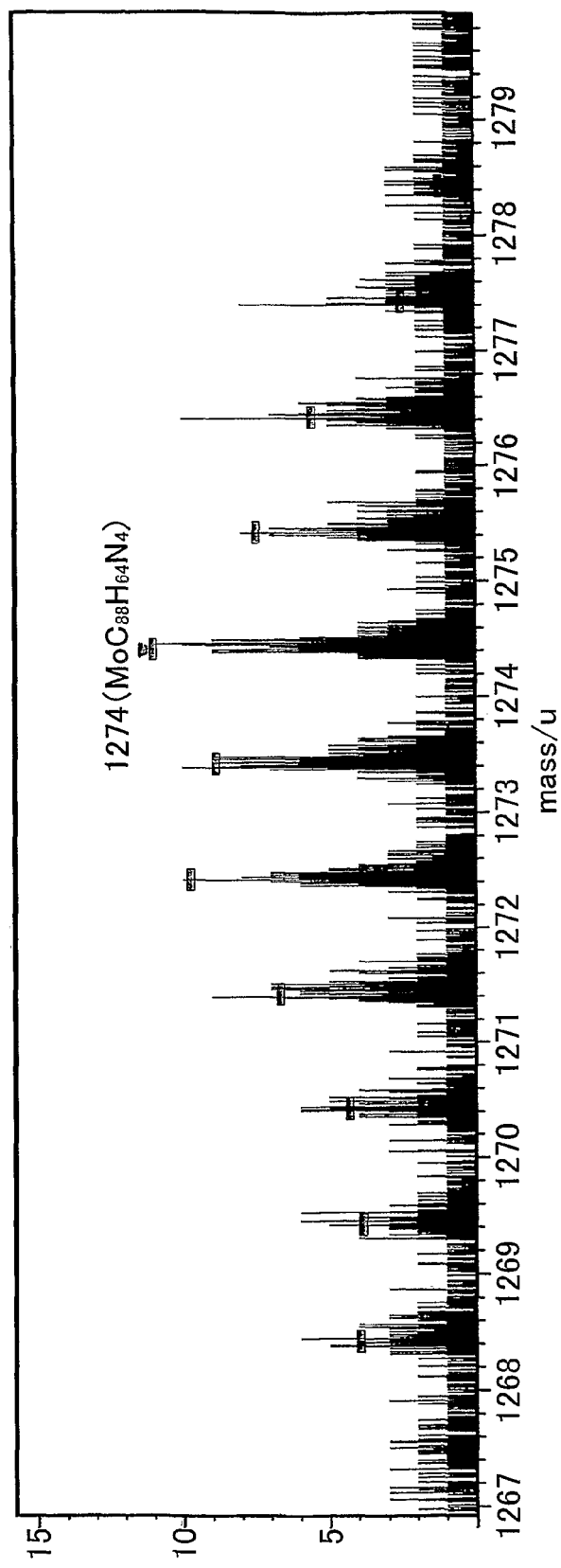
FIG. 39 shows a measurement result of ToF-SIMS of a sample formed by co-evaporating α-NPD and molybdenum oxide.
Figure 40:
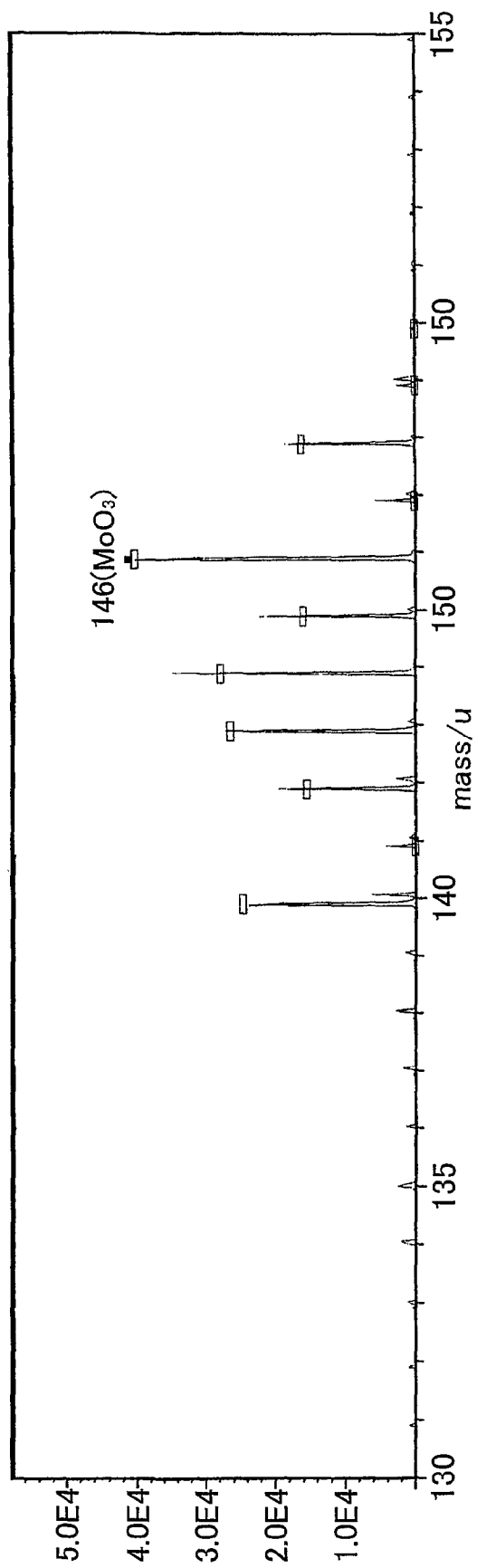
FIG. 40 shows a measurement result of ToF-SIMS of a sample formed by co-evaporating α-NPD and molybdenum oxide.
Figure 41:
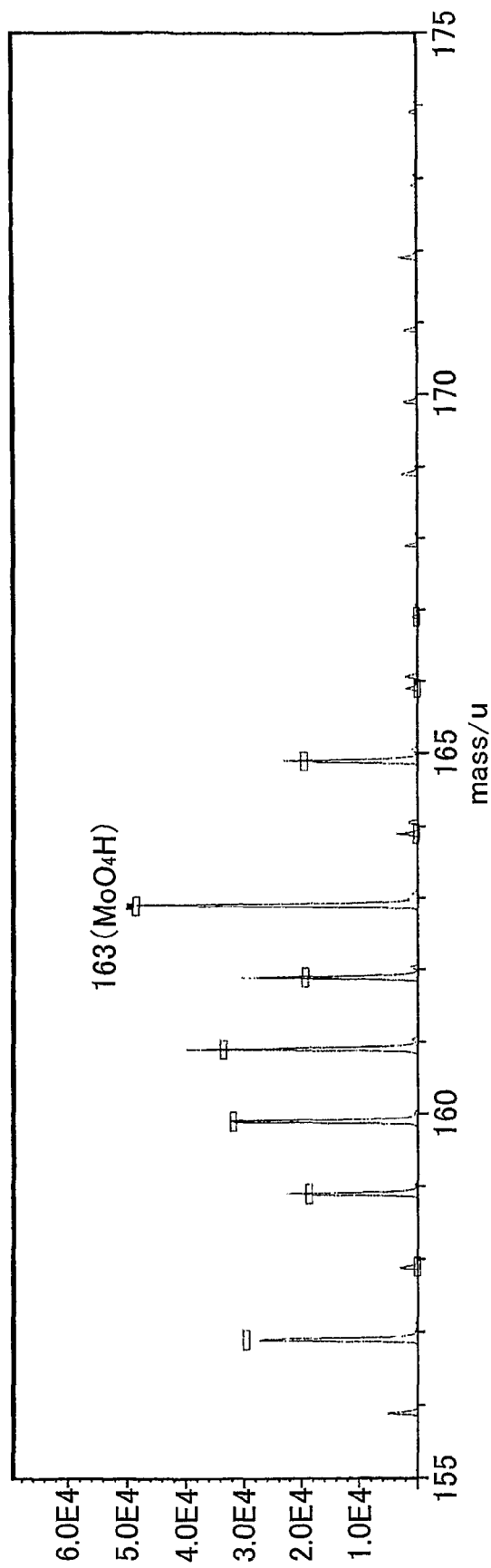
FIG. 41 shows a measurement result of ToF-SIMS of a sample formed by co-evaporating α-NPD and molybdenum oxide.
Figure 42:
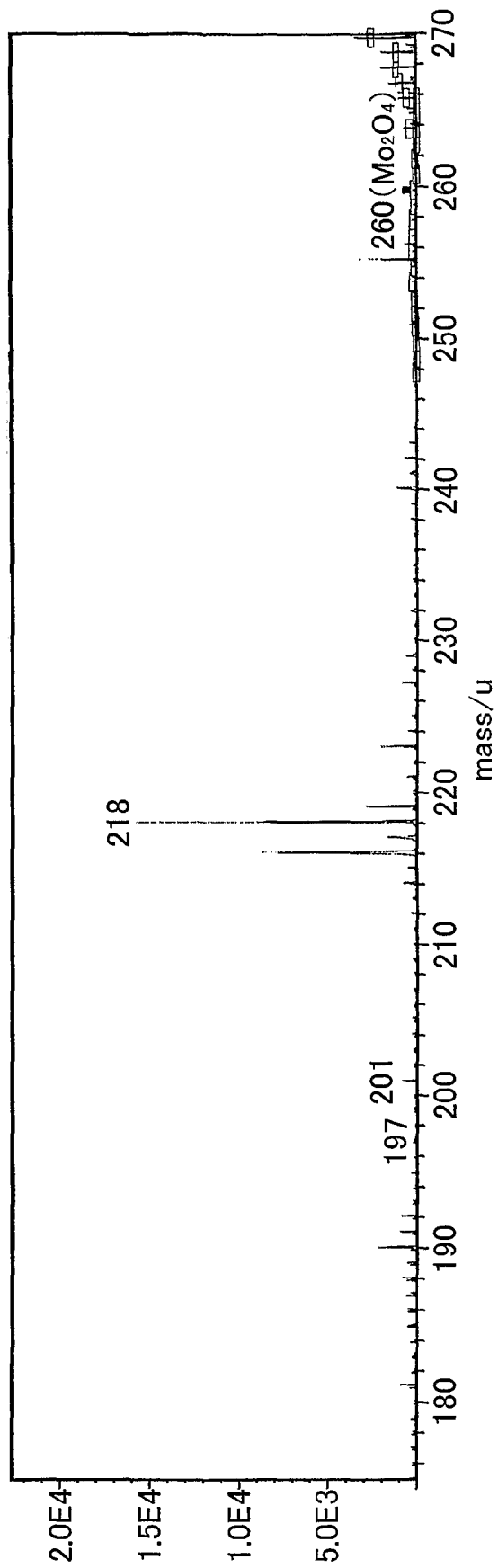
FIG. 42 shows a measurement result of ToF-SIMS of a sample formed by co-evaporating α-NPD and molybdenum oxide.
Figure 43:
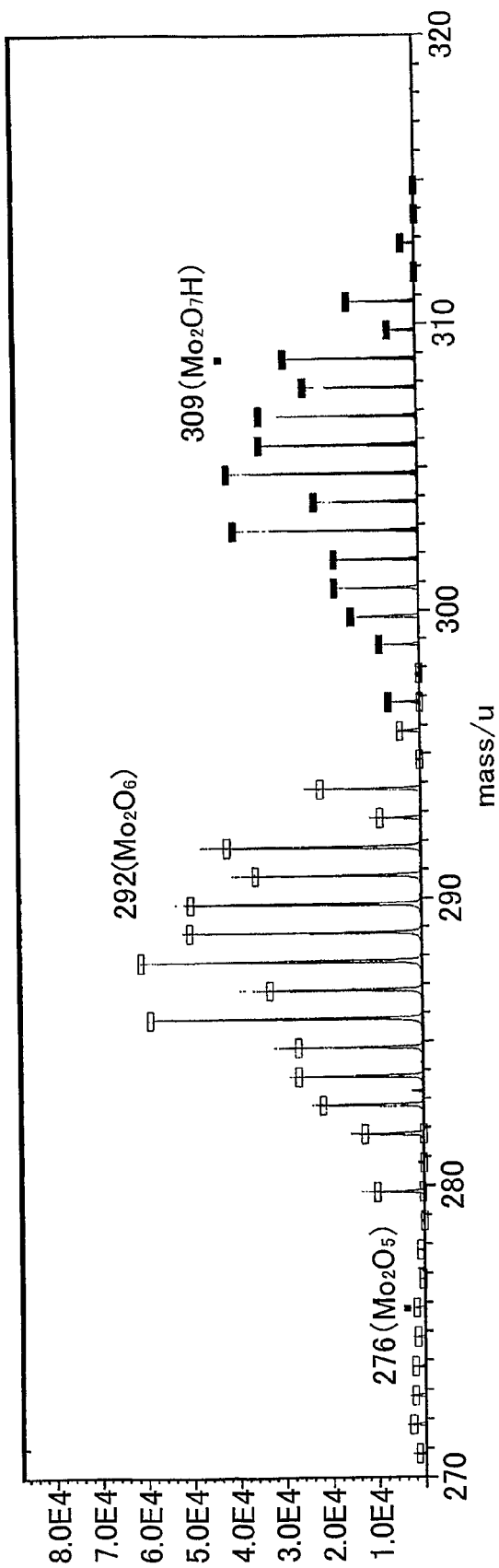
FIG. 43 shows a measurement result of ToF-SIMS of a sample formed by co-evaporating α-NPD and molybdenum oxide.
Figure 44:
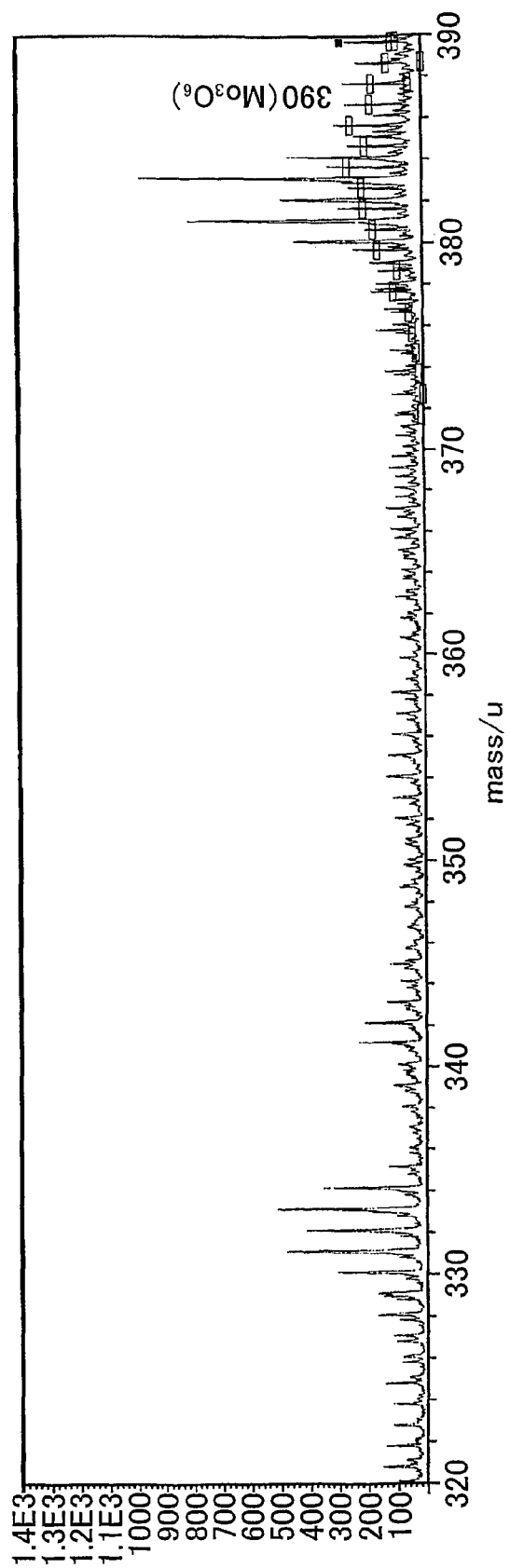
FIG. 44 shows a measurement result of ToF-SIMS of a sample formed by co-evaporating α-NPD and molybdenum oxide.
Figure 45:
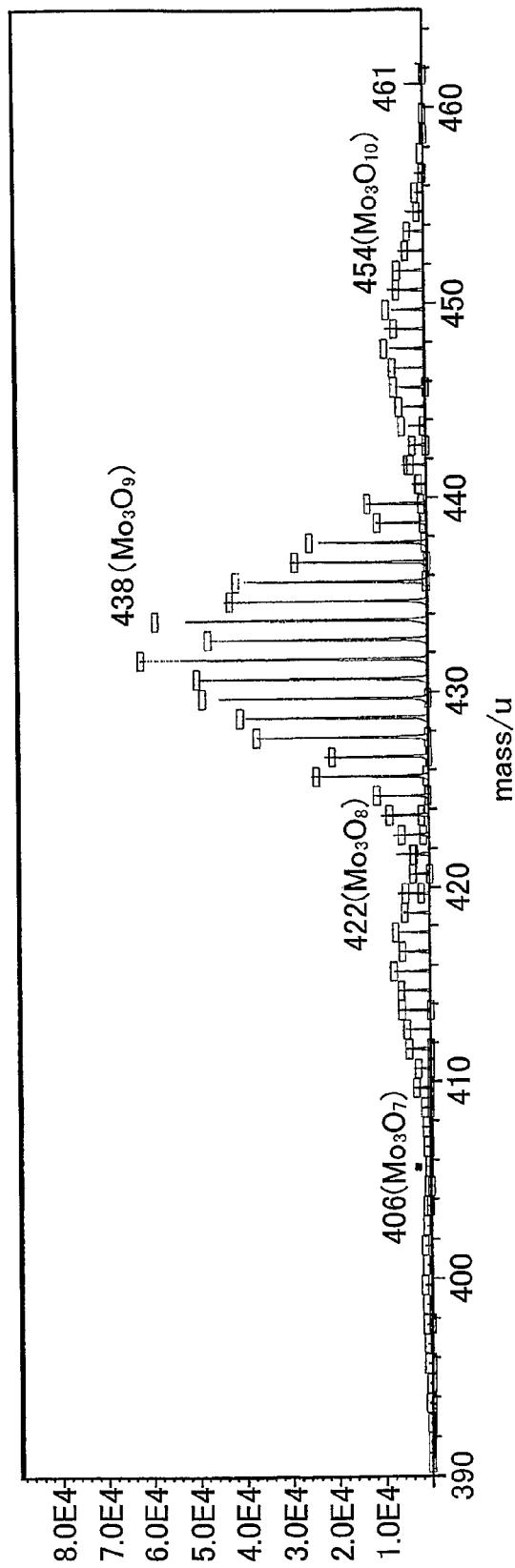
FIG. 45 shows a measurement result of ToF-SIMS of a sample formed by co-evaporating α-NPD and molybdenum oxide.
Figure 46:
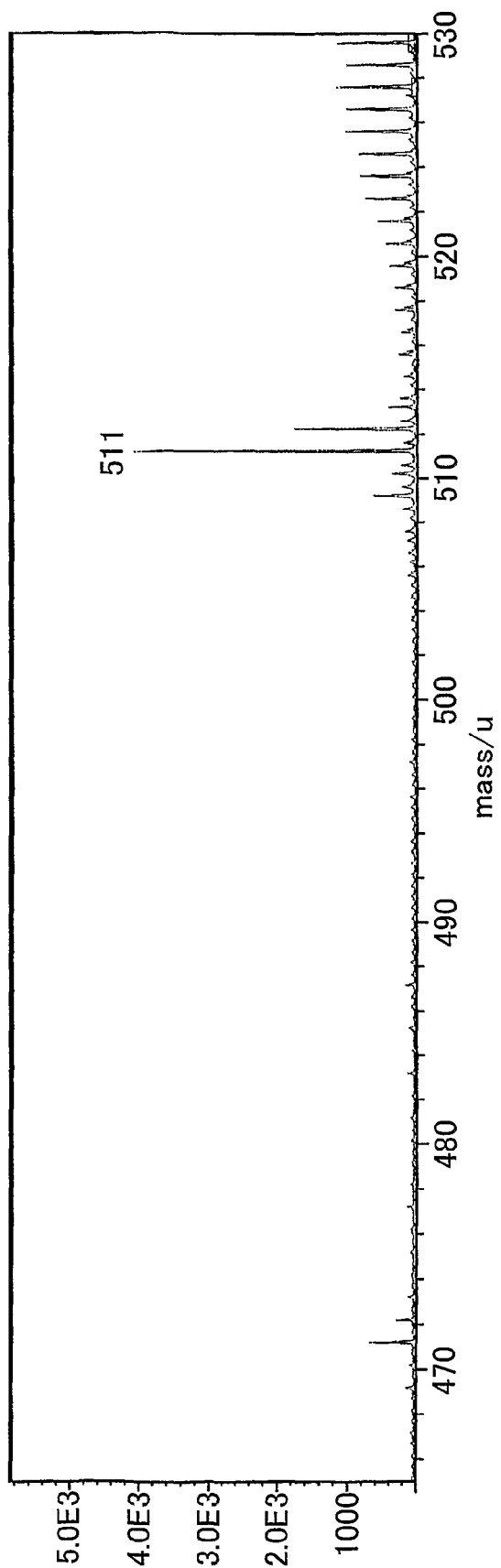
FIG. 46 shows a measurement result of ToF-SIMS of a sample formed by co-evaporating α-NPD and molybdenum oxide.
Figure 47:
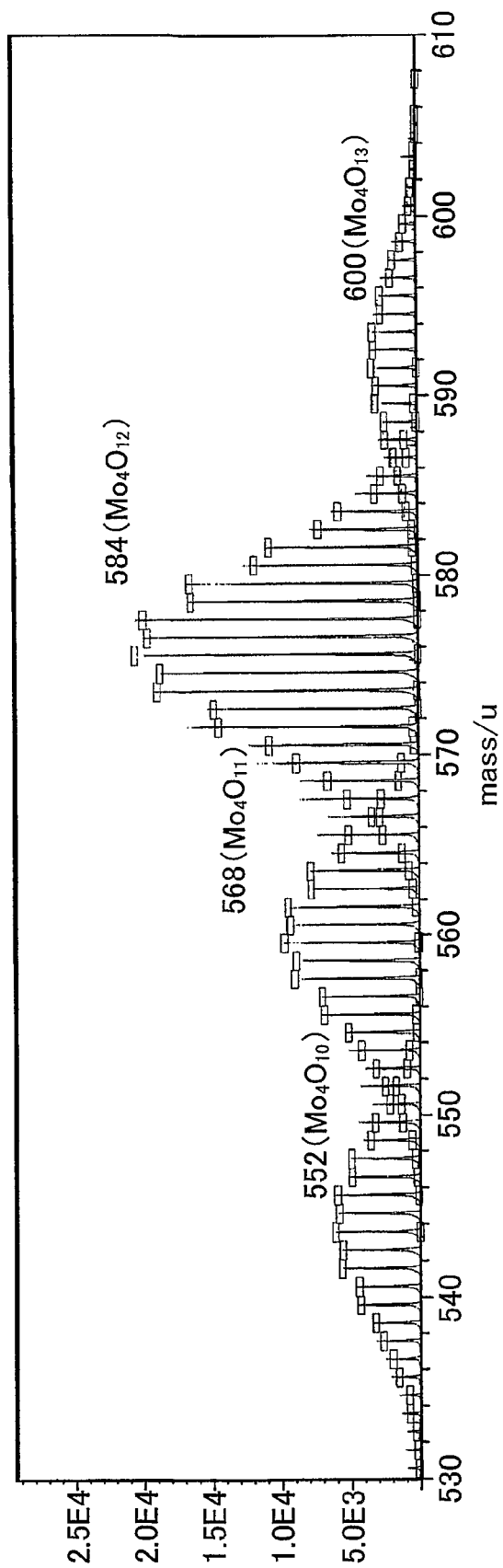
FIG. 47 shows a measurement result of ToF-SIMS of a sample formed by co-evaporating α-NPD and molybdenum oxide.
Figure 48:
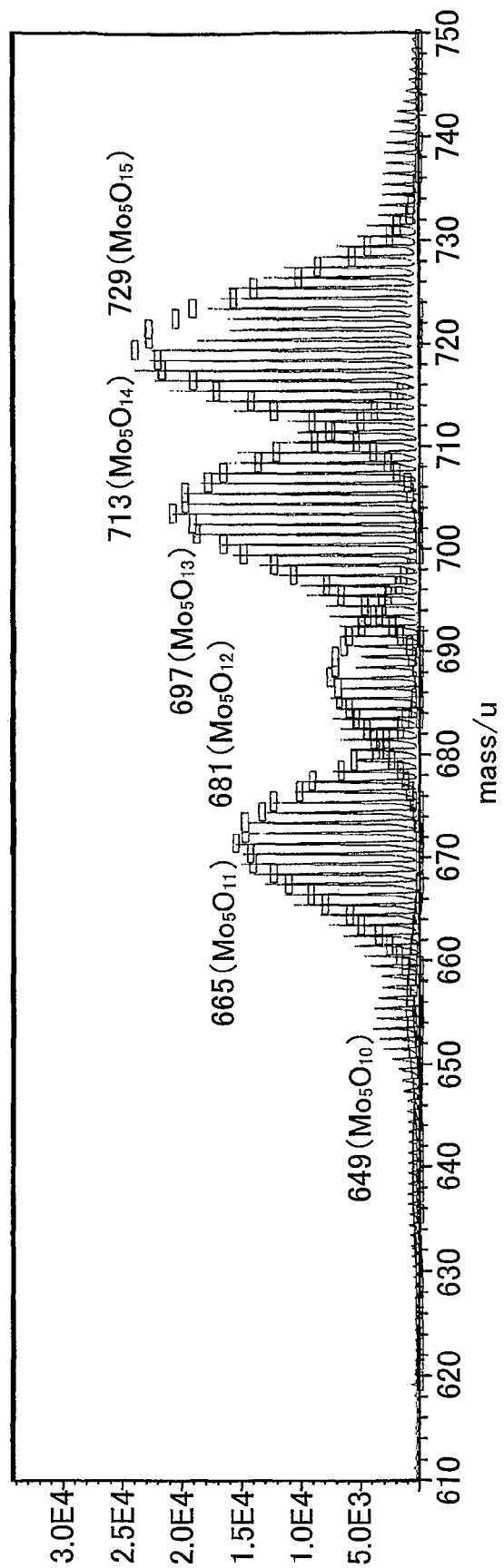
FIG. 48 shows a measurement result of ToF-SIMS of a sample formed by co-evaporating α-NPD and molybdenum oxide.
Figure 49:
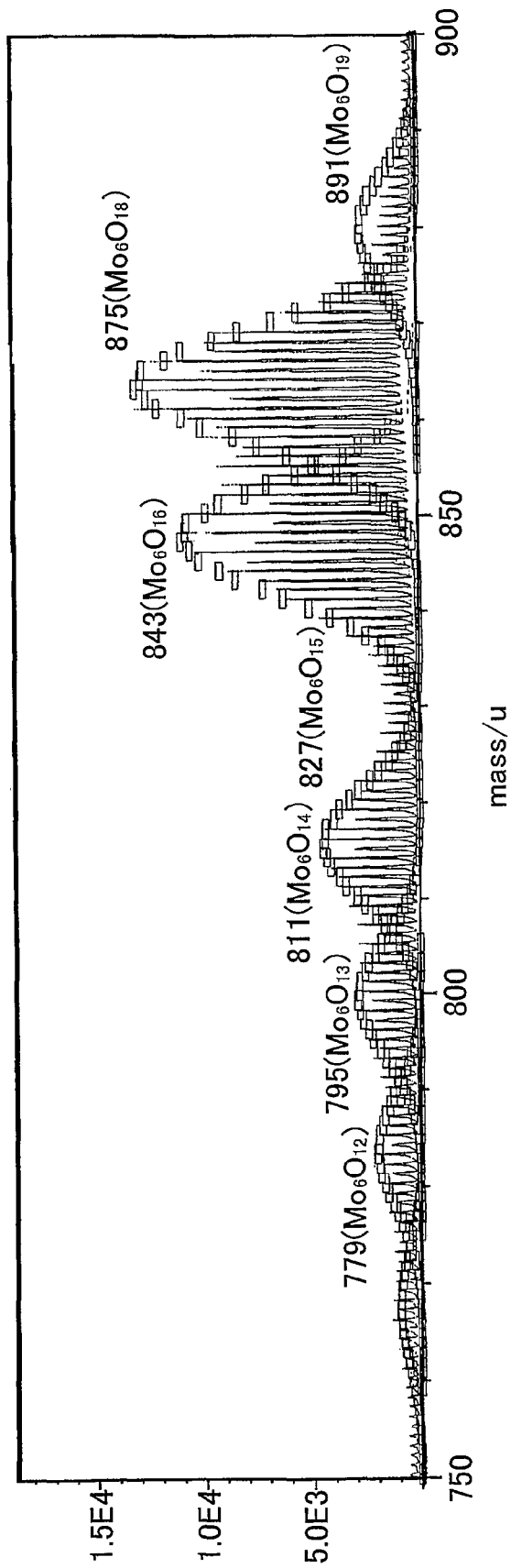
FIG. 49 shows a measurement result of ToF-SIMS of a sample formed by co-evaporating α-NPD and molybdenum oxide.
Figure 50:
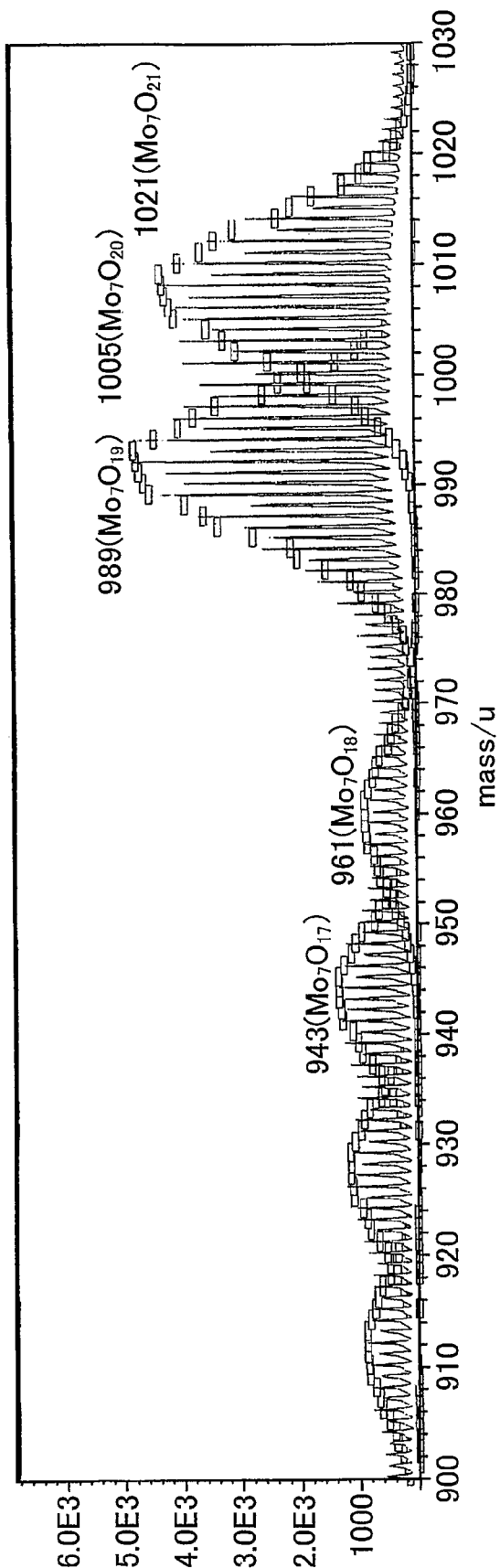
FIG. 50 shows a measurement result of ToF-SIMS of a sample formed by co-evaporating α-NPD and molybdenum oxide.

FIGS. 18 and 19 show the calculation result (a structure 1b) in which the structure 1a was assumed to be the initial structure. FIGS. 20 and 21 show the calculation result (a structure 2b) in which the structure 2a was assumed to be the initial structure. Moreover, FIGS. 22 and 23 show the calculation result (a structure 3b) in which the structure 3a was assumed to be the initial structure. FIGS. 24 and 25 show the calculation result (a structure 4b) in which the structure 4a was assumed to be the initial structure. FIGS. 26 and 27 show the calculation result (a structure 5b) in which the structure 5a was assumed to be the initial structure. Among the structures 1b to 5b, the structure 1b in which the structure 1a was the initial structure has the least heat of formation. Therefore, the structure 1b which has the least heat of formation was used to calculate the cation radical electron state. FIG. 32 shows the calculation result of the cation radical electron state of the structure 1b.

Moreover, three model structures (molecular arrangement) are also assumed concerning the TPD dimolecular body, and the most stable structure was employed. The calculation results are shown in FIGS. 28 to 31. At the calculation, a methyl group of the TPD was replaced by a hydrogen atom for simplicity. In other words, the position of the absorption spectrum hardly changes even though the methyl group is replaced by a hydrogen atom (the energy gap between the HOMO and the LUMO does not change). Therefore, the methyl group was replaced by a hydrogen atom at the calculation.

In FIG. 28, a structure 11 is a structure in which the TPD molecules are orthogonal with each other, a structure 12 is a structure in which planes of aromatic rings of biphenyl do not face to each other, and a structure 13 is a structure in which planes of aromatic rings of biphenyl face to each other. Table 2 shows comparison of theoretic heat of formation obtained by calculation. From Table 2, such a calculation result was obtained that the structure 13 in which biphenyl planes face to each other has the least heat of formation and is the most stable structure. Therefore, the structure 13, which is the most stable, was used in the calculation of a cation radical of the TPD dimolecular body.

TABLE 2

Theoretic heat of formation of a-NPD dimolecular body

| | Theoretic heat of formation (kJ) |
|---|---|
| Structure 11 | 1669.51 |
| Structure 12 | 1669.33 |
| Structure 13 | 1668.22 |

Table 3 shows a SOMO level, a LUMO level, and their band gap energy in a cation radical of a TPD monomolecule and a cation radical of a TPD dimolecular body, which are obtained from the calculations. Moreover, FIG. 32 shows a calculation result of a cation radical of the TPD monomolecule and FIG. 33 shows a calculation result of a cation radical of the TPD dimolecular body.

TABLE 3

Calculation results of a-NPD monomolecular cation radical and a-NPD dimolecular body cation radical

| | SOMO (eV) | LUMO (eV) | Band gap energy (eV) |
|---|---|---|---|
| a-NPD monomolecular cation radical | −11.21 | −7.54 | 3.67 |
| a-NPD dimolecular body cation radical | −9.26 | −8.43 | 0.83 |

The band gap energy obtained from the absorption spectrum shown in FIG. 13 is 0.88 eV and it is understood that this band gap energy conforms very well to the band gap energy of a cation radical of the TPD dimolecular body obtained in this simulation. Therefore, it is considered that a cation radical of the dimolecular body in which TPDs are arranged in parallel is involved in a new substance formed by the co-evaporation of TPD and molybdenum oxide.

Moreover, another calculation was conducted on how TPD and molybdenum oxide are bonded. In this calculation, a methyl group of TPD was also replaced by a hydrogen atom. In other words, the position of the absorption spectrum hardly changes even though the methyl group is replaced by a hydrogen atom (an energy gap between the HOMO and the LUMO does not change). Therefore, the methyl group was replaced by a hydrogen atom. In the case of forming the film by evaporation, molybdenum oxide in the film can have various valences; however, the calculation was conducted using molybdenum trioxide ($MoO_3$), which is the initial material to be set at the evaporation. The results are shown in FIGS. 34 to 37. The result of a structure 21 is shown in FIG. 35, the result of a structure 22 is shown in FIG. 36, and the result of a structure 23 is shown in FIG. 37.

The calculation result is shown in FIG. 34. The results of the three kinds of the structures 21 to 23 were obtained depending on the initial arrangement of molybdenum trioxide. In either case, when $MoO_3$ (a portion circled by a solid line in FIG. 34) approaches TPD, an electron in an aromatic ring in TPD is deprived and an N atom (a portion circled by a dashed line in FIG. 34) finally has a positive charge, so that the TPD turns to be a cation radical. Among the three models shown in FIG. 34, the calculation results indicate the structure 22 is the most stable. In this specification, that an organic material and metal oxide are coordinated in this manner means that a cluster is formed.

Figure 15:
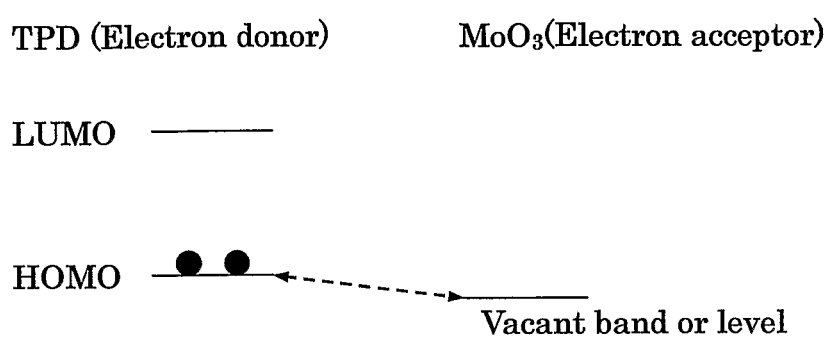
FIG. 15 shows energy levels of TPD and molybdenum oxide.

Electrons are transported between an aromatic ring of TPD and $MoO_3$ because of the following reason. Since an N atom having an unshared electron pair (a lone pair) has an electron-donating property, the N atom partially donates a negative charge to an aromatic ring through conjugation, and thus the electron density of the aromatic ring increases and the nucleophilicity increases. $MoO_3$ cannot approach the N atom because of steric hindrance of the aromatic ring of TPD. Therefore, $MoO_3$ receives electrons from the aromatic ring of the TPD having nucleophilicity and the electron-deficient aromatic ring comes to have a positive charge. However, since the N atom comes to have an unpaired electron through conjugation, the stabilization of a TPD cation radical structure is considered to be achieved. Further, another reason why electrons are easily transported between TPD and $MoO_3$ is considered that the HOMO level of TPD is close to a vacant band or the level of MoO$_3$ (such as a conduction band) (FIG. 15).

Since the absorption spectrum of α-NPD and the absorption spectrum of TPD have a peak at almost the same wavelength, it can be said that the sample formed by co-evaporating α-NPD and molybdenum oxide is in a similar state to the sample formed by co-evaporating TPD and molybdenum oxide. In other words, when MoO$_3$ approaches α-NPD, an electron in an aromatic ring of α-NPD is deprived and an N atom finally has a positive charge, so that α-NPD turns to be a cation radical.

Embodiment Mode 3

In this embodiment mode, a light-emitting element having a structure different from the structure shown in Embodiment Mode 1 will be described with reference to FIGS. 3A to 3C and FIGS. 4A to 4C. This embodiment mode is different from Embodiment Mode 1 in that a layer including a cluster is provided adjacent to each of two electrodes of a light-emitting element.

Figure 3A:
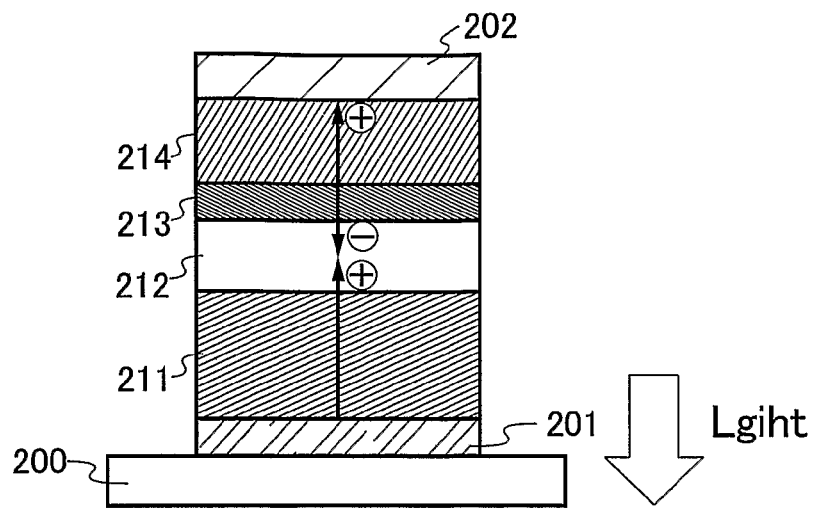
FIGS. 3A to 3C show a light-emitting element of the present invention.

FIG. 3A shows an example of a structure of a light-emitting element of Second Embodiment Mode (Embodiment Mode 3) of the present invention. A layer containing a light-emitting substance is sandwiched between a first electrode 201 and a second electrode 202. The layer containing a light-emitting substance has a structure in which a second layer 212 and a third layer 213 are stacked. This embodiment mode will describe a case in which the first electrode 201 serves as an anode and the second electrode 202 serves as a cathode.

The same structure as that in Embodiment Mode 1 can be applied to the first electrode 201 and the second electrode 202. Moreover, the first layer 211 is the layer including a cluster shown in Embodiment Mode 2, and the second layer 212 is a layer containing a substance having a high light-emitting property. The third layer 213 is a layer containing an electron-donating substance and a compound having a high electron-transporting property. A fourth layer 214 is the layer including a cluster, which is shown in Embodiment Mode 2. As the electron-donating substance contained in the third layer 213, alkali metal, alkali-earth metal, an oxide of alkali metal or alkali-earth metal, or salt of alkali metal or alkali-earth metal is preferably used. Specifically, lithium, calcium, cesium, lithium oxide, calcium oxide, barium oxide, cesium carbonate, or the like is given.

By having such a structure as shown in FIG. 3A, when voltage is applied, electrons are transported near the boundary between the third layer 213 and the fourth layer 214, electrons and holes are generated, and the third layer 213 transports electrons to the second layer 212. At the same time, the fourth layer 214 transports holes to the second electrode 202. In other words, a combination of the third layer 213 and the fourth layer 214 serves as a carrier generating layer. It can be said that the fourth layer 214 has a function to transport holes to the second electrode 202. By stacking the second layer and the third layer between the fourth layer 214 and the second electrode 202 again, a tandem-type light-emitting element can also be obtained.

Further, the fourth layer 214 and the first layer 211 which include clusters exhibit extremely high hole-injecting property and hole-transporting property. Therefore, in the light-emitting element of this embodiment mode, opposite ends of the second layer having a light-emitting function can be made very thick, thereby effectively preventing the shorting of the light-emitting element. Moreover, for example in FIG. 3A, when the second electrode 202 is formed by sputtering, damage to the second layer 212 in which a light-emitting substance exists can be decreased.

Since the opposite ends of the layer containing a light-emitting substance are formed with the same material by forming the first layer 211 and the fourth layer 214 with the same material, it can be expected that stress distortion is also suppressed. The light-emitting element in this embodiment mode can also have various structures by changing the kinds of the first electrode 201 and the second electrode 202. The schematic views are shown in FIGS. 3B and 3C and FIGS. 4A to 4C. In FIGS. 3B and 3C and FIGS. 4A to 4C, the same reference numerals as those in FIG. 3A are used. In these figures, a reference numeral 200 denotes a substrate where the light-emitting element is to be formed.

Figure 3B:
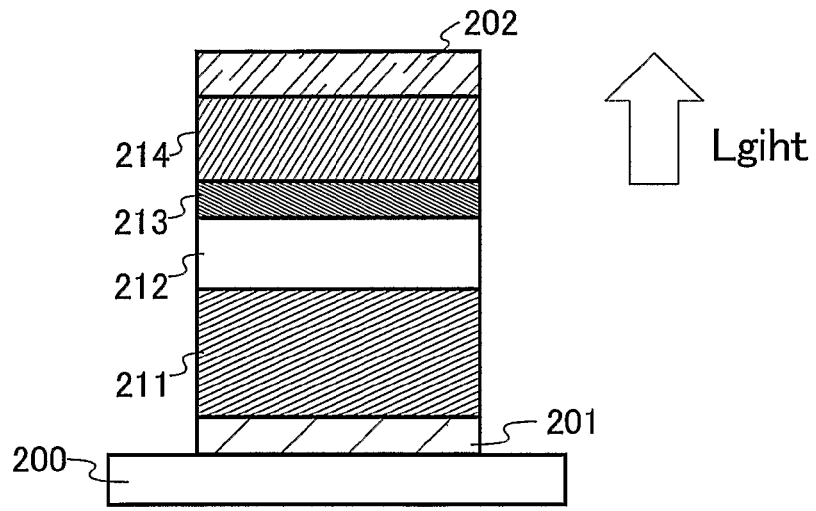
Figure 3C:
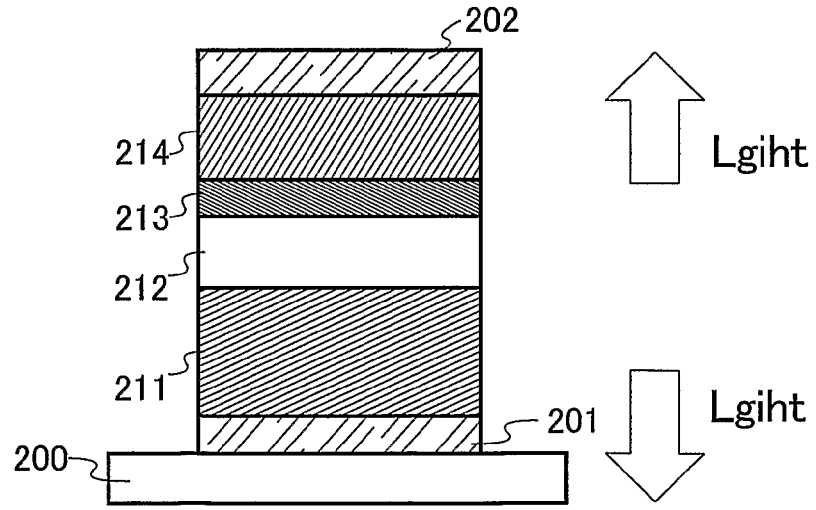

As described above, FIGS. 3A to 3C show an example of a structure in which the first layer 211, the second layer 212, the third layer 213, and the fourth layer 214 are stacked in order from the substrate 200 side. In this example, a structure in which light is emitted from the substrate 200 side as shown in FIG. 3A is obtained by making the first electrode 201 have a light-transmitting property and the second electrode 202 have a light-blocking property (particularly a light-reflecting property). Moreover, another structure in which light is emitted from a side opposite to the substrate 200 side as shown in FIG. 3B is obtained by making the first electrode 201 have a light-blocking property (particularly a light-reflecting property) and the second electrode 202 have a light-transmitting property. Furthermore, another structure in which light is emitted to both of the substrate 200 side and the side opposite to the substrate 200 side as shown in FIG. 3C is obtained by making the first electrode and the second electrode have light-transmitting properties.

Figure 4A:
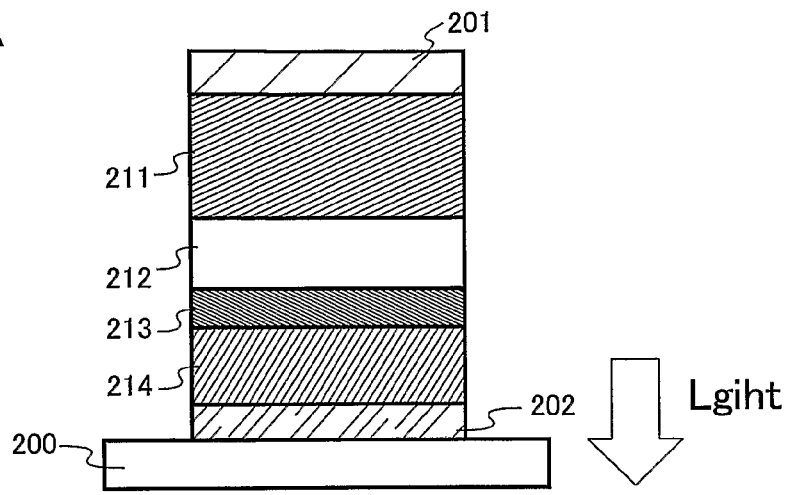
FIGS. 4A to 4C show a light-emitting element of the present invention.
Figure 4B:
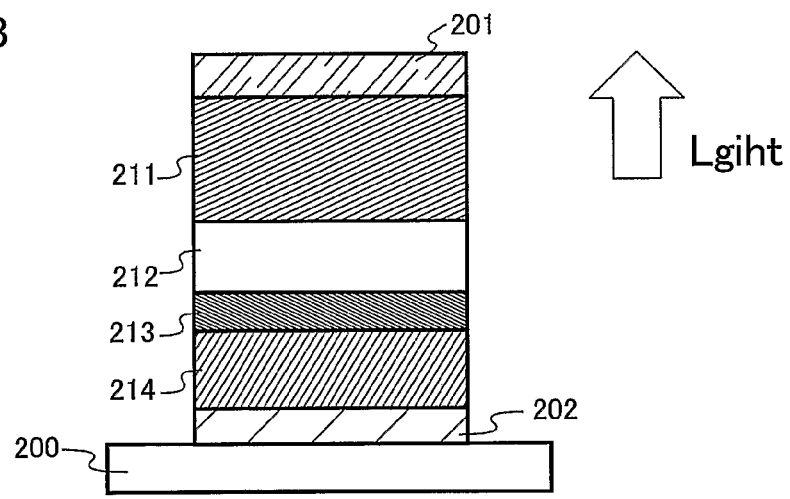
Figure 4C:
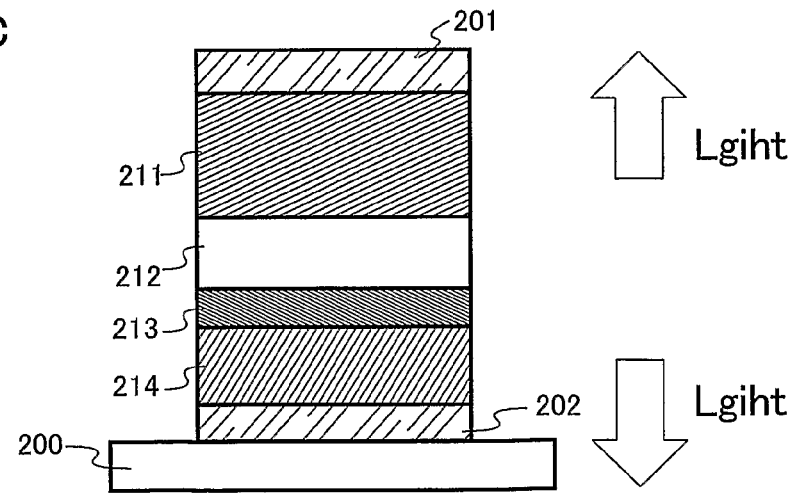

FIGS. 4A to 4C show an example of a structure in which the fourth layer 214, the third layer 213, the second layer 212, and the first layer 211 are stacked in order from the substrate 200 side. In this example, light is extracted from the substrate 200 side as shown in FIG. 4A by making the first electrode 201 have a light-blocking property (particularly a light-reflecting property) and the second electrode 202 have a light-transmitting property. On the contrary, light is extracted from a side opposite to the substrate 200 side as shown in FIG. 4B by making the first electrode 201 have a light-transmitting property and the second electrode 202 have a light-blocking property (particularly a light-reflecting property). Furthermore, a structure in which light is emitted to both of the substrate 200 side and the side opposite to the substrate 200 side as shown in FIG. 4C is obtained by making the first electrode 201 and the second electrode 202 have light-transmitting properties.

A structure is also possible in which the first layer 211 contains an electron-donating substance and a compound having a high electron-transporting property, the second layer 212 contains a light-emitting substance, the third layer 213 includes the cluster shown in Embodiment Mode 2, and the fourth layer 214 contains an electron-donating substance and a compound having a high electron-transporting property. In the case of manufacturing a light-emitting element in this embodiment mode, a known method regardless of a wet method or a dry method can be used. Moreover, after the first electrode 201 is formed, the first layer 211, the second layer 212, the third layer 213, and the fourth layer 214 may be sequentially stacked and then the second electrode 202 may be formed. Alternatively, after the second electrode 202 is formed, the fourth layer 214, the third layer 213, the second layer 212, and the first layer 211 may be sequentially stacked, and then the first electrode may be formed.

Embodiment Mode 4

Figure 5:
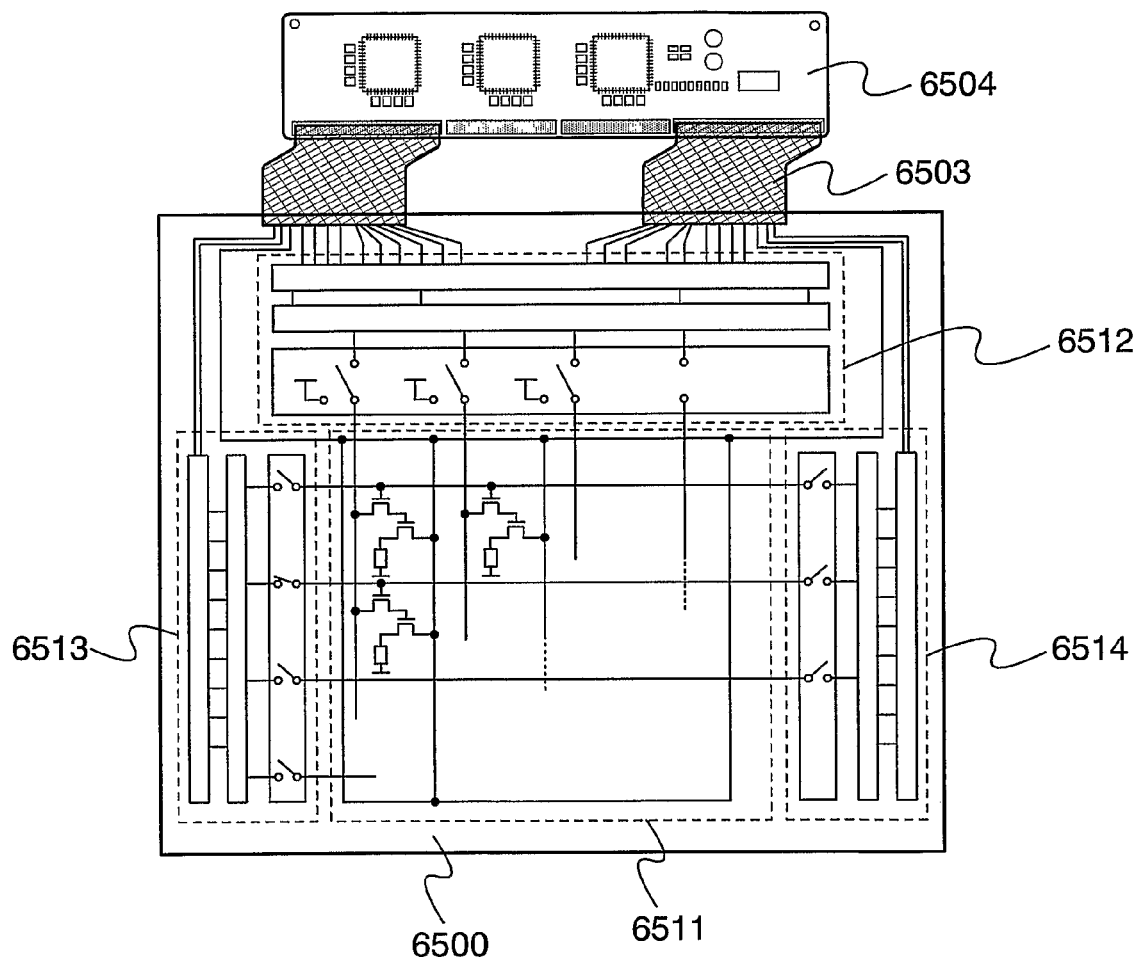
FIG. 5 shows a light-emitting device to which the present invention has been applied.

This embodiment mode will describe a circuit structure of a light-emitting device having a display function and a driving method thereof, with reference to FIGS. 5 to 8. FIG. 5 is a schematic top view of a light-emitting device to which a light-emitting element of the present invention has been applied. In FIG. 5, a pixel portion 6511, a source signal line driver circuit 6512, a writing gate signal line driver circuit 6513, and an erasing gate signal line driver circuit 6514 are provided over a substrate 6500.

The source signal line driver circuit 6512, the writing gate signal line driver circuit 6513, and the erasing gate signal line driver circuit 6514 are connected through wirings respectively to FPCs (flexible print circuit) 6503, which are external input terminals. As a result, the source signal line driver circuit 6512, the writing gate signal line driver circuit 6513, and the erasing gate signal line driver circuit 6514 receive a video signal, a clock signal, a start signal, a reset signal, and the like respectively from the FPCs 6503. Moreover, the FPCs 6503 have a print wiring board (PWB) 6504 attached thereto.

Those driver circuit portions are not necessarily provided over the same substrate as the pixel portion 6511 as above, and for example, the driver circuit portions may be provided outside the substrate by using an FPC having a wiring pattern over which an IC chip is mounted (this FPC is referred to as a TCP), or the like. In the pixel portion 6511, plural source signal lines extending in a column direction are arranged in a row direction and plural current supplying lines are also arranged in a row direction. Further, in the pixel portion 6511, plural gate signal lines extending in a row direction are arranged in a column direction, and moreover, a plurality of sets of circuits including a light-emitting element are arranged.

Figure 6:
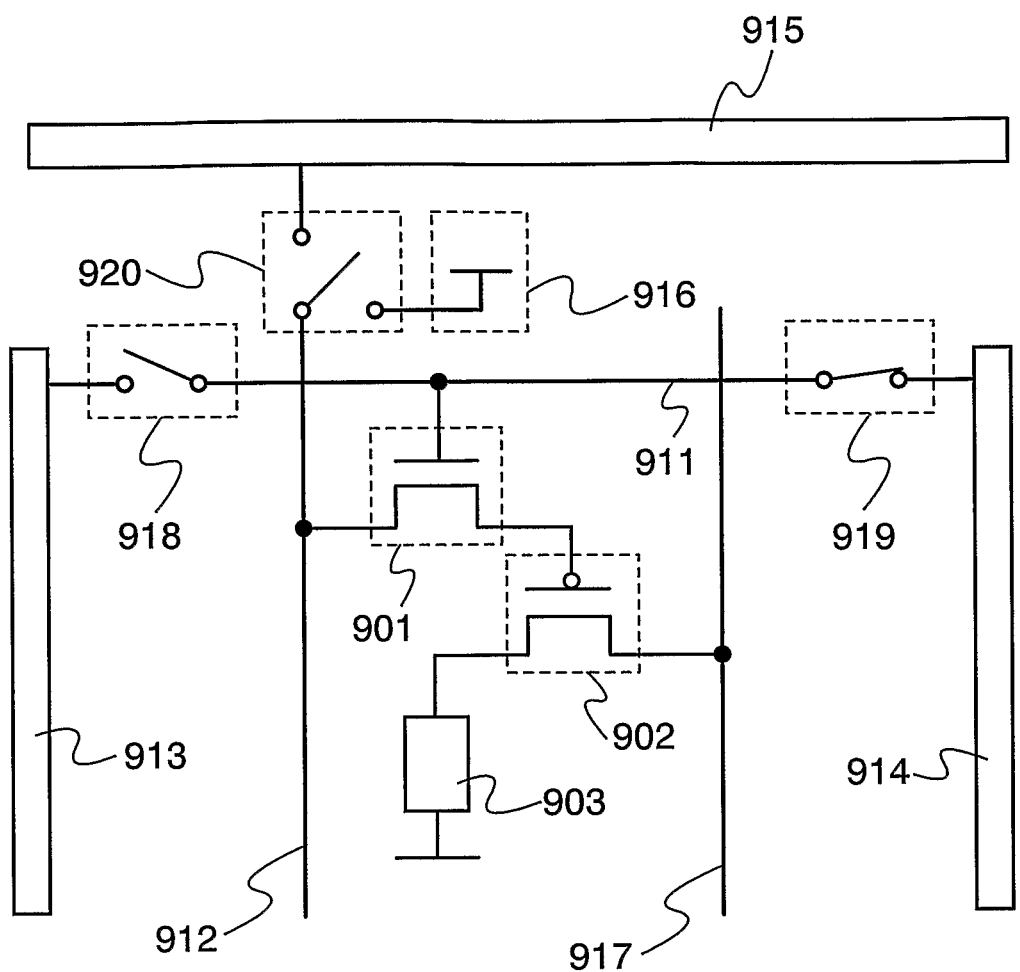
FIG. 6 shows a circuit in a light-emitting device to which the present invention has been applied.

FIG. 6 shows a circuit for operating one pixel. The circuit shown in FIG. 6 includes a first transistor 901, a second transistor 902, and a light-emitting element 903. Each of the first transistor 901 and the second transistor 902 is a three-terminal element including a gate electrode, a drain region, and a source region, and has a channel region between the drain region and the source region. Here, since the source region and the drain region change depending on the structure or an operation condition of the transistor, it is difficult to decide which one is the source region or the drain region. Therefore, in this embodiment mode, the regions serving as a source and a drain are referred to as the first electrode and the second electrode, respectively.

In FIG. 6, the gate signal line 911 and the writing gate signal line driver circuit 913 are provided so that they are electrically connected or disconnected by a switch 918. The gate signal line 911 and the erasing gate signal line driver circuit 914 are provided so that they are electrically connected or disconnected by a switch 919. In the figure, the source signal line 912 is provided so that it is electrically connected to the source signal line driver circuit 915 or a power source 916 by a switch 920. Moreover, a gate of the first transistor 901 is electrically connected to the gate signal line 911.

A first electrode of the first transistor is electrically connected to the source signal line 912 while a second electrode thereof is electrically connected to a gate electrode of the second transistor 902. A first electrode of the second transistor 902 is electrically connected to a current supplying line 917 and a second electrode thereof is electrically connected to one electrode included in the light-emitting element 903. The switch 918 may be included in the writing gate signal line driver circuit 913. Moreover, the switch 919 may be included in the erasing gate signal line driver circuit 914, and the switch 920 may be included in the source signal line driver circuit 915.

Figure 7:
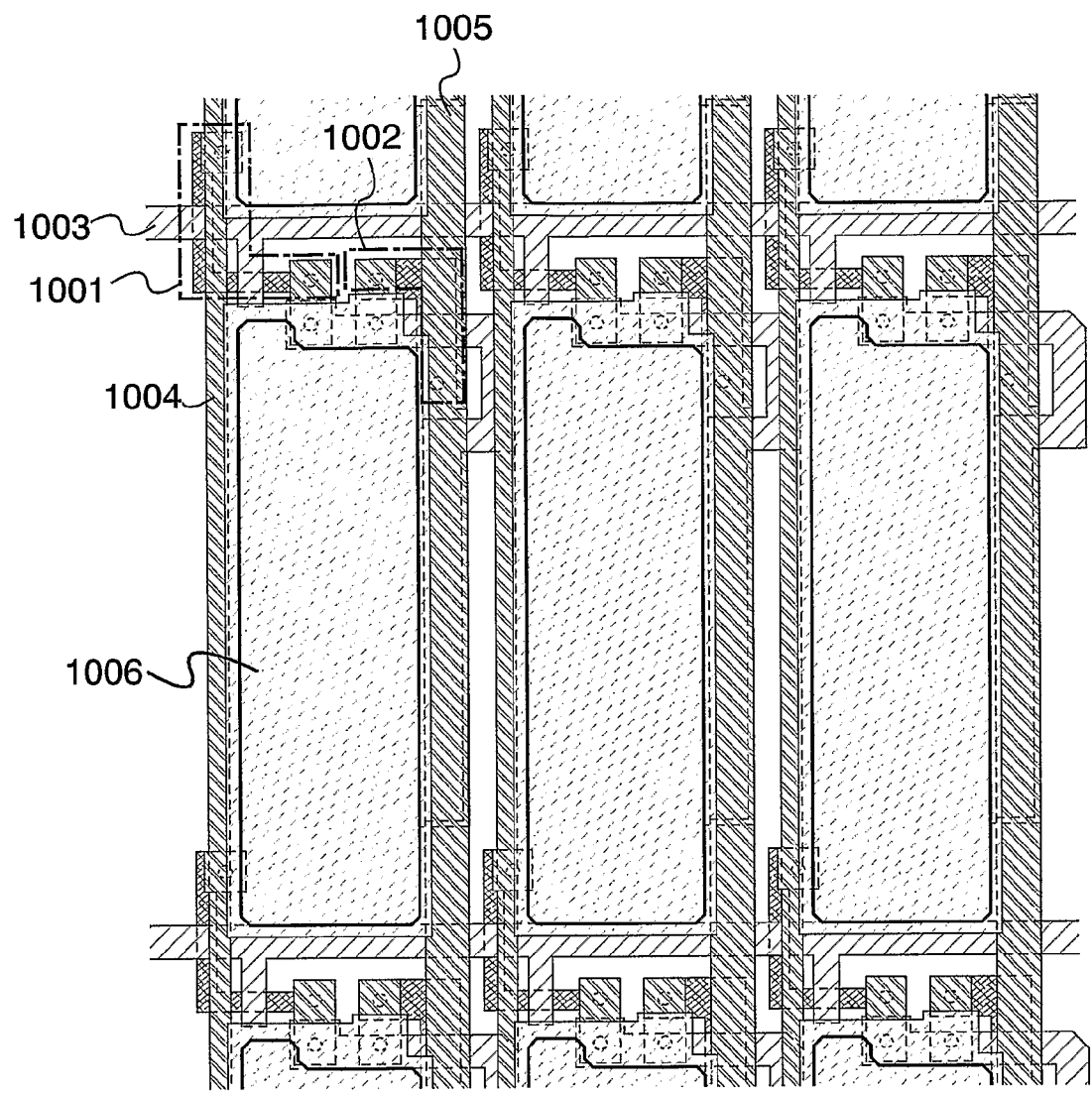
FIG. 7 is a top view showing a light-emitting device to which the present invention is applied.

The arrangement of the transistors, the light-emitting elements, and the like in the above-mentioned pixel portion is not limited in particular. For example, they can be arranged as shown in a top view of FIG. 7. In FIG. 7, a first electrode of a first transistor 1001 is connected to a source signal line 1004, while a second electrode thereof is connected to a gate electrode of a second transistor 1002. Moreover, a first electrode of the second transistor is connected to a current supplying line 1005, while a second electrode thereof is connected to an electrode 1006 of a light-emitting element. A part of a gate signal line 1003 serves as a gate electrode of the first transistor 1001.

Figure 8:
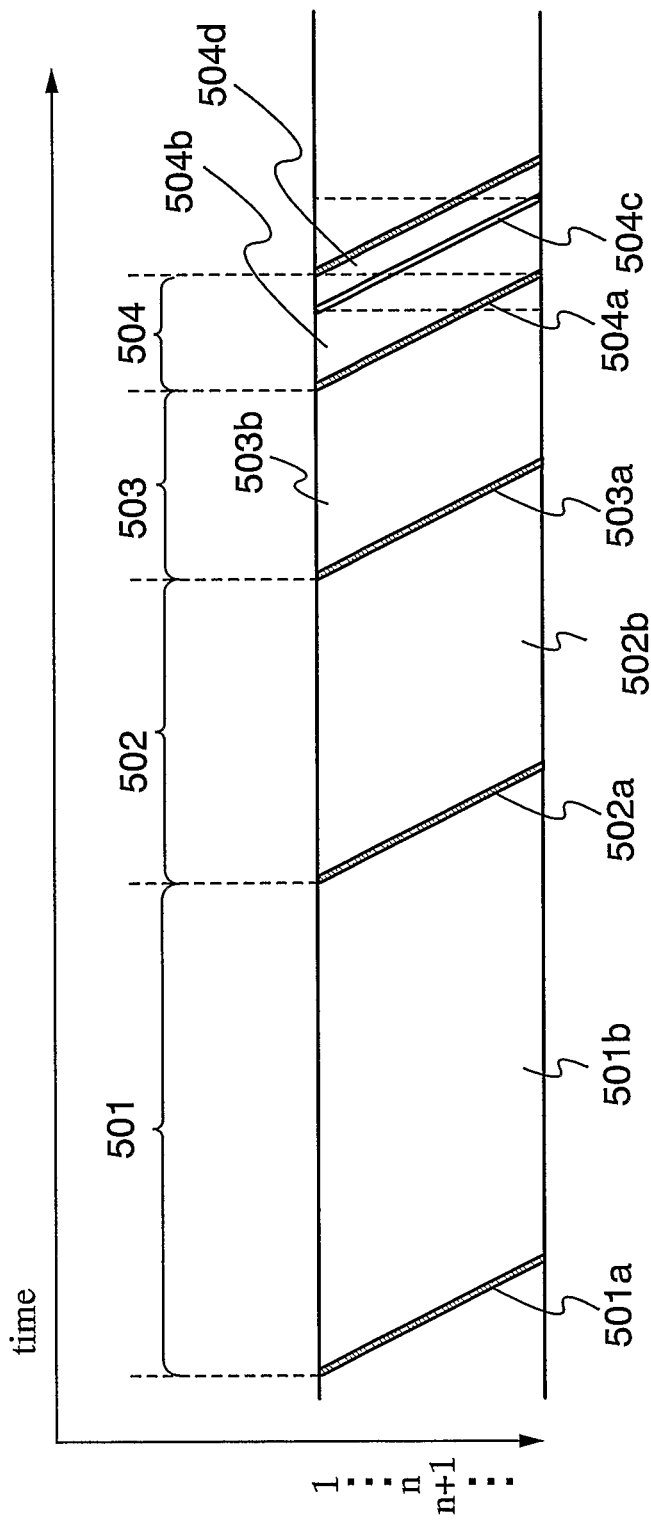
FIG. 8 shows a frame operation of a light-emitting device to which the present invention has been applied.

Following the circuit structure of the above light-emitting device, a driving method of the light-emitting device is described. FIG. 8 describes an operation of a frame over time. In FIG. 8, the horizontal direction shows time passage, while the longitudinal direction shows the number of scanned stages of a gate signal line. When an image is displayed using the light-emitting device of the present invention, an operation of rewriting a screen and an operation of displaying are alternately conducted.

The number of times of the rewriting operations is not particularly limited; however, about 60 times for at least 1 second is preferable so that those who watch the screen do not detect flicker. Here, a period during which an operation of rewriting and an operation of displaying one screen (one frame) are conducted is referred to as a frame period. As shown in FIG. 8, one frame is divided into four sub-frames 501, 502, 503, and 504 which include writing periods 501a, 502a, 503a, and 504a, and holding periods 501b, 502b, 503b, and 504b respectively.

The light-emitting element to which a signal for emitting light has been applied emits light during the holding periods. The length ratio of the holding periods in the respective sub-frames satisfies the first sub-frame 501: the second sub-frame 502: the third sub-frame 503: the fourth sub-frame 504=$2^3$:$2^2$:$2^1$:$2^0$=8:4:2:1. This allows the light-emitting device to exhibit 4-bit gray scale. Further, the number of bits and the number of gray scales are not limited to those shown in this embodiment mode. For instance, one frame may be divided into eight sub-frames so as to achieve 8-bit gray scale.

The operation in one frame will be described. First, in the sub-frame 501, the writing operation is conducted in first to last rows, sequentially. Therefore, the starting time of the writing period is different for each row. The holding period 501b sequentially starts in the row in which the writing period 501a has been terminated. In the holding period 501b, a light-emitting element to which a signal for emitting light has been applied remains in a light-emitting state. The sub-frame 501 is changed to the next sub-frame 502 sequentially in the row in which the holding period 501b has been terminated, and the writing operation is conducted sequentially in the first to last rows similarly to the sub-frame 501.

The above-mentioned operations are carried out repeatedly up to the holding period 504b of the sub-frame 504. After terminating the operation in the sub-frame 504, an operation in the next frame starts. Accordingly, the sum of the light-emitting periods in the respective sub-frames corresponds to the light-emitting period of each light-emitting element in one frame. By changing the light-emitting period for each light-emitting element and combining such light-emitting elements variously within the pixel portion, various display colors with different brightness and different chromaticity can be obtained.

When, prior to the termination of the writing operation up to the last row, the holding period is intended to be forcibly terminated in the row in which the writing period has already been terminated and the holding period has started like in the sub-frame 504, an erasing period 504c is preferably provided after the holding period 504b so as to stop light emission forcibly. The row where light emission is forcibly stopped does not emit light for a certain period (this period is referred to as a non-light-emitting period 504d). Upon terminating the writing period in the last row, a writing period of a next sub-frame (or frame) starts sequentially from a first row. This can prevent the writing period in the sub-frame 504 from superposing with the writing period in the next sub-frame.

Although the sub-frames 501 to 504 are arranged in order from the longer holding period in this embodiment mode, they are not necessarily arranged in this order. For example, the sub-frames may be arranged in order from the shorter holding period. Alternatively, the sub-frames may be arranged in random order. In addition, these sub-frames may further be divided into a plurality of sub-frames. That is, scanning of the gate signal line may be performed plural times during a period of applying the same video signal.

The operations of the circuits shown in FIG. 6 in the wiring period and the erasing period will be described below. The operation in the writing period is described first. In the writing period, the gate signal line 911 in the n-th row (n is a natural number) is electrically connected to the writing gate signal line driver circuit 913 through the switch 918. The gate signal line 911 in the n-th row is disconnected to the erasing gate signal line driver circuit 914. The source signal line 912 is electrically connected to the source signal line driver circuit 915 through the switch 920.

In this case, a signal is inputted in a gate of the first transistor 901 connected to the gate signal line 911 in the n-th row (n is a natural number), thereby turning on the first transistor 901. At this moment, video signals are simultaneously inputted in the Source signal lines in the first to last columns. Further, the video signals inputted from the source signal line 912 in the respective columns are independent from each other. The video signals inputted from the source signal line 912 are inputted in a gate electrode of the second transistor 902 through the first transistor 901 connected to the respective source signal lines. At this time, whether the current supplying line 917 and the light-emitting element 903 are electrically connected or disconnected and whether the light-emitting element 903 emits light or not are decided based on the signal inputted in this second transistor 902.

For instance, when the second transistor 902 is of a P-channel type, the light-emitting element 903 emits light by inputting a low-level signal in the gate electrode of the second transistor 902. On the other hand, when the second transistor 902 is of an N-channel type, the light-emitting element 903 emits light by inputting a high-level signal in the gate electrode of the second transistor 902.

Subsequently, an operation in the erasing period is described. In the erasing period, the gate signal line 911 in the n-th row (n is a natural number) is electrically connected to the erasing gate signal line driver circuit 914 through the switch 919 and disconnected to the writing gate signal line driver circuit 913. At this time, the source signal line 912 is electrically connected to the power source 916 through the switch 920.

In this case, a signal is inputted in the gate of the first transistor 901 which is connected to the gate signal line 911 in the n-th row, whereby the first transistor 901 is turned on. At this time, erasing signals are simultaneously inputted in the source signal lines of the first to last columns. The erasing signals inputted from the source signal line 912 is inputted in the gate electrode of the second transistor 902 through the first transistor 901 connected to each source signal line. The current supplying line 917 and the light-emitting element 903 get electrically disconnected by the signal inputted in the second transistor 902.

This makes the light-emitting element 903 emit no light forcibly. For example, when the second transistor 902 is of a P-channel type, the light-emitting element 903 emits no light by inputting a high-level signal in the gate electrode of the second transistor 902. On the contrary, when the second transistor 902 is of an N-channel type, the light-emitting element 903 emits no light by inputting a low-level signal in the gate electrode of the second transistor 902.

Further, in the erasing period, a signal for erasing is inputted in the n-th row (n is a natural number) by the above-mentioned operation. However, as mentioned above, the n-th row sometimes remains in the erasing period while another row (an m-th row (m is a natural number)) remains in the writing period. In this case, since a signal for erasing is necessary to be inputted in the n-th row and a signal for writing is necessary to be inputted in the m-th row by utilizing the source signal line in the same column, the after-mentioned operation is preferably carried out.

After the light-emitting element 903 in the n-th row becomes a non-light-emitting state by the above-described operation in the erasing period, the gate signal line 911 and the erasing gate signal line driver circuit 914 are immediately disconnected to each other and the source signal line is connected to the source signal line driver circuit 915 by turning on/off the switch 920. At the same time as the connection, the gate signal line and the writing gate signal line driver circuit 913 are connected to each other. As a result, a signal is selectively inputted in the signal line in the m-th row from the writing gate signal line driver circuit 913 and the first transistor is turned on, while signals for writing are inputted in the source signal lines in the first to last columns from the source signal line driver circuit 915. By inputting these signals, the light-emitting element in the m-th row emits light or no light.

After terminating the writing period in the m-th row as mentioned above, the erasing period immediately starts in the (n+1)-th row. Therefore, the gate signal line and the writing gate signal line driver circuit 913 are disconnected to each other while the source signal line is connected to the power source 916 by turning on/off the switch 920. Moreover, the gate signal line and the writing gate signal line driver circuit 913 are disconnected to each other while the gate signal line is connected to the erasing gate signal line driver circuit 914.

A signal is selectively inputted in the gate signal line in the (n+1)-th row from the erasing gate signal line driver circuit 914 to input the signal for turning on the first transistor while an erasing signal is inputted from the power source 916. Upon terminating the erasing period in the (n+1)-th row in this manner, the writing period immediately starts in the m-th row. The erasing period and the writing period may be repeated until the erasing period of the last row in the same manner. Although the writing period in the m-th row is provided between the erasing period in the n-th row and the erasing period of the (n+1)-th row in this embodiment mode, the present invention is not limited thereto. The writing period of the m-th row may be provided between the erasing period in the (n−1)-th row and the erasing period in the n-th row.

Furthermore, in this embodiment mode, when the non-light-emitting period 504d is provided like in the sub-frame

504, the operation of disconnecting the erasing gate signal line driver circuit 914 from one gate signal line while connecting the writing gate signal line driver circuit 913 to another gate signal line is carried out repeatedly. This operation may be performed in a frame in which a non-light-emitting period is not particularly provided.

Embodiment Mode 5

Figure 9A:
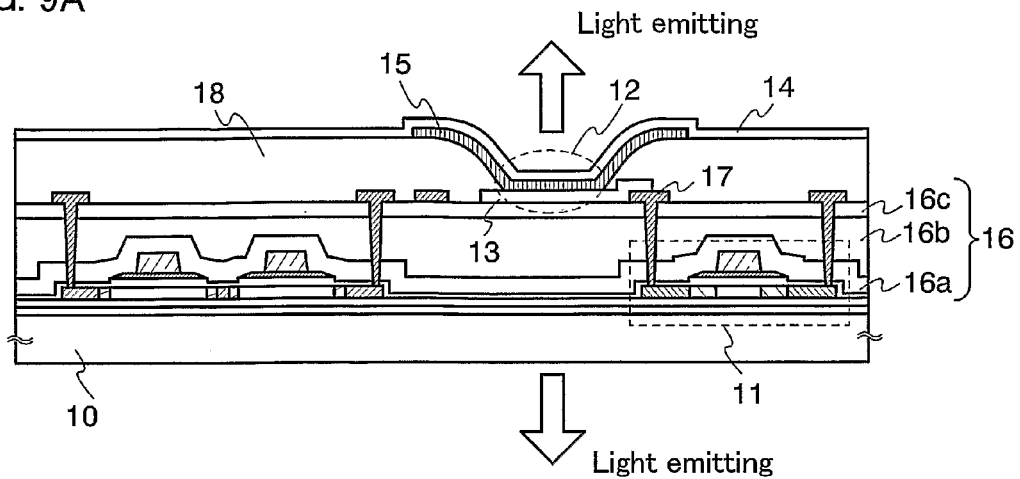
FIGS. 9A to 9C are cross-sectional views of a light-emitting device to which the present invention has been applied.
Figure 9B:
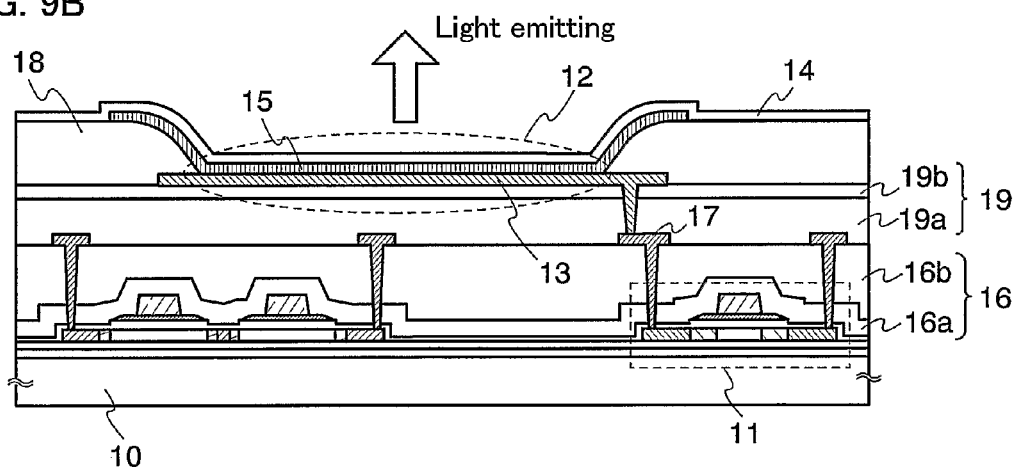
Figure 9C:
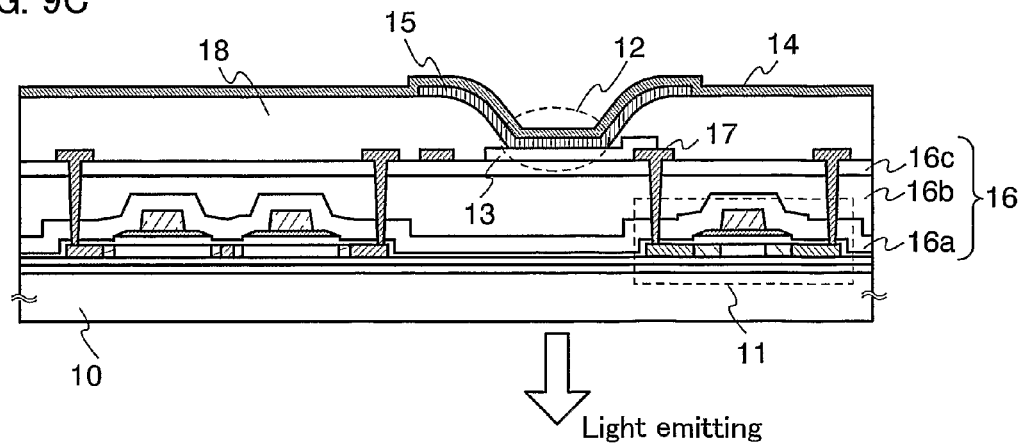

A mode of a cross-sectional structure of a light-emitting device including a light-emitting element of the present invention will be described with reference to FIGS. 9A to 9C. In FIGS. 9A to 9C, a transistor 11 provided for driving a light-emitting element 12 of the present invention is surrounded by a dashed line. The light-emitting element 12 is a light-emitting element of the present invention having a layer 15 in which a layer containing a light-emitting substance is stacked between a first electrode 13 and a second electrode 14.

A drain of the transistor 11 and the first electrode 13 are electrically connected by a wiring 17 penetrating through a first interlayer insulating film 16 (16a, 16b, and 16c). The light-emitting element 12 is separated from another light-emitting element provided adjacently, by a partition wall layer 18. The light-emitting device having such a structure is provided over a substrate 10 in this embodiment mode.

The transistor 11 shown in FIGS. 9A to 9C is of a top gate type in which a gate electrode is provided over a substrate with a semiconductor layer interposed therebetween. The structure of the transistor 11 is not particularly limited, and for example, a bottom gate type may be employed. In the case of the bottom gate type, either a channel-protective type in which a protective film is formed over a semiconductor layer that forms a channel or a channel-etch type in which a part of the semiconductor layer that forms a channel is a concave shape may be employed.

The semiconductor layer in the transistor 11 may be either crystalline or non-crystalline, or may be semiamorphous or the like. The semiamorphous semiconductor means a semiconductor having an intermediate structure between an amorphous structure and a crystalline structure (including a single crystal structure and a polycrystalline structure), and a third condition that is stable in terms of free energy. The semiamorphous semiconductor further includes a crystalline region having a short range order along with lattice distortion.

A crystal grain with a size of 0.5 to 20 nm is included in at least a part of the semiamorphous semiconductor film. Raman spectrum of the semiamorphous semiconductor film is shifted lower wavenumbers than 520 cm$^{-1}$. The diffraction peaks at (111) and (220), which are considered to be derived from Si crystal lattice, are observed in the semiamorphous semiconductor by X-ray diffraction. The semiamorphous semiconductor contains at least 1 atom % or more of hydrogen or halogen for terminating dangling bonds. The semiamorphous semiconductor is also referred to as a microcrystalline semiconductor.

The semiamorphous semiconductor film is formed by glow discharge decomposition (plasma CVD) of gas containing silicide. As for the gas containing silicide, $SiH_4$, $Si_2H_6$, $SiH_2Cl_2$, $SiHCl_3$, $SiCl_4$, $SiF_4$ or the like can be used. The gas containing silicide may also be diluted with $H_2$, or a mixture of $H_2$ and one or more of rare gas elements selected from He, Ar, Kr, and Ne. The dilution ratio is preferably set in the range of 1:2 to 1:1,000. The pressure at the discharge decomposition is set in the range of approximately 0.1 to 133 Pa. The power frequency is set in the range of 1 to 120 MHz, preferably 13 to 60 MHz.

The substrate heating temperature may be set to 300° C. or less, and is preferably set in the range of 100 to 250° C. As for impurity elements contained in the film, each concentration of impurities in atmospheric constituents such as oxygen, nitrogen, and carbon in the film is preferably set to $1 \times 10^{20}$/cm$^3$ or less. In particular, the oxygen concentration is set to $5 \times 10^{19}$/cm$^3$ or less, preferably $1 \times 10^{19}$/cm$^3$ or less. The mobility of a TFT (thin film transistor) using the semiamorphous semiconductor ranges from about 1 to 10 m$^2$/Vsec.

As a specific example of a crystalline semiconductor layer, a semiconductor layer including single-crystal silicon, polycrystalline silicon, silicon germanium, or the like can be given. The crystalline semiconductor layer may be formed by laser crystallization. For example, the crystalline semiconductor layer may be formed by crystallization with the use of a solid phase growth method using nickel or the like.

When a semiconductor layer is formed using an amorphous substance, e.g., amorphous silicon, it is preferable that a light-emitting device have circuits including only N-channel transistors as the transistor 11 and other transistors (transistors included in a circuit for driving a light-emitting element). In another case, a light-emitting device with circuits including either N-channel transistors or P-channel transistors may be employed. Moreover, a light-emitting device with circuits including both N-channel transistors and P-channel transistors may be used.

The first interlayer insulating film 16 in the light-emitting device may include plural layers (16a, 16b, and 16c) as shown in FIGS. 9A and 9C or may be a single layer. Specifically, in the case that the first interlayer insulating film 16 includes plural layers, the interlayer insulating film 16a is formed using an inorganic material such as silicon oxide or silicon nitride. The interlayer insulating film 16b is formed using acrylic, siloxane (which is a compound that has a skeletal structure formed by a silicon (Si)-oxygen (O) bond and includes at least hydrogen as its substituent), or a substance with a self-planarizing property that can be formed by applying a liquid, such as silicon oxide. Moreover, the interlayer insulating film 16c is formed with a silicon nitride film containing argon (Ar).

The substances constituting the respective layers of the first interlayer insulating film 16 are not particularly limited and other substances than the above-mentioned ones may be used. Alternatively, a layer formed using a substance other than the above mentioned substances may be provided in combination with the interlayer insulating film 16. Moreover, the interlayer insulating film 16 may be formed by using both an inorganic material and an organic material or by using either an inorganic material or an organic material.

An edge portion of the partition wall layer 18 in the light-emitting device preferably has a shape in which the radius of curvature is continuously varied. This partition wall layer 18 is formed by using acrylic, siloxane, resist, silicon oxide, or the like. Further, the partition wall layer 18 may be formed using one or both of an inorganic material and an organic material.

FIGS. 9A and 9C show the structures in which only the first interlayer insulating film 16 is sandwiched between the transistors 11 and the light-emitting elements 12. However, as shown in FIG. 9B, the first interlayer insulating film 16 (16a and 16b) and a second interlayer insulting film 19 (19a and 19b) may be provided between the transistor 11 and the light-emitting element 12. In the light-emitting device shown in FIG. 9B, the first electrode 13 penetrates through the second interlayer insulating film 19 to be connected to the wiring 17.

The second interlayer insulating film 19 in the light-emitting device may include plural layers (19a and 19b) like the first interlayer insulating film 16 or may be a single layer. In the case that the second interlayer insulating film 19 includes plural layers, the interlayer insulating film 19a is formed using acrylic, siloxane (a compound having a skeletal structure formed with a silicon (Si)-oxygen (O) bond and an organic group including at least hydrogen in its substituent), or a substance with a self-planarizing property that can be formed by applying a liquid, such as silicon oxide. The interlayer insulating film 19b is formed using a silicon nitride film containing argon (Ar). The substances constituting the respective layers of the second interlayer insulating film 19 are not particularly limited. Therefore, substances other than the above-mentioned substances may be employed. Alternatively, a layer formed with a substance other than the above-mentioned substances may be provided in combination with the second interlayer insulating film 19. Accordingly, the second interlayer insulating film 19 may be formed by using both an inorganic material and an organic material or by using either an inorganic material or an organic material.

When the first electrode and the second electrode are both formed using a substance with a light-transmitting property in the light-emitting element 12, light generated in the light-emitting element 12 can be extracted through both of the first electrode 13 and the second electrode 14 as shown with white arrows in FIG. 9A. When only the second electrode 14 is formed using a substance with a light-transmitting property, light generated in the light-emitting element 12 can be extracted only through the second electrode 14 as shown with a white arrow of FIG. 9B. In this case, the first electrode 13 is preferably formed using a material with high reflectance, or a film (reflection film) formed using a material with high reflectance is preferably provided under the first electrode 13.

When only the first electrode 13 is formed using a substance with a light-transmitting property, light generated in the light-emitting element 12 can be extracted only through the first electrode 13 as shown with a white arrow of FIG. 9C. In this case, the second electrode 14 is preferably formed using a material with high reflectance or a reflection film is preferably provided over the second electrode 14.

Moreover, the light-emitting element 12 may have a structure in which the layer 15 is stacked so that the light-emitting element 12 operates when voltage is applied in such a way that the second electrode 14 has higher electric potential than the first electrode 13, or the layer 15 is stacked 14 so that the light-emitting element 12 operates element when applying voltage in such a way that the first electrode 13 has higher electric potential than the second electrode 14. In the former case, the transistor 11 is an N-channel transistor. In the latter case, the transistor 11 is a P-channel transistor.

Thus, this embodiment mode has described an active light-emitting device in which the driving of the light-emitting element is controlled by the transistors. However, a passive light-emitting device in which the light-emitting element is driven without particularly providing an element for the driving such as the transistors may be employed. The passive light-emitting device can be also driven with low power consumption by including the light-emitting element of the present invention which operates at low drive voltage.

Embodiment Mode 6

Since a light-emitting device including a light-emitting element of the present invention can display favorable images, electronic appliances which can provide superior pictures can be obtained by applying the light-emitting device including the light-emitting element of the present invention in display portions of the electronic appliances. Moreover, since the light-emitting device including the light-emitting element of the present invention can be driven with low power consumption, electronic appliances with low power consumption can be obtained by applying the light-emitting device including the light-emitting element of the present invention to the display portions of the electronic appliances. For example, telephones with long battery standby time and the like can be obtained.

Figure 10A:
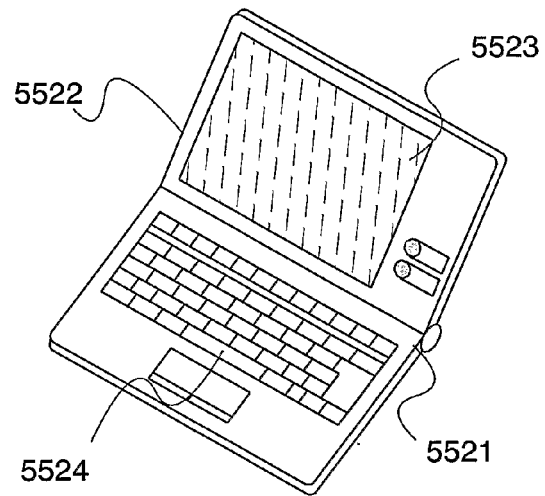
FIGS. 10A to 10C show electronic appliances to which the present invention has been applied.
Figure 10B:
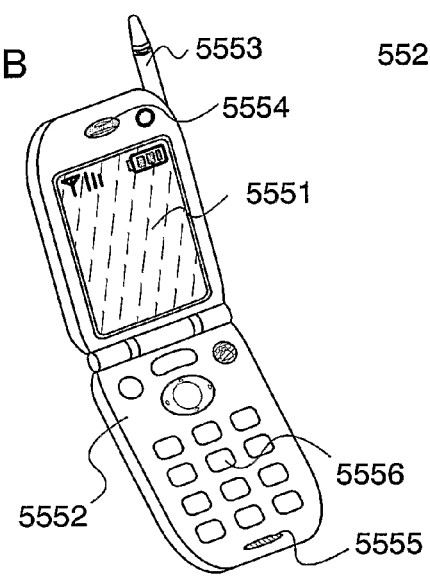
Figure 10C:
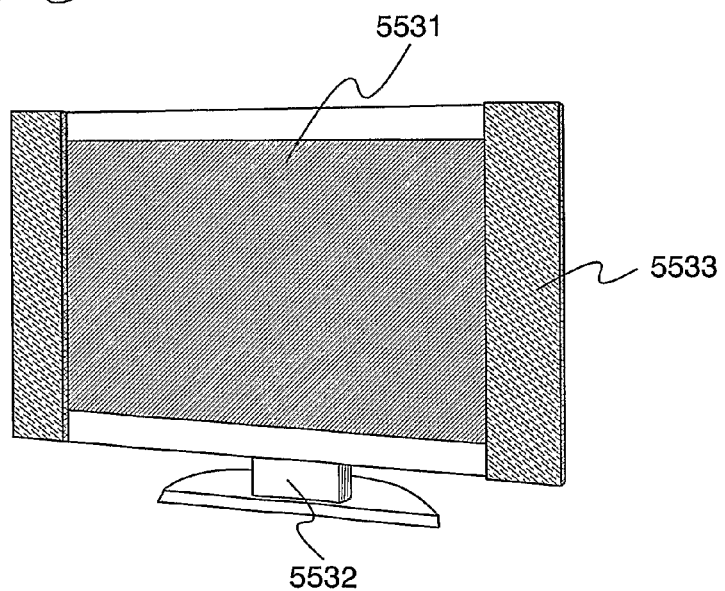

Specific examples of the electronic appliances to which the light-emitting devices of the present invention are mounted are shown as Embodiment Mode 6 in FIGS. 10A to 10C. FIG. 10A shows a laptop computer manufactured in accordance with the present invention, including a main body 5521, a housing 5522, a display portion 5523, a keyboard 5524, and the like. By incorporating a light-emitting device having a light-emitting element of the present invention into the display portion, the computer can be completed.

FIG. 10B shows a telephone manufactured in accordance with the present invention, including a display portion 5551, an audio output portion 5554, an audio input portion 5555, operation switches 5556, an antenna 5553, and the like in a main body 5552. By incorporating a light-emitting device having a light-emitting element of the present invention into the display portion, the telephone can be completed. FIG. 10C shows a television receiving machine manufactured in accordance with the present invention, including a display portion 5531, a housing 5532, a speaker 5533, and the like. By incorporating a light-emitting device having a light-emitting element of the present invention into the display portion, the television receiving machine can be completed.

As set forth above, a light-emitting device having a light-emitting element of the present invention is suitable to be used as a display portion of various kinds of electronic appliances. Although the computer, the telephone, and the television receiving machine have been described in the present embodiment mode, the light-emitting devices having light-emitting elements of the present invention may be mounted on a navigation system, a lighting apparatus, and the like.

Embodiment 1

The present invention will be hereinafter described in more detail based on Embodiments; however, the present invention is not limited by Embodiments and is specified by the scope of claims. First, a synthetic example of an organic metal complex is described as Embodiment 1, and then a specific example of a method for manufacturing a light-emitting element of the present invention will be described as Embodiment 2.

Embodiment 1 will describe a synthetic example of a cluster in which α-NPD and molybdenum oxide are generated at a surface of an electrode as an example of the layer including a cluster described in Embodiment Mode 2 and will also describe an example of measuring its current-voltage characteristic. An electrode was formed in such a way that 110-nm-thick ITO was formed over a glass substrate with a thickness of 0.7 mm and a size of 5 inch by sputtering and then the ITO was patterned by photolithography. Next, the substrate having the ITO electrode was washed with water and dried sufficiently, and then set in an evaporation apparatus. After that, a vacuum chamber in the apparatus was evacuated until the pressure in the vacuum chamber becomes $1 \times 10^{-3}$ Pa or less.

Next, the substrate was heated at 150° C. for 30 minutes under the same pressure, and then cooled in the same state for 30 minutes or more. After the cooling, A-NPD as an organic material and molybdenum oxide as an inorganic material were co-evaporated. Here, the evaporation rate of α-NPD was controlled to be 0.4 nm/s and the concentration of molybdenum oxide was controlled to be 27 wt %. The film thickness was set to 100 nm. After that, an element 1 was manufactured by evaporating aluminum of 200 nm thick.

Figure 16:
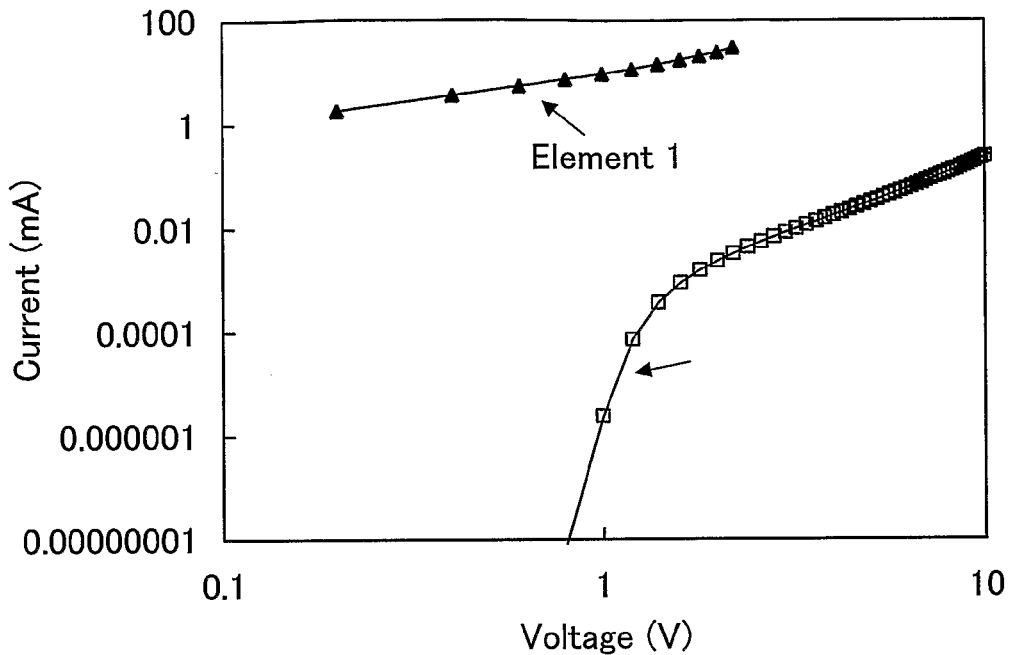
FIG. 16 shows a current-voltage characteristic of a layer including a cluster of the present invention.

FIG. 16 shows a current-voltage characteristic of the element 1 in the case that ITO is an anode and aluminum is a cathode. For comparison, a result of manufacturing an element by evaporating only α-NPD instead of co-evaporating α-NPD and molybdenum oxide is also shown. The current-voltage characteristic of the element 1 is proportional to the first order of voltage as shown in FIG. 16, and it is understood that ohm current flows. Therefore, it can be considered that contact with the ITO electrode is ohmic contact.

On the other hand, in the film formed by evaporating only α-NPD, the current-voltage characteristic is not proportional to the first order of voltage. It can be considered that this current is Schottky injection current. In this way, since a number of unpaired electrons exist in the film having a cluster in which a parallel-coordinated dimolecular body is adjacent to metal oxide and which is formed by co-evaporating α-NPD and molybdenum oxide, the film has such a characteristic that the carrier density is high. Therefore, a device which is likely to have ohmic contact is possible by being evaporated on the electrode.

Embodiment 2

Embodiment 2 will describe a method for manufacturing a light-emitting element using a layer formed by co-evaporating α-NPD and molybdenum oxide as an example of a light-emitting element of the present invention. For comparison, a method for manufacturing a light-emitting element using a layer formed by evaporating only α-NPD is also shown. The manufacturing method of this embodiment is as follows. First, an electrode was formed in such a way that 110-nm-thick ITO was formed over a glass substrate with a thickness of 0.7 mm and a size of 5 inch by sputtering and then the ITO was patterned by photolithography.

Next, the substrate having the ITO electrode was washed with water and dried sufficiently, and then set in an evaporation apparatus. After that, a vacuum chamber in the apparatus was evacuated until the pressure in the vacuum chamber becomes $1 \times 10^{-3}$ Pa or less. Next, the substrate was heated at 150° C. for 30 minutes under the same pressure, and cooled in the same state for 30 minutes or more. After the cooling, α-NPD as an organic material and molybdenum oxide as an inorganic material were co-evaporated. Here, the evaporation rate of α-NPD was controlled to be 0.4 nm/s and the concentration of molybdenum oxide was controlled to be 27 wt %. The film thickness was set to 120 nm.

Next, α-NPD was evaporated in 10 nm thick as a hole-transporting layer, Alq$_3$ doped with 0.3 wt % of DMQd was evaporated in 37.5 μm thick as a light-emitting layer, only Alq$_3$ was evaporated in 37.5 nm thick as an electron-transporting layer, CaF$_2$ was evaporated in 1 nm thick as an electron-injecting layer, and aluminum was evaporated in 200 nm thick as a cathode, thereby forming a light-emitting element 2.

The light-emitting element to be compared with was manufactured as follows. The co-evaporation of α-NPD and molybdenum oxide was not conducted, and α-NPD was evaporated in 130 nm thick as a hole-transporting layer over an ITO anode, Alq$_3$ doped with 0.3 wt % of DMQd was evaporated in 37.5 nm thick as a light-emitting layer, only Alq$_3$ was evaporated in 37.5 nm thick as an electron-transporting layer, CaF$_2$ was evaporated in 1 nm thick as an electron-injecting layer, and aluminum was evaporated in 200 nm thick as a cathode, thereby forming a light-emitting element 3.

Figure 17:
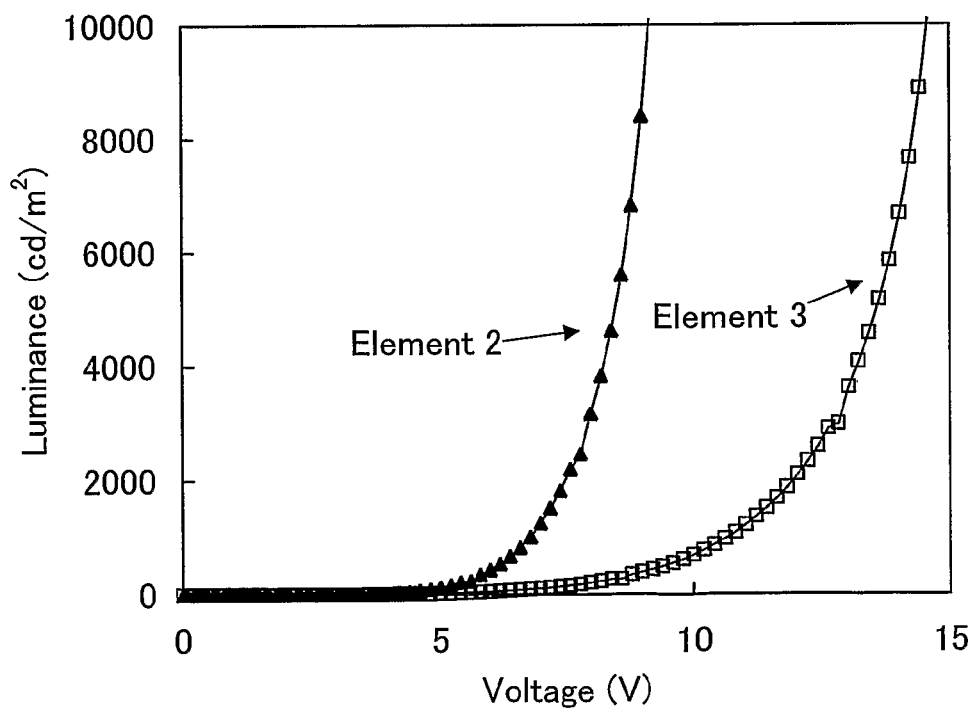
FIG. 17 shows a luminance-voltage characteristic of a light-emitting element of the present invention.

Luminance-voltage characteristics of the light-emitting element 2 manufactured as above in Embodiment 2 and the light-emitting element 3 in the comparative example were measured and are shown in FIG. 17. It is understood that the voltage of the light-emitting element 2 in Embodiment 2 has decreased drastically with respect to the light-emitting element 3 in the comparative example. Therefore, the decrease in resistance of the light-emitting element can be achieved by forming a film including a radical cation of an α-NPD dimolecular body.

This application is based on Japanese Patent Application serial No. 2005-031523 filed in Japan Patent Office on Feb. 8, 2005, the entire contents of which are hereby incorporated by reference.

The invention claimed is:
1. A light-emitting element comprising:
an anode;
a first layer including a cluster in direct contact with the anode;
a second layer comprising a substance having a light-emitting property over the first layer;
a third layer comprising an electron-donating substance and a compound having an electron-transporting property over the second layer;
a fourth layer including the cluster over and in contact with the third layer; and
a cathode over the fourth layer,
wherein the cluster comprises a dimolecular body and a molybdenum oxide,
wherein the dimolecular body is formed from a first arylamine compound and a second arylamine compound arranged in parallel,
wherein each of the first and the second arylamine compounds comprises two arylamines,
wherein each of the two arylamines has one phenyl group and two aryl groups bonded with a nitrogen atom;
wherein the two arylamines form a biphenyl bond through the respective phenyl groups, and
wherein the dimolecular body is coordinated to the molybdenum oxide.
2. The light-emitting element according to claim 1,
wherein a plane formed by six carbon atoms of each benzene ring which forms each of the two phenyl groups forming the biphenyl bond of the first arylamine compound in the cluster face to a plane formed by six carbon atoms of each benzene ring which forms each of the two phenyl groups forming the biphenyl bond of the second arylamine compound which is in parallel with the first arylamine compound.
3. The light-emitting element according to claim 1,
wherein the cluster is formed in such a way that the molybdenum oxide and the arylamine compound are vaporized simultaneously under vacuum and the vaporized molybdenum oxide and arylamine compound are solidified simultaneously.
4. The light-emitting element according to claim 1,
wherein the cluster has a function to generate a hole.
5. A light-emitting device equipped with the light-emitting element described in claim 1.
6. An electronic appliance in which the light-emitting element described in claim 1 is mounted in a display portion.

7. The light-emitting element according to claim 1, wherein each of the first and the second arylamine compounds is represented by a formula 1

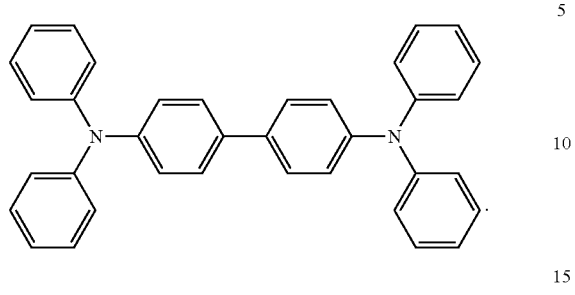

8. The light-emitting element according to claim 1, wherein the molybdenum oxide in the cluster includes any of $Mo_3O_{10}$, $Mo_4O_{13}$, and $Mo_6O_{19}$.

9. The light-emitting element according to claim 1, wherein the electron-donating substance is any one of lithium oxide, calcium oxide, barium oxide, or cesium carbonate.

* * * * *

UNITED STATES PATENT AND TRADEMARK OFFICE
CERTIFICATE OF CORRECTION

| | | |
|---|---|---|
| PATENT NO. | : 8,426,034 B2 | Page 1 of 1 |
| APPLICATION NO. | : 11/883026 | |
| DATED | : April 23, 2013 | |
| INVENTOR(S) | : Ikeda et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 743 days.

Signed and Sealed this
Sixteenth Day of December, 2014

Michelle K. Lee
*Deputy Director of the United States Patent and Trademark Office*